US011804275B1

(12) United States Patent
Braun et al.

(10) Patent No.: US 11,804,275 B1
(45) Date of Patent: Oct. 31, 2023

(54) PHASE-MODE BIT-ADDRESSABLE SENSING REGISTER

(71) Applicants: Alexander Louis Braun, Baltimore, MD (US); Max E. Nielsen, Riverton, UT (US); Daniel George Dosch, Glen Burnie, MD (US); Kurt Pleim, Halethorpe, MD (US); Haitao O. Dai, Ellicott City, MD (US); Charles Ryan Wallace, Orlando, FL (US)

(72) Inventors: Alexander Louis Braun, Baltimore, MD (US); Max E. Nielsen, Riverton, UT (US); Daniel George Dosch, Glen Burnie, MD (US); Kurt Pleim, Halethorpe, MD (US); Haitao O. Dai, Ellicott City, MD (US); Charles Ryan Wallace, Orlando, FL (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 3 days.

(21) Appl. No.: 17/736,564

(22) Filed: May 4, 2022

(51) Int. Cl.
| | |
|---|---|
| *G11C 19/32* | (2006.01) |
| *H03L 7/081* | (2006.01) |
| *H03K 3/037* | (2006.01) |
| *H03K 19/195* | (2006.01) |
| *H03L 7/08* | (2006.01) |
| *H03K 3/38* | (2006.01) |

(52) U.S. Cl.
CPC ............ *G11C 19/32* (2013.01); *H03K 3/037* (2013.01); *H03K 3/38* (2013.01); *H03K 19/195* (2013.01); *H03L 7/0805* (2013.01); *H03L 7/0816* (2013.01)

(58) Field of Classification Search
CPC ......... G11C 19/32; H03K 3/38; H03K 19/195
See application file for complete search history.

(56) References Cited

U.S. PATENT DOCUMENTS

| 6,608,518 B2 * | 8/2003 | Furuta .................... G06N 10/00 327/528 |
| 9,543,959 B1 * | 1/2017 | Carmean ................ H03K 19/20 |
| 10,608,044 B1 * | 3/2020 | Herr ...................... H03K 19/195 |

(Continued)

OTHER PUBLICATIONS

Strong, et al.; "A resonant metamaterial clock distribution network for superconducting logic"; Nat. Electron., Mar. 24, 2022, 171-77, vol. 5, Nature, U.S.

*Primary Examiner* — Patrick O Neill
(74) *Attorney, Agent, or Firm* — Tarolli, Sundheim, Covell & Tummino L.L.P.

(57) ABSTRACT

Shift register elements of a phase-mode bit-addressable sensing register sample varied AC or DC bias values provided to operational RQL circuitry on the RQL IC via clock resonators or DC bias lines. The shift register can be constructed of phase-mode D flip-flops and JTLs as data and clock lines. A method of using the sensing register includes shifting in a data bit pattern while a bias parameter (e.g., AC amplitude, DC value, or phase) is set to a nominal value; stopping the logical clock that controls the shifting of values through the sensing register, varying the bias parameter value, inputting one assertion SFQ pulse or reciprocal pulse pair into the logical clock, restoring the bias parameter to the nominal value, restarting the logical clock to shift out an output data bit pattern, and observing the output data bit pattern to determine the effect of the bias parameter value change.

20 Claims, 27 Drawing Sheets

(56) References Cited

U.S. PATENT DOCUMENTS

| | | | |
|---|---|---|---|
| 10,615,783 B2* | 4/2020 | Powell, III | H03K 19/195 |
| 10,756,712 B2* | 8/2020 | Braun | H03K 3/38 |
| 11,641,194 B1* | 5/2023 | Whiteley | H10N 60/12 |
| | | | 327/199 |
| 2005/0023518 A1* | 2/2005 | Herr | G06F 5/08 |
| | | | 257/13 |
| 2018/0226975 A1* | 8/2018 | Braun | G06F 5/00 |
| 2019/0019938 A1* | 1/2019 | Braun | H10N 69/00 |
| 2020/0044656 A1* | 2/2020 | Herr | H03K 19/195 |

* cited by examiner

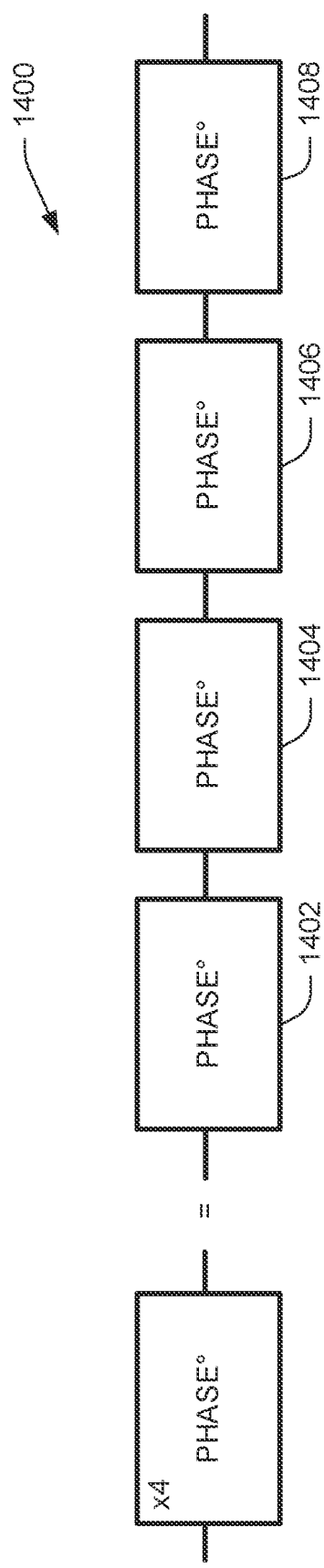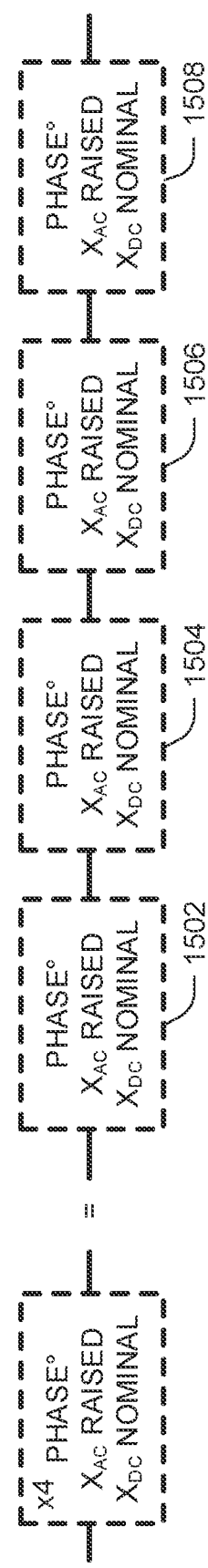
FIG. 14
FIG. 15

PHASE-MODE BIT-ADDRESSABLE SENSING REGISTER

TECHNICAL FIELD

This disclosure relates generally to superconducting circuits, and specifically to a phase-mode bit-addressable sensing register.

BACKGROUND

In the field of digital logic, extensive use is made of well-known and highly developed complementary metal-oxide-semiconductor (CMOS) technology. As CMOS has begun to approach maturity as a technology, there is an interest in alternatives that may lead to higher performance in terms of speed, power dissipation, computational density, and interconnect bandwidth. As an alternative to CMOS technology, single flux quantum (SFQ) circuitry utilizes superconducting Josephson junctions (JJs), with typical signal power of about 4 nanowatts (nW), at a typical data rate of 20 gigabits per second (Gb/s) or greater, and operating temperatures of around 4 kelvins.

The family of SFQ circuitry known as reciprocal quantum logic (RQL) uses one or more resonator networks and/or bias lines to distribute one or more biasing signals. Bias signals serve to bias JJs in the logic gates of the RQL circuitry and the Josephson transmission lines (JTLs) that can be found within the gates of the RQL circuitry or as connecting lines between the gates to propagate SFQ signals within the RQL circuitry. AC bias signals can serve as one or more global clock signals that can help to eliminate clock jitter as may be exhibited by predecessor superconducting circuitry technologies such as rapid single flux quantum (RSFQ) logic. For example, RQL can make use of a multiphase clock having an in-phase (I) clock signal and a quadrature (Q) clock signal that is about 90° out of phase with the I clock signal.

SUMMARY

An example RQL integrated circuit (IC) includes a phase-mode shift register having a first plurality of JTLs arranged in series as a data path, a second plurality of JTLs arranged in series as a logical clock path trunk, and a plurality of phase-mode D flip-flops. Each phase-mode D flip-flop has (1) a data input coupled to the data path and configured to receive input from the data path, (2) a data output coupled to the data path and configured to provide output to the data path, and (3) a logical clock input coupled to a respective logical clock path branch that is coupled to the logical clock path trunk. The first plurality of JTLs in the data path and the phase-mode D flip-flops are transformer-coupled to one or more AC clock resonators of the RQL IC to receive AC clock bias signals of a first two AC clock phases that are about 180° apart from each other in phase. The second plurality of JTLs in the logical clock path trunk are transformer-coupled to one or more AC clock resonators of the RQL IC to receive AC clock bias signals of a second two AC clock phases that are about 180° apart from each other in phase. The first two AC clock phases are different from the second two AC clock phases.

An example method includes setting to a nominal value at least one bias signal parameter of a bias signal provided to an RQL IC and starting a logical clock signal provided to a logical clock path of a phase-mode RQL shift register to shift in an input data bit pattern on a data path of the phase-mode RQL shift register. The logical clock is then stopped and a value of the at least one bias signal parameter, as provided to the data path of the phase-mode RQL shift register, is varied to a different value than the nominal value. One assertion SFQ pulse pair, or a single SFQ pulse, is input into the logical clock path. With the value of the at least one bias signal parameter restored to the nominal value, the logical clock signal provided to the logical clock path of the phase-mode RQL shift register is restarted to shift out an output data bit pattern on the data path of the phase-mode RQL shift register. The output data bit pattern of the phase-mode RQL shift register is observed. Based on the observing the output data bit pattern, it is determined that (or whether) the varying the value of the at least one bias signal parameter has moved the value of the at least one bias signal parameter closer to an optimal value of the at least one bias signal parameter. The varied bias signal parameter can be AC bias amplitude, DC bias value, or AC bias signal phase.

Another example RQL superconducting bias-level sensing circuitry for sensing bias levels provided to operational RQL circuitry of an RQL IC includes a phase mode logic (PML) shift register comprising a plurality of PML shift register elements coupled together in series with each other. Each PML shift register element includes a PML D flip-flop having a data input, a data output, and a logical clock input, the data input configured to be coupled to either a data output of a previous element in the PML shift register or to an input data bitstream source. Each PML shift register element further includes a data output path portion having an input coupled to the data output of the PML D flip-flop and an output configured to be coupled to either a data input of a next element in the PML shift register or to circuitry configured to receive an output data bitstream from the PML shift register, the data output path portion comprising first, second, and third JTL-based buffers coupled in series with each other between in the input and the output of the data output path portion. Each PML shift register element further includes a logical clock path trunk portion having an input configured to be coupled to either a logical clock path output of the next element in the PML shift register or to a logical clock source and an output configured to be coupled to either a logical clock path input of the previous element in the PML shift register and/or to a logical clock path branch of the PML shift register element, the logical clock path trunk portion comprising fourth, fifth, sixth, seventh, and eighth JTL-based buffers coupled in series with each other between the input and the output of the logical clock path trunk portion. Each PML shift register element further includes the aforementioned logical clock path branch, having an input coupled to the output of the logical clock path trunk portion of the PML shift register element and having an output coupled to the logical clock input of the PML D flip-flop, the logical clock path branch comprising ninth and tenth JTL-based buffers coupled in series with each other between the input and the output of the logical clock path branch.

BRIEF DESCRIPTION OF THE DRAWINGS

FIGS. 14 and 15 are block diagrams explaining symbols used in FIGS. 12, 13, 16, and 18.

DETAILED DESCRIPTION

Figure 1:
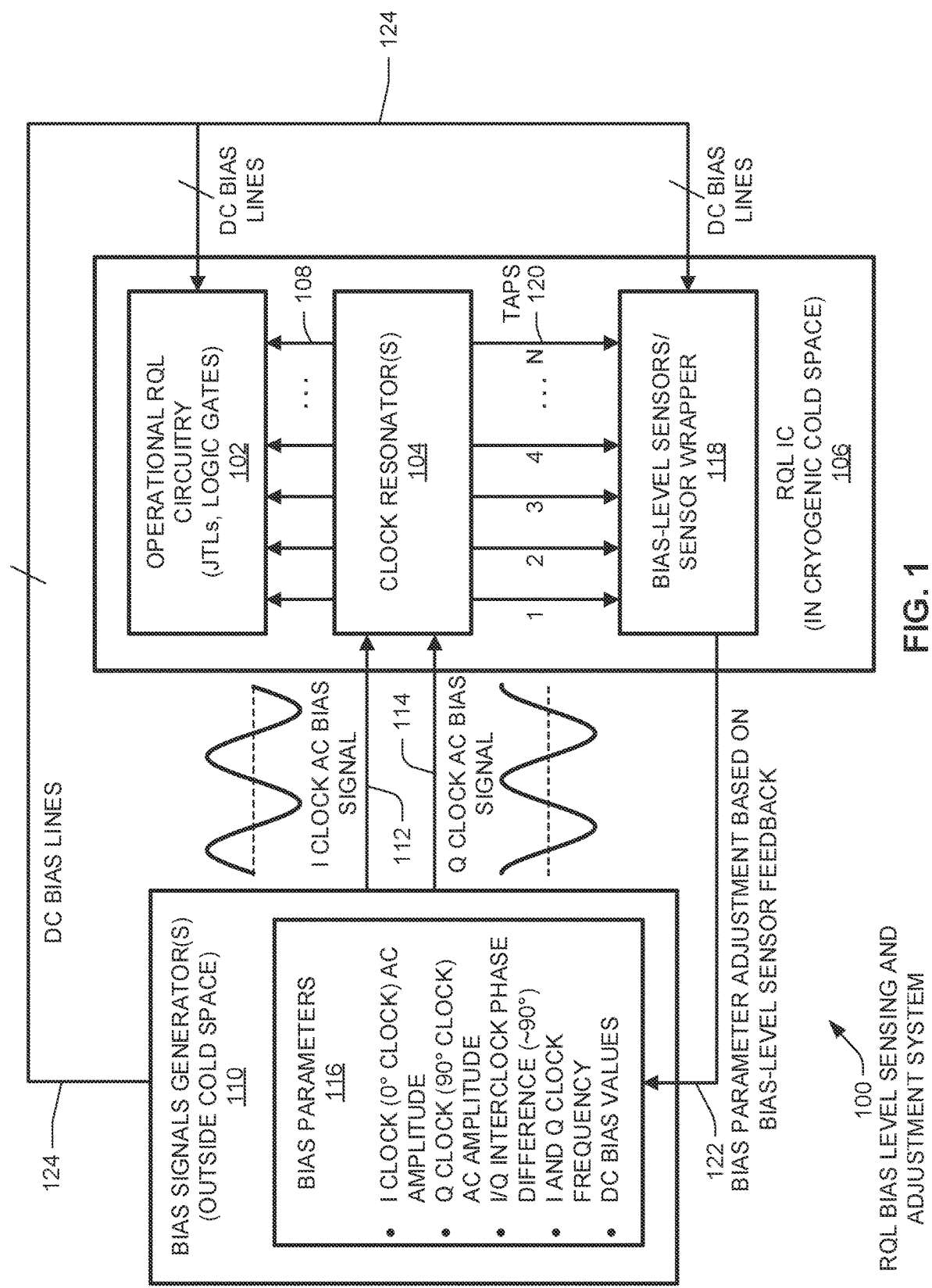
FIG. 1 is block diagram of an example RQL bias level sensing and adjustment system.

The computational functions of an RQL system can be at least in part performed by operative digital circuitry that can include logic gates and JTLs. This operative circuitry includes JJs that are biased by the one or more biasing signals of the RQL system, which can include both AC and DC bias signals, the AC signals of which can function as one or more clocks for the RQL system to synchronize data and/or provide a time-based flow of the logic functions of the RQL system. The AC biasing signals can provide clocks of different phases, such as a 0° clock or a 180° clock, sourced from an I clock resonator, or a 90° clock or a 270° clock, sourced from a Q clock resonator. The operative circuitry may operate correctly only within certain margins of various operating parameters. Some of these operating parameters are related to the biasing signals (e.g., clocks) provided to the RQL system. For example, if the DC bias level of a clock is too high or too low, and is thus outside of the DC bias operating margins of a gate or JTL within the RQL system, the RQL system may malfunction. As another example, if the AC bias signal of a clock is of an amplitude that is too large or too small, and is thus outside the AC bias operating margins of a gate or JTL within the RQL system, this can be another cause of RQL malfunction. As yet another example, if the relative phase difference of different clocks, such as an I clock and a Q clock, is too large or too small and falls outside the clock phase difference operating margins of a gate or JTL within the RQL system, this can be another cause of RQL malfunction.

Flux, the time integral of voltage, be it applied to conventional inductor or a JJ, is the primary operating parameter governing the function of RQL logic circuits. Due to fabrication process variations, among other factors, there can be considerable variation in the AC and DC flux produced by resonators and the tap transformers that couple to them, which transformers, in turn, supply bias signals to RQL logic circuits. Variations in inductors, dielectrics, and JJs that make up operational RQL circuits cause variations in the amount of AC and DC flux needed by those circuits. Variations in temperature can affect performance of RQL circuits, as can aging. Considering these changes and variations, the ideal values of bias parameters such as AC amplitude, DC value, and gate flux bias currents may not be the same for every RQL logic gate in a system.

Whereas the one or more clock signals provided to the RQL system may be generated by function generator circuitry operating at about room temperature (approximately 300 K), the RQL operative circuitry of the system may reside inside of a cryogenic cold space that operates much colder, e.g., at around 4 K or below, and may be meters away from the function generator circuitry. Because of the low operating temperature and thermal sequestration requirements of the RQL system, it may not be possible to directly probe an integrated circuit (IC) on which an RQL system is implemented to ascertain the biasing signal parameters (DC level, AC amplitude, relative phase difference of AC clock signals, etc.) at various points on the IC in order to check that the bias signal parameters actually supplied to the RQL operative circuitry are those intended to be supplied, or otherwise are within the operating margins of the operative circuitry.

Measurement of provided bias levels, e.g., the AC voltage and DC currents, and other bias parameters, such as relative phase difference between different bias signals, as provided on an RQL integrated circuit, can provide insight necessary to adjust bias levels, as generated at a bias source outside of the cold space, to assure that the delivered bias levels and other parameters as delivered to the operational RQL circuitry inside the cold space align with optimum values that are within the operating margins of the operational RQL circuitry, e.g., at the center of the operating margins of the operational RQL circuitry. Results of measurements for each RQL IC, or portions of each IC, can be used to adjust bias levels to improved, optimal, or near-optimal values, thus providing more reliable performance of the operational RQL circuitry.

Bias-level sensors can thus be provided as sensing circuitry fabricated on an RQL IC along with the operative circuitry of the RQL system. The bias-level sensors can sense the signal parameters of the bias signals provided to the operative circuitry at various locations on the IC. The sensed signal parameters can be used in a manual or automatic feedback loop to inform adjustment of the bias signals provided to the RQL system, so that the operative circuitry of the RQL system is provided with biasing that stays within the operative circuitry's operating margins. In some examples, a number of bias-level sensors can be embedded within a logic circuit, referred to herein as a wrapper, that activates the bias-level sensors, e.g., by interrogating them with a sampling signal, and reads out their results. As examples, the sensors can be embedded in an RQL scan register or JTL testbed register.

In some examples, bias-level-sensing circuit architectures and related methods described in this application enable the determination of improved, near-optimal, or optimal bias levels by observing pulses created by an ensemble of bias-level sensing circuits. Example bias-level sensing circuits, which can be referred to as samplers, act as surrogates for the operational RQL circuitry. The samplers can be configured in ensemble such that when elements of the operational RQL circuitry are at their optimal bias points, a certain fraction of the samplers are operational, or certain individual one(s) of the samplers are operational to transmit or produce bias-level-sensing output pulses in an expected manner, and others of the samplers are not operational to transmit or produce bias-level-sensing output pulses in the expected manner. Which and how many samplers generate bias-level-sensing output pulses reveals information relating to the present biasing of the operational RQL circuitry, e.g., the present bias point of the operational RQL circuitry. Digital logic can be utilized to count, reorder, and/or categorize the bias-level-sensing output pulses, and search and optimization algorithms can be used to adjust the bias signal generation parameters (e.g., bias levels), to improve the delivered bias levels and/or to bring the operating point nearer to its optimum.

Operating-margin offsets of the bias-level sensors, from nominal operating margins of operational RQL circuitry, can in some examples permit bias-level measurements to be made without stopping the operational RQL circuitry. As one example, bias transformer flux can be altered from its normal level to ensure that the bias sensing circuits provide a useful output without having to move bias levels beyond the range over which the operational RQL circuitry is functional. One way of altering bias transformer flux is to provide bias-level sensors with transformers configured to produce greater-than-normal or less-than-normal flux by altering their mutual inductance to a clock resonator. Another way of altering bias transformer flux is to insert more or less than the nominal amount of inductance between the transformer and the bias-level sensor. As another example, specialized bias sensing circuits can be configured to go in and out of operation at levels within the operating range of the logic circuits. This can be done by increasing or decreasing the sizes of JJs and inductors in the circuit. If the performance of the bias transformers and the clock resonator to which they are coupled is of greatest interest, directly driving a JJ from a standard transformer may be preferred, because only the variability of the JJ adds to the variability of the resonator and transformers. If the needs of the logic circuits vis-à-vis the outputs of the clock resonator and the bias transformers is of interest, it may be convenient to utilize sensing circuits that differ minimally from the operational circuits. This latter objective can be achieved by adding extra inductance in series with the transformers, while keeping the transformers and the rest of the logic sensing circuits in standard configuration.

The operating-margin offsets can differ from one bias-level sensor to another in an ensemble of such sensors that can be collected within wrapper circuitry configured to provide bias level measurement sampling inputs and outputs. Inter-sensor variations of operating-margin offsets can be intentionally induced by design (staged), for example, to cover a range centered about the nominal operating point of the operational RQL circuitry. In such a case, the ensemble of bias-level sensors can be configured that a certain proportion of the bias-level sensors (e.g., about half of the bias-level sensors) produce pulses when the operational logic is optimally biased in terms of AC amplitude. Thus, the AC amplitude bias level, relative to the needs of the operational RQL circuitry, can be determined by counting the pulses generated by the ensemble. In other examples, element spread in the operating levels of the bias-level sensors caused by fabrication process variation can be used to provide pulse-count sensing output effectively equivalent to that using the staged sensors described above, without intentional staging of bias-level sensor operating-margin offsets. This is because when bias to the sensors is such that they are on the edge of functionality when the operational circuits are optimally biased, even without designing for intentional staging of the sensors' margins, the operational RQL circuitry is near its optimal bias condition when around half of the bias-level sensors are biased within their own operating margins and thus produce sensing pulses when interrogated with a sample signal via the wrapper circuitry.

FIG. 1 shows an example RQL bias level sensing and adjustment system 100. Operational RQL circuitry 102, such as may include JTLs and logic gates, can be fabricated along with associated one or more clock resonators 104 on an IC 106 as a chip that can be enclosed in a cryogenic cold space configured to be brought down to RQL operating temperatures, e.g., in the low single-digit kelvins or below. The term "operational RQL circuitry" as used herein means logic circuits and associated infrastructure circuitry used to perform the useful computational action for which the RQL IC 106 or system is designed, as distinct from circuitry 118 on the RQL IC 106 used to perform sensing of parameters associated with bias signals provided to the RQL IC 106. The bias-level sensors and wrapper 118 can be provided as spatially distributed on the IC 106 (e.g., throughout the space on the IC also occupied by the operational RQL circuitry) to improve accuracy of bias-level measurement.

The operational circuitry 102 is coupled (e.g., inductively coupled) to the one or more clock resonators 104 via a number of taps 108 to provide AC biasing to the operational circuitry 102. The operational circuitry can also be coupled to a number of DC bias lines 124 to provide DC biasing to the operational circuitry 102. In some examples, DC bias lines 124 can be configured to circulate about through the clock resonators 104 to control the amount of DC bias that is applied to the operational RQL circuitry 102 and/or bias-level sensors 118. In some examples, each bias tap 108 or 120 can have an AC transformer coupled to a rib or ribs of a clock resonator 104 in series with another transformer coupled to a DC bias line 124. Outside of the cold space, a bias signal generator 110 (or multiple such bias signal generators, e.g., different signal generators to provide I clock bias, Q clock bias, and various DC bias signals) can generate one or more clock signals, such as I clock 112 and Q clock 114, for provision to the operational circuitry 102 via the clock resonators 104 and associated taps 108 in the cold space. The one or more bias signal generators 110 can also generate DC bias signals for provision to the operational circuitry 102 on the IC 106 over DC bias lines 124. The one or more clock signals and/or DC bias signals generated by the clock signal generator 110 can be based on different bias parameters 116, which can be of the form of adjustable or variable settings provided to or stored in the bias signal generator 110. Such bias parameters can include, as examples, a clock frequency, AC amplitudes for any AC clocks generated (e.g., I and Q clocks), or one or more DC values for DC biases generated, and a phase difference between the Q clock and an I clock at the point of clock generation (which can nominally be about 90°, but in some cases are not exactly 90°).

Bias-level sensors 118 can also be fabricated on the same IC 106 as the operational RQL circuitry 102 and can be configured to sample the one or more biasing signals (AC clocks and/or DC bias signals) provided by the one or more resonators 104 via a number (N) of sampling taps 120, and/or via the DC bias lines 124. The bias-level sensors can be configured within a wrapper that can be used to introduce a sampling signal to the bias-level sensors 118 and to output a signal based on the sampling signal that is indicative of the measurements of the various clock parameters taken by the bias-level sensors. Such parameters can include any or all of those listed above (parameters 116) as used to generate the clock signals outside of the cold space by the clock signal generator 110. The output of the bias-level sensors and/or an associated sensor wrapper 118 can be used to adjust, via feedback loop 122, the parameters provided to the clock signal generator 110, such that the AC clocks and/or DC bias signals as provided at the operational RQL circuitry 102 can be assured to provide biasing that meets the margin requirements of the operational RQL circuitry 102. In some examples, RQL bias level sensing and adjustment system 100 can provide the bias feedback and adjustment without necessitating the deactivation or otherwise the rendering inoperative of the operational RQL circuitry 102.

Figure 2A:
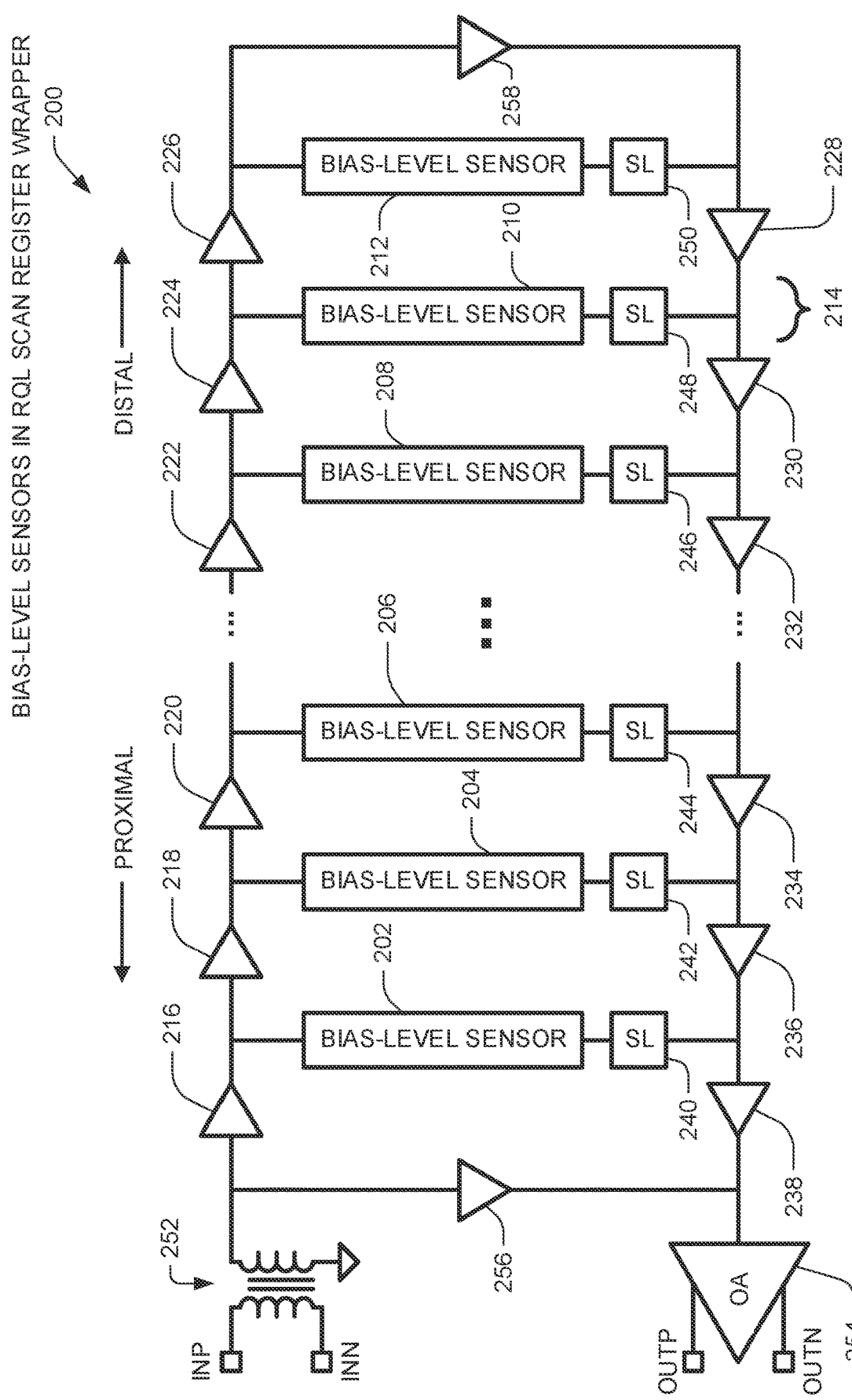
FIG. 2A is a block diagram of an example set of RQL bias-level sensors configured in a JTL-based RQL scan register bias-level sensor wrapper for serial output.

FIG. 2A shows an example arrangement 200 of RQL bias-level sensors 202-212 wrapped in a JTL-based RQL scan register bias-level sensor wrapper used to provide as a serial output what otherwise might be a parallel output of a possibly very large number of bias-level sensors. The bias-level sensors 202-212, also referred to herein as samplers, can be considered as residing on rungs of a ladder formed by the sensor wrapper. One such rung is labeled 214 in FIG. 2A. The rails of the ladder can be formed by JTLs 216-238, illustrated in FIG. 2A as triangles, or other circuitry configured to propagate SFQ pulses through the wrapper structure with an inter-rung propagation delay. Although the example of FIG. 2A is illustrated as having one rail JTL between each ladder rung, each JTL 216-238 can be configured with one or as many repeating RQL JTL circuit structures as may be desired to produce one or a number of AC clock cycles of SFQ signal propagation delay.

The bias-level sensors 202-212 can take a number of different forms, and can be configured to measure any of a number of different parameters, including AC bias signal amplitude, DC bias value, and inter-clock phase. Depending on the form of the bias-level sensors 202-212, the rungs can also include suppression logic (SL) 240-250 configured to prevent multiple output pulse assertions from being propagated out of a rung, should an associated sampler be in a state of flipping spontaneously due to a fabrication defect or over-bias. Some examples may omit suppression logic 240-250 on any or all rungs of the wrapper. The wrapper can also include an input transformer 252 configured to provide to the wrapper a sample signal consisting of at least one input SFQ pulse supplied from positive and negative input nodes INP and INN. The wrapper can also include an output amplifier 254 configured to output a voltage signal between positive and negative output nodes OUTP and OUTN. Output amplifier 254 can, for example, take the form of a binary vine tree of JTLs (not shown) configured to split an incoming SFQ signal for provision into a number of stacked DC SQUIDs (e.g., four DC SQUIDs) arranged as a voltage summer.

In the example arrangement 200 of FIG. 2A, a sample signal provided as an SFQ pulse via input transformer 252 propagates along the upper rail from the proximal end toward the distal end of the wrapper ladder and splits along the rungs of the ladder to produce multiple time-separated output voltage pulses at the ladder output between output nodes OUTP, OUTN. Because each rail JTL 216-238 produces an inter-rung propagation delay of at least one AC clock cycle, the output pulses are spaced apart in time, with the earlier-arriving output pulses being those that have propagated through the more proximal rungs of the wrapper ladder (those closer to the input/output end of the wrapper ladder) and the later-arriving output pulses being those that have propagated through the more distal rungs of the wrapper ladder (those further away from the input/output end of the wrapper ladder). Precisely how many output pulses are produced for a given sample input pulse depends on the number of the samplers 202-212 that are functional by virtue of the provided bias signal(s) being within the operating margins of the individual samplers 202-212. As described in greater detail below, in some examples, the samplers 202-212 can be fabricated to have margins that are intentionally staged in, for example, AC bias amplitude $X_{AC}$, DC bias value $X_{DC}$, or inter-clock phase difference $X_{phase}$. The "X" in this nomenclature refers to a multiplier of a nominal bias level. For example, if a nominal bias level is 0.2 V, an actual applied bias level of 0.22 V has an X of 1.1 (110%). In other examples, the sensing system can rely on fabrication process variations to provide samplers 202-212 that have margins that are spread (vary over a range) without having intentionally designed staging.

Figure 6:
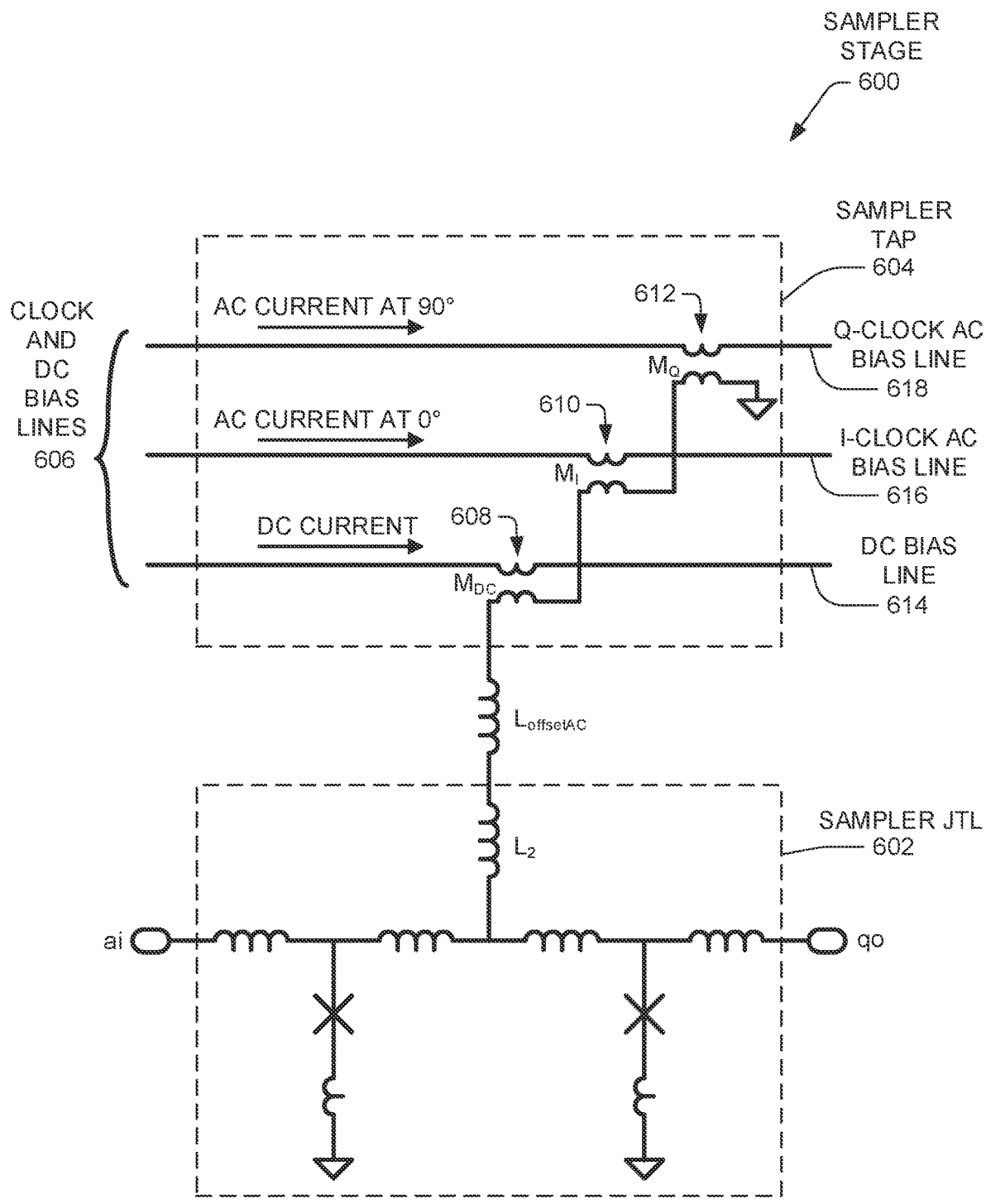
FIG. 6 is a circuit diagram of an example sampler stage configured for use in a bias-level sensor such as those shown in FIG. 2A, the sampler stage including a JTL supplied with bias by a tap.

In some examples, such as the example 200 illustrated in FIG. 2A, the first and final rungs of the wrapper ladder (the most proximal and most distal rungs) can be JTLs 256, 258 fed with standard biases (that do not have the self-inductance and/or mutual inductance modifications of the sampler stage 600 of FIG. 6), such that the first and final pulses provided at the output of the wrapper are indicative of the margins of standard devices, for comparison with margins of samplers 202-212. Pulses generated by standard-bias JTLs 256, 258 provide pulses that serve to mark the beginning and the end of the pulse train that is generated when an input pulse is provided at INP/INN. Other examples, not shown, can have additional standard-JTL rungs at other rung locations interspersed along the wrapper ladder. Logic, e.g., room-temperature semiconductor logic (not shown), can evaluate the output of each sampler 202-212 individually, or can use the total number of functional samplers (each represented by its pulse) as a measurement of the global bias for the sensing system. As described in greater detail below, introducing a gradation in the bias level sensed by the bias-level sensors 202-212 that are included in the rungs of the RQL scan register 200 results in an output that quantifies or digitizes the sensed bias parameter either by producing a number of output pulses in the output pulse stream that is proportional to the bias parameter being sensed, or by producing output pulses the output timing of which is indicative of the bias parameter being sensed.

Figure 2B:
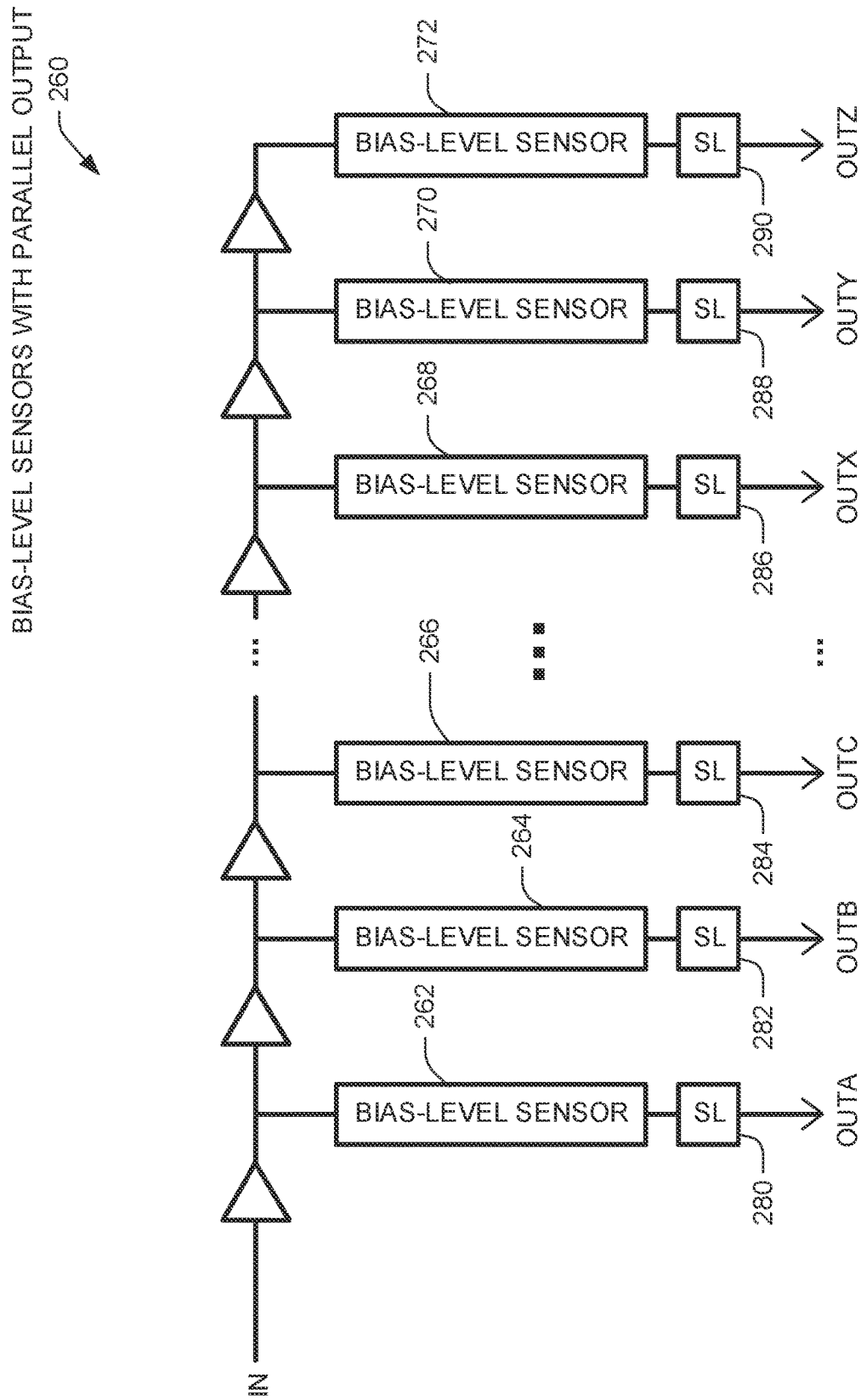
FIG. 2B is a block diagram of an example set of RQL bias-level sensors configured in a JTL-based bias-level sensor wrapper for parallel output.

FIG. 2B shows an example arrangement 260 of RQL bias-level sensors 262-272 arranged with parallel output. Arrangement 260 is similar to the RQL scan register arrangement 200 of FIG. 2A, except that output is provided in parallel rather than in serial. Parallel-output arrangement 260 can also include suppression logic (SL) 280-290 configured to prevent multiple output pulse assertions from being propagated out of each output, should an associated sampler be in a state of flipping spontaneously due to a fabrication defect or over-bias. Each bias-level sensor 262-272 can be situated at different locations on RQL IC 106 and can tap one or more bias resonators 104 at a different point along the resonator(s) 104 via bias coupling transformers (not shown in FIG. 2C). An advantage of the serial-output arrangement of FIG. 2A over the parallel-output arrangement of FIG. 2B is that the arrangement of FIG. 2A can in some examples conserve I/O on the RQL IC 106. In some examples, the parallel outputs OUTA-OUTZ of FIG. 2B can be provided to a built-in self-test (BIST) readable register implemented on RQL IC 106 for storage and later readout in serial or parallel fashion.

Figure 2C:
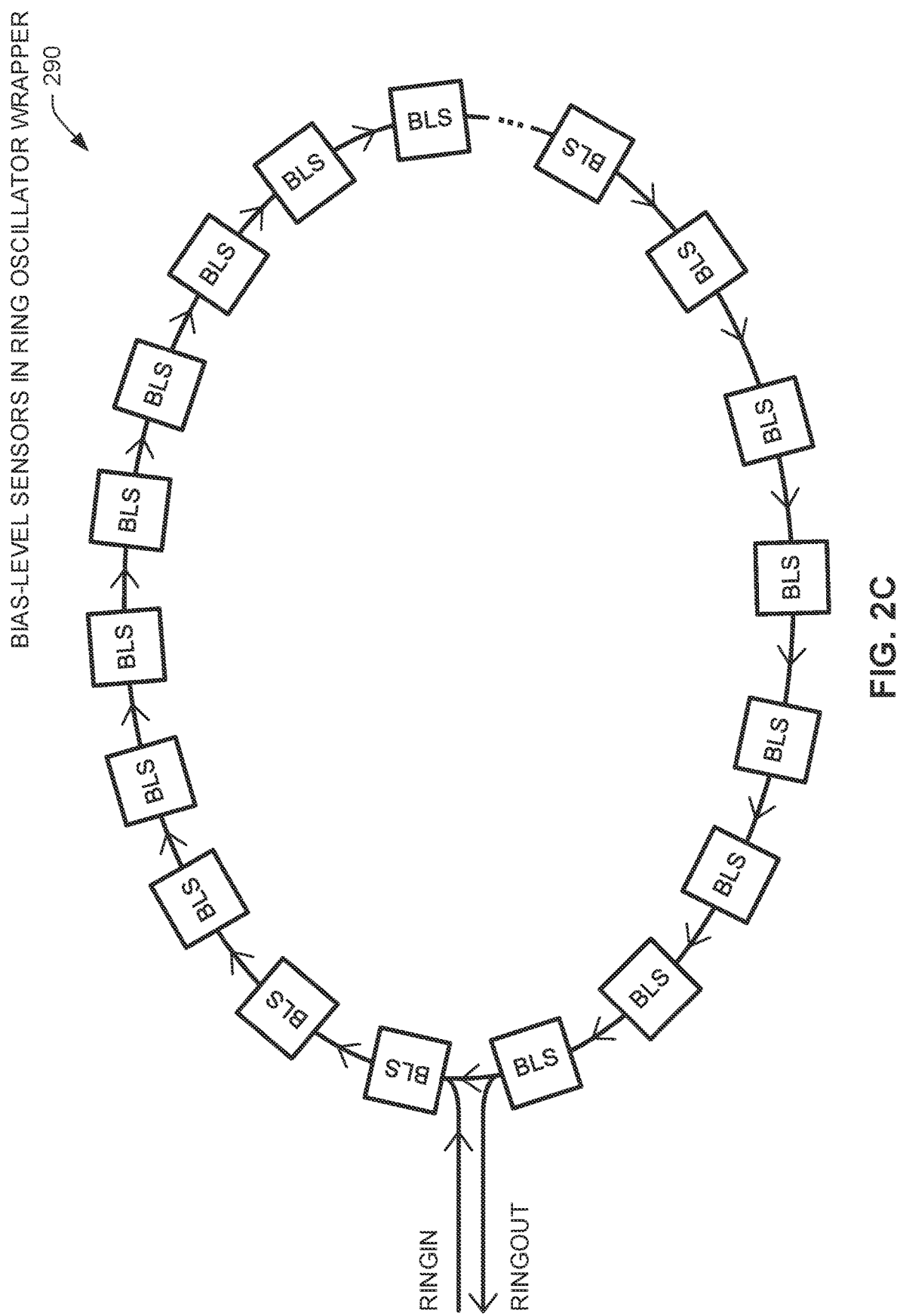
FIG. 2C is a block diagram of an example set of RQL bias-level sensors configured in a ring oscillator wrapper.

FIG. 2C shows an example arrangement 290 of bias-level sensors (each labeled BLS) arranged as a ring oscillator. The number of bias-level in the ring oscillator can be arbitrarily large. The output of one bias-level sensor serves as the sample signal input for the next bias-level sensor in the ring. Each bias-level sensor can be situated at different locations on RQL IC 106 and can tap one or more bias resonators 104 at a different point along the resonator(s) 104 via bias coupling transformers (not shown in FIG. 2C). Although not shown in FIG. 2C, bias-level sensors in the ring 290 can be interspersed with conventional JTLs on the ring to facilitate propagation of SFQ pulses between bias-level sensors in the ring.

In ring arrangement 290 of FIG. 2C, an initial sampling assertion signal (an SFQ pulse or reciprocal pulse pair) can be provided on input RINGIN. The sampling pulse or pulse pair can propagate around the ring indefinitely so long as all of the bias-level sensors are operational (so long as the provided bias point is within the operating region of all of the bias-level sensors in the ring) 290. When the bias parameters are adjusted such that the provided bias parameters are outside of the operating region of any one bias-level sensor in the ring, the entire ring "breaks" in that the sampling signal no longer propagates around the ring but instead stops at the first inoperative bias-level sensor it reaches. The continued operationality of the ring can be checked via output RINGOUT, which, under conditions of full ring operation, generates an SFQ pulse stream (or stream of reciprocal pulse pairs) at a rate that is related to the size of the ring (one output pulse or pulse pair per revolution of the sample pulse around the ring), and ceases output when the ring breaks due to a bias parameter adjustment. As described in greater detail below, $X_{AC}$, $X_{DC}$, and $X_{phase}$ parameters can be scanned (iteratively adjusted) in an optimization procedure. The minimum $X_{AC}$ level at which the ring oscillator still functions to produce the output at RINGOUT results in optimal bias for operational RQL circuitry 102. In some examples, more than one input sample pulse at a time can be provided to an operational ring, e.g., by multiple pulses separated in time, resulting in an increased output pulse frequency.

Figure 25:
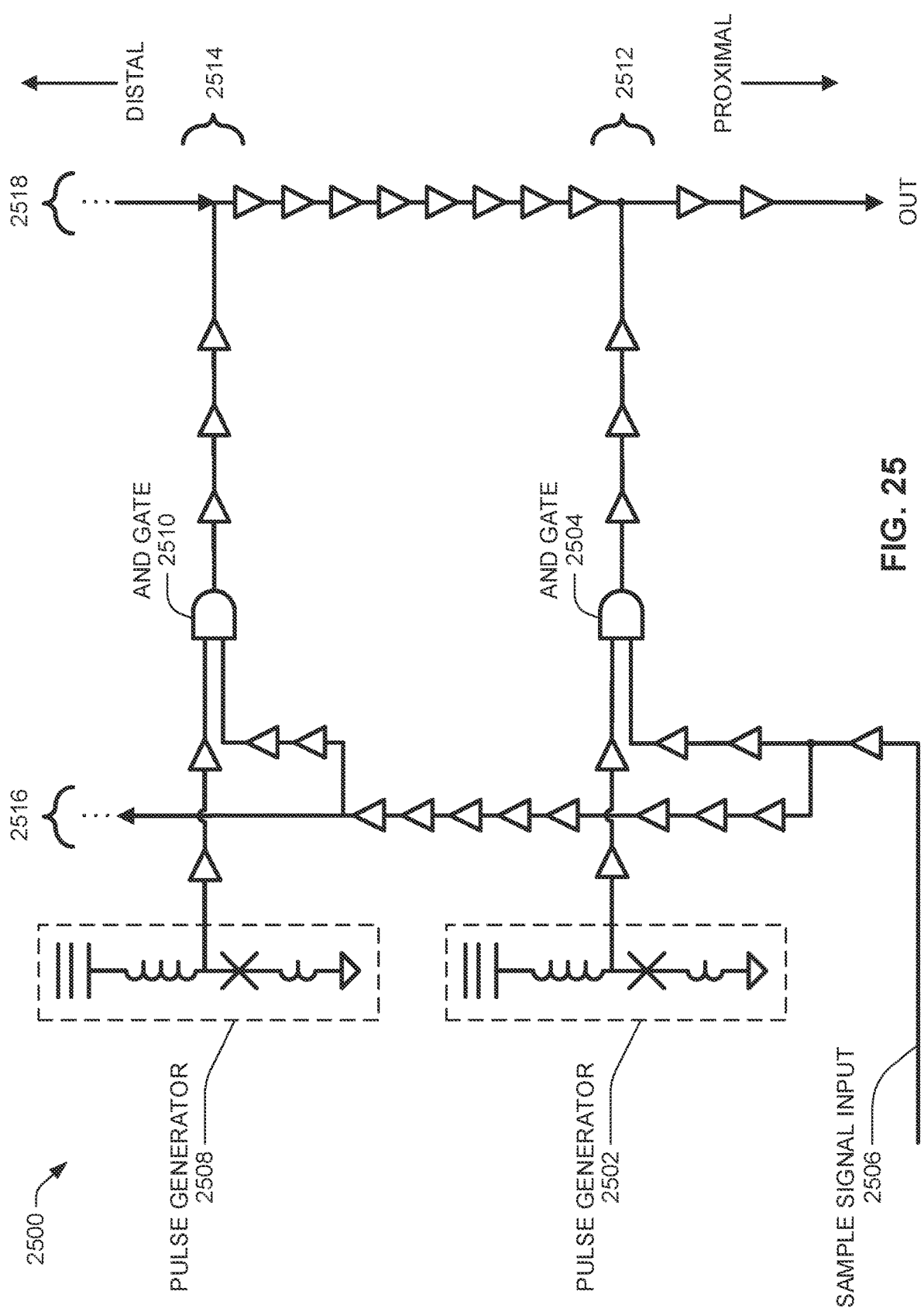
FIG. 25 is a block diagram of example pulse-generator-based bias-level sensors as shown in a portion of a wrapper similar to that of FIG. 2A.

In each of the above examples of FIGS. 2A-2C, the bias-level sensors can be JTL-based bias-level sensors as described with regard to FIGS. 6, 8A, 9A, 10A, 11A, 12, 13, 16, and 18, PML flip-flop-based bias-level sensors as described with regard to FIG. 25, pulse-generator-based bias-level sensors as described with regard to FIG. 25, or other types of bias-level sensor suitable for arrangement in serial, parallel, or ring output configurations. Different bias-level sensors in the same arrangement can be configured to sense any or all of $X_{AC}$, $X_{DC}$, $X_{phase}$, or other bias parameters.

Figure 3:
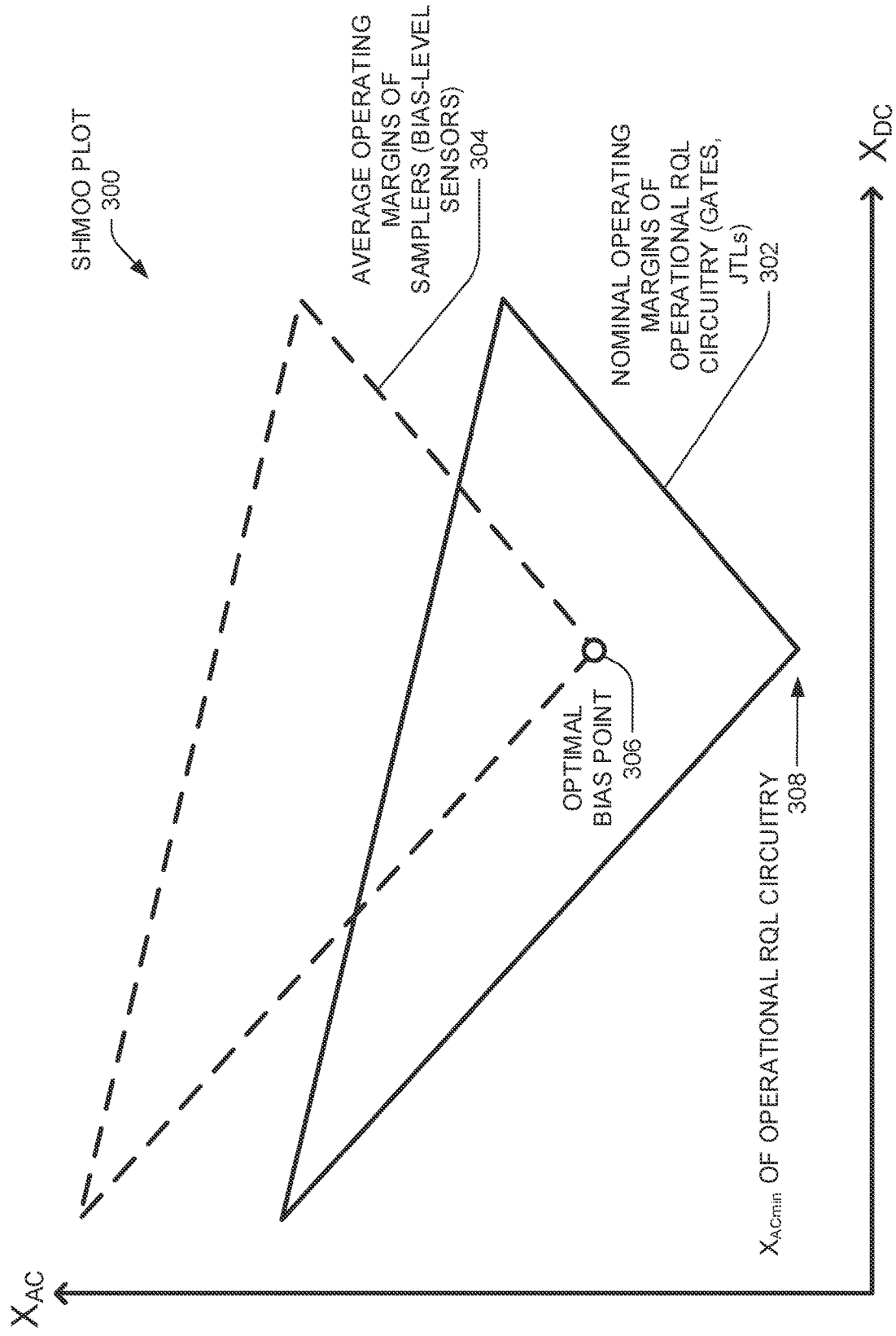
FIG. 3 is a graph of example margin shmoo plots of nominal AC and DC bias level operating margins for operative RQL circuitry and for RQL bias-level sensors.

Combinations of operating margins of RQL circuitry can be described by a shmoo plot. For example, the AC and DC operating margins can be described by a two-dimensional shmoo plot. The graph 300 of FIG. 3 shows a first example shmoo plot 302 representing nominal AC and DC bias level operating margins for operational RQL circuitry 102 and a second example shmoo plot 304 representing the average of AC and DC bias level operating margins 304 for RQL bias-level sensors (e.g., samplers 202-212). The operating margins 302 of operational RQL circuitry, when represented in the $X_{DC}$, $X_{AC}$ space, have a well-defined corner 308, referred to herein as a lower limit or as $X_{ACmin}$, where the AC clock amplitude is minimized in the respective margin shmoo plot 302. Because the lower limit ($X_{ACmin}$) of a sampler is a unique point in the $X_{DC}$, $X_{AC}$ space of a sampler's margin shmoo plot., it can be used to provide an unambiguous measurement of both $X_{AC}$ and $X_{DC}$ for the sampler. Within the center of the nominal margin shmoo plot 302 (e.g., at the centroid or geometric center of the nominal margin shmoo plot 302) resides an optimal bias point 306 for the operational RQL circuitry, a unique point in the $X_{DC}$, $X_{AC}$ space of the margin shmoo plot 302. Samplers (e.g., samplers 202-212) can be designed and staged such that the lower limit ($X_{ACmin}$) of an average of the margin shmoo plots 304 of the samplers is in the middle of the margin shmoo plot of nominal operational RQL circuitry 102, at the optimal bias point 306, as shown in FIG. 3.

One or more parameters of the biasing signals (e.g., clocks, DC biases) provided (e.g., via one of input lines 112, 114, 124 in FIG. 1) to the operational RQL circuitry 102, such as a DC value or AC amplitude, can be adjusted until outputs of the bias-level sensor wrapper are consistent with a desired, improved, or ideal biasing condition. For example, the operational RQL circuitry 102 can be said to be ideally biased in terms of the AC and DC parameters of the provided clock when the AC amplitude and DC level parameters are set such that only the proximal half of the $X_{AC}$ samplers of a linearly staged set of $X_{AC}$ samplers return output pulses (as shown in FIG. 4C) and such that only one or several of the middle $X_{DC}$ samplers of a linearly staged set of $X_{DC}$ samplers return output pulses (as shown in FIG. 5C). Setting the lower-limit point of the samplers' shmoo 304 to be at about the optimal bias point 306 of the operational circuitry shmoo 302 can be accomplished, by way of example, by setting of the self inductance and/or DC mutual inductance (for $X_{AC}$ or $X_{DC}$ samplers, respectively) by which the sampler JTLs are provided the corresponding bias signal to be measured. Setting the lower-limit point of the samplers' shmoo 304 to be at about the optimal bias point 306 of the operational circuitry shmoo 302 can be accomplished, by way of another example, by setting of one or more of the AC mutual inductances by which the sampler JTLs are provided one or more AC bias signals or, as another example, by inserting self-inductance between the JTL and the transformers (tap). An optimization procedure such as the procedure 2800 illustrated in FIG. 28 can be used to calibrate a bias signal, e.g., to an ideal calibration or close to an ideal calibration. When the samplers are configured with their lower limits at about the optimal bias point 306, the optimization procedure 2800 can be carried out such that the adjusted parameters of the clock(s) and/or DC bias signals remain within the operating margins of the operational RQL circuitry 102, meaning that the bias signal calibration can be performed while the operational RQL circuitry remains continuously in operation even while its bias parameters are being adjusted, improved, or optimized.

Figure 4A:
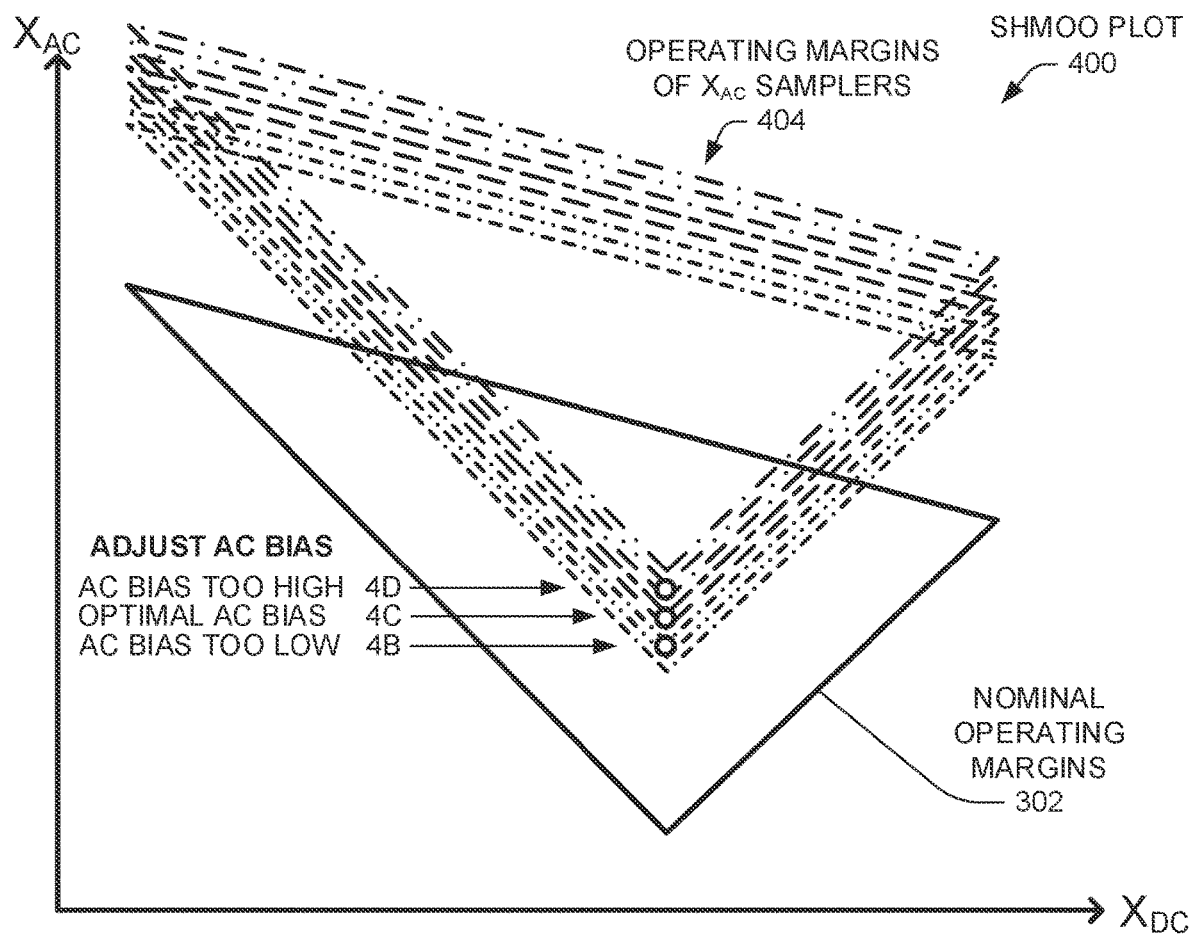
FIG. 4A is a graph of example margin shmoo plots of AC and DC bias level operating margins for operative RQL circuitry and for RQL bias-level sensors showing the effect of change in AC amplitude of provided bias signals.
Figure 4B:
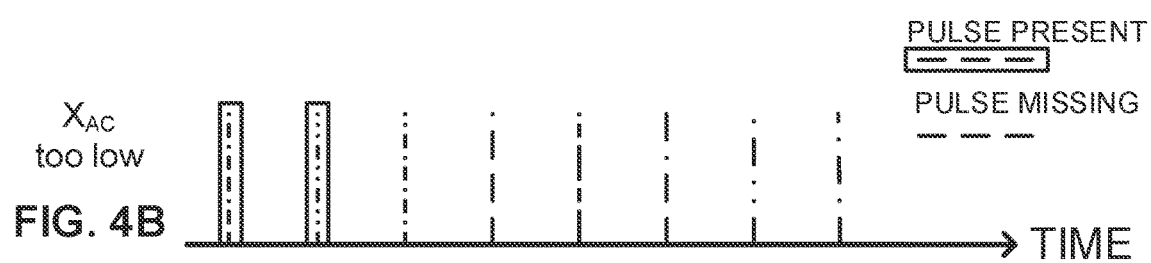
FIGS. 4B-4D are one-dimensional time plots of output pulse receipts for a bias-level sensor wrapper like the one of FIG. 2A showing the effect of change in AC amplitude of provided bias signals as illustrated in FIG. 4A.
Figure 4C:
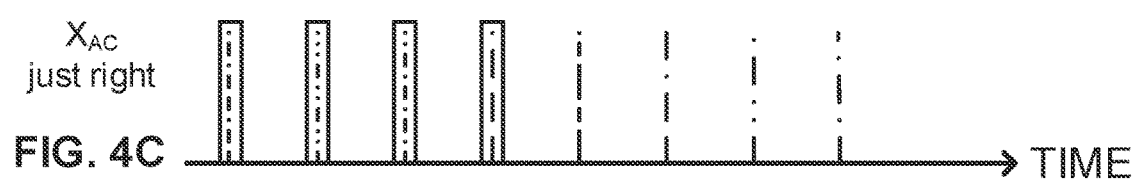
Figure 4D:
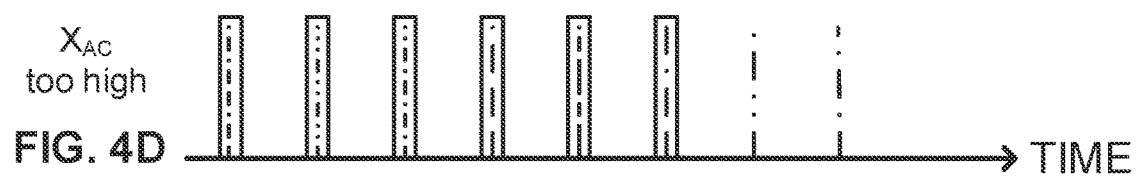

The graph 400 of FIG. 4A shows example shmoo plots 302, 404 of nominal AC and DC bias level operating margins for operative RQL circuitry 102 and for AC bias-level sensors ($X_{AC}$ samplers), respectively. Graph 400 includes margins 404 for eight $X_{AC}$ samplers, but the number of $X_{AC}$ samplers can, in some examples, be less than or greater than eight. The graph 400, viewed along with the one-dimensional time plots of FIGS. 4B-4D, illustrates the performance of an example $X_{AC}$ optimization method that can be carried out without interruption of the operation of operational RQL circuitry 102 having nominal operating margins 302. The AC amplitude of a provided bias signal can be varied, in effect shifting a bias point vertically up and down on the graph 400, until the optimal AC bias point 4C is determined. The $X_{AC}$ samplers can, for example, have bias transformers with varying values of self-inductance to produce varying offsets in AC response and nominal DC mutual inductance. Increased self-inductance between a JTL of an $X_{AC}$ sampler and its respective sampler tap of bias lines can have a further beneficial effect of preventing the $X_{AC}$ sampler from flipping spontaneously, as clock amplitude is raised, before the operational RQL circuitry 102 does. An ensemble of $X_{AC}$ samplers can be configured such that the lower limits of their respective margin shmoo plots are centered about the bias point 306 initially deemed or assumed optimal for operation of the operational RQL circuitry 102. As shown in FIG. 4A, the lower limits of the $X_{AC}$ sampler margin shmoo plots are centered near the middle of the nominal operational RQL circuitry margin shmoo plot 302.

FIGS. 4B-4D show output pulse receipts, or non-receipts, for an example bias-level sensor wrapper like the one of FIG. 2A when it is provided with $X_{AC}$ samplers as its bias-level sensors 202-212. In the illustrated example, the $X_{AC}$ samplers are arranged in the wrapper in order of the level by which their shmoo plots have been shifted upward in the $X_{DC}$-$X_{AC}$ space. Samplers having shmoo plots least elevated in the $X_{DC}$-$X_{AC}$ space are placed near the proximal end of the bias-level sensor wrapper and those having shmoo plots most elevated in the $X_{DC}$-$X_{AC}$ space are placed near the distal end of the bias-level sensor wrapper. The broken-line patterns of the output pulses in FIGS. 4B-4D correspond to the same broken-line patterns of the margin shmoo plots 404 of FIG. 4A, in that a pulse of a certain broken-line pattern in FIGS. 4B-4D is one created by an $X_{AC}$ sampler having margins drawn with the same broken-line pattern in FIG. 4A. FIGS. 4B-4D thus show the wrapper output effect of change in AC amplitude of provided bias signals as illustrated in FIG. 4A. When the provided AC bias is too low, the AC bias point 4B is too low to be within the operating margins of most of the $X_{AC}$ samplers. Accordingly, the number of returned output pulses are comparatively few, as shown in FIG. 4B. For example, as illustrated in FIG. 4B, the output pulses returned can be limited to the earlier pulse returns, provided the $X_{AC}$ samplers are staged in order (e.g., linearly), with those configured to have the lowest AC operating margins placed most proximally to the input/output end of the wrapper shown in FIG. 2A. By contrast, when the provided AC bias is too high, the AC bias point 4D is too high to be within the operating margins of most of the $X_{AC}$ samplers. Accordingly, the number of returned output pulses are comparatively many, as shown in FIG. 4D. For example, as illustrated in FIG. 4B, the output pulses returned, can include the earlier pulse returns as well as some later pulse returns, again provided the $X_{AC}$ samplers are staged linearly, with those configured to have the highest AC operating margins placed most distally to the input/output end of the wrapper shown in FIG. 2A. The provided AC bias 4C can, for example, be deemed optimal when the number of returned output pulses is at a mid-range number, an example of which is shown in FIG. 4C, e.g., such that about half of the $X_{AC}$ samplers are operational and therefore return output pulses, and about half of the $X_{AC}$ samplers are non-operational and therefore do not return output pulses. Although FIGS. 4B-4D illustrate an example in which $X_{AC}$ samplers are distributed in $X_{AC}$-dimension ascending order of their AC lower limits along the length of an RQL scan register wrapper like that of FIG. 2A, in other examples, an RQL scan register wrapper like that of FIG. 2A can be configured with $X_{AC}$ samplers arranged in other orders, including descending order or a known arrangement of no particular order, and the order can be accounted for accordingly when analyzing outputs of the RQL scan register wrapper to determine improved or optimal bias levels. In other examples in which wrapper output analysis involves counting the number of samplers active under a given bias condition, as when spreading of the sampler margins is accomplished by process variation alone, the order is unimportant and need not be accounted for in analysis of wrapper outputs to determine improved or optimized bias levels.

Figure 5A:
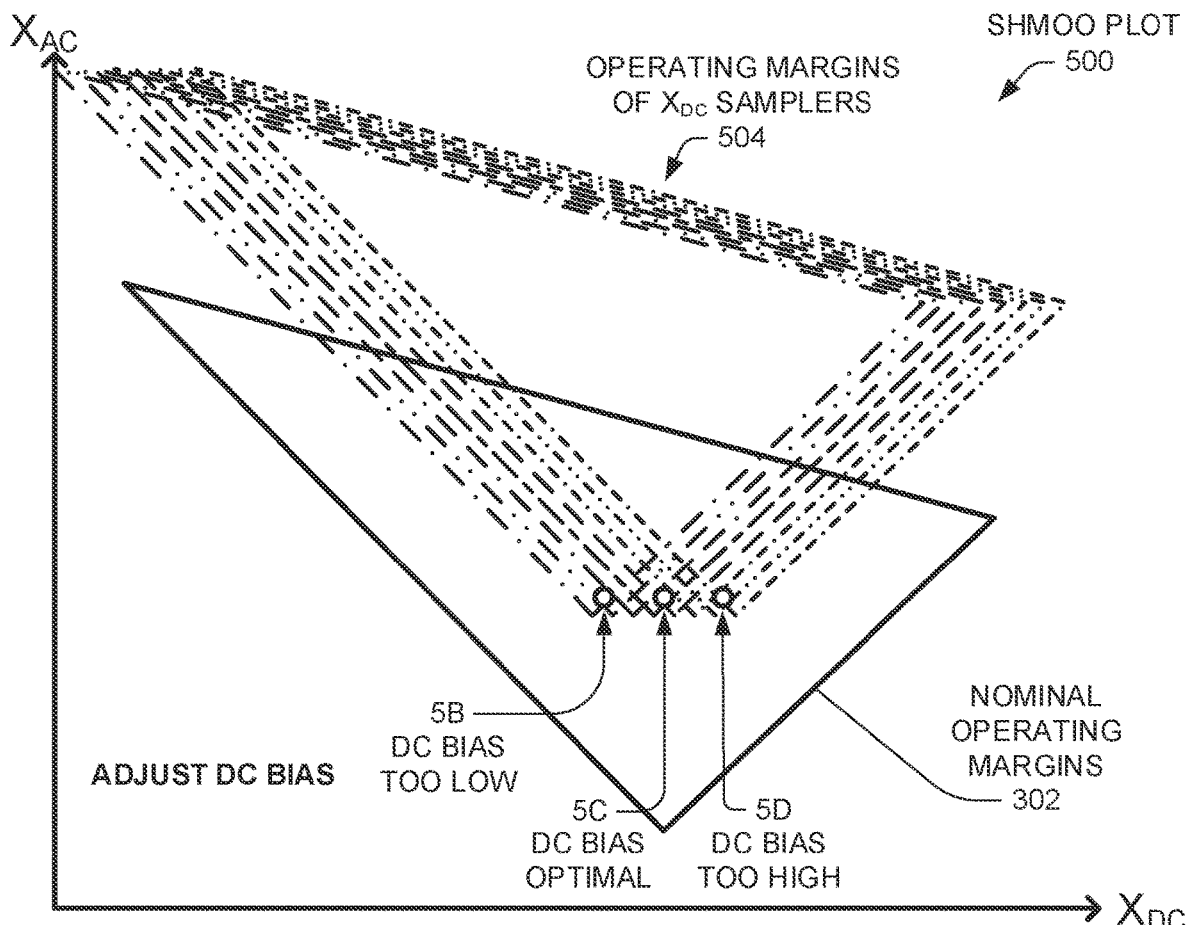
FIG. 5A is a graph of example margin shmoo plots of AC and DC bias level operating margins for operative RQL circuitry and for RQL bias-level sensors showing the effect of change in DC value of provided bias signals.
Figure 5B:
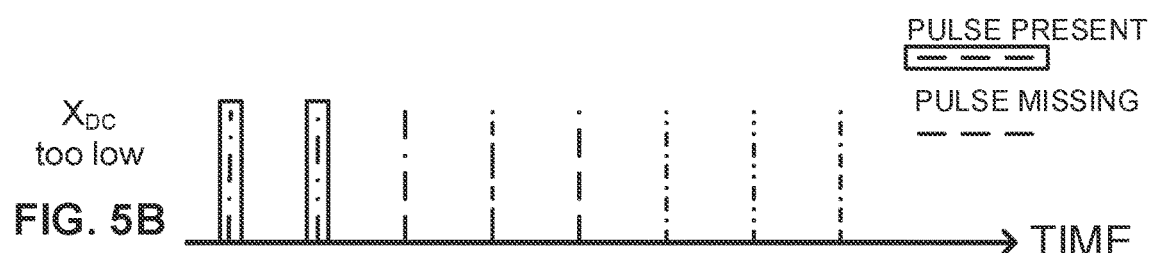
FIGS. 5B-5D are one-dimensional time plots of output pulse receipts for a bias-level sensor wrapper like the one of FIG. 2A showing the effect of change in DC value of provided bias signals as illustrated in FIG. 5A.
Figure 5C:
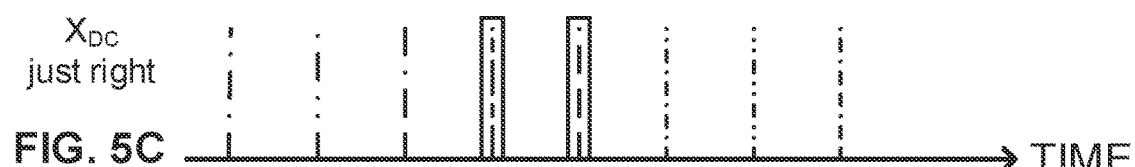
Figure 5D:
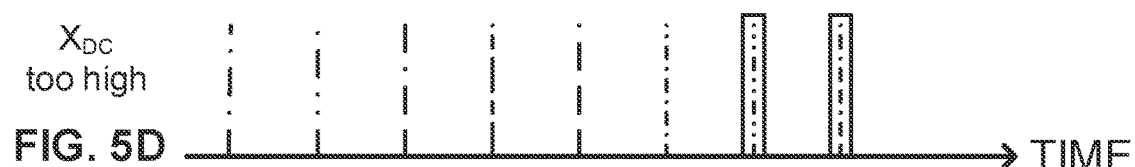

The graph 500 of FIG. 5A shows example shmoo plots 302, 504 of nominal AC and DC bias level operating margins for operative RQL circuitry 102 and for DC bias-level sensors ($X_{DC}$ samplers). Graph 500 includes margins 504 for eight $X_{DC}$ samplers, but the number of $X_{DC}$ samplers can, in some examples, be less than or greater than eight. The graph 500, viewed along with the one-dimensional time plots of FIGS. 5B-5D, illustrates the performance of an example $X_{DC}$ optimization method that can be carried out without interruption of the operation of operational RQL circuitry 102 having nominal operating margins 302. The DC value of a provided bias signal can be varied, in effect shifting a bias point horizontally left and right on the graph 500, until the optimal DC bias point 5C is determined. The $X_{DC}$ samplers can, for example, have bias transformers with varying DC mutual inductance (MDC) and nominal AC mutual inductance. As an example, if the DC bias point of nominal operating margins 302 is such that the ideal current in the DC bias lines is 2.0 mA, DC mutual inductance for the $X_{DC}$ samplers can be staged to have mutual inductances in each of the samplers' respective transformer(s) to the DC bias line so that the $X_{DC}$ samplers are optimally biased when the DC bias line current varies between 1.5 mA and 2.5 mA. Such variation in DC mutual inductance can be provided for a given $X_{DC}$ sampler, for example, by varying distance over which a DC transformer in a bias tap of the given $X_{DC}$ sampler couples to a respective DC bias line, thus making such coupling distance shorter or longer. As with $X_{AC}$ samplers in the example illustrated in FIG. 4A, the $X_{DC}$ samplers can be configured in ensemble such that the lower limits of their margin shmoo plots are centered about the bias point 306 initially deemed or assumed optimal for operation of the operational RQL circuitry 102. As shown in FIG. 5A, the lower limits of the $X_{DC}$ sampler margin shmoo plots are centered near the middle of the nominal operational RQL circuitry margin shmoo plot 302.

FIGS. 5B-5D show output pulse receipts, or non-receipts, for an example bias-level sensor wrapper like the one of FIG. 2A when it is provided with $X_{DC}$ samplers as its bias-level sensors 202-212. The broken-line patterns of the output pulses in FIGS. 5B-5D correspond to the same broken-line patterns of the margin shmoo plots 504 of FIG. 5A, in that a pulse of a certain broken-line pattern in FIGS. 5B-5D is one created by an $X_{DC}$ sampler having margins drawn with the same broken-line pattern in FIG. 5A. FIGS. 5B-5D thus show the wrapper output effect of change in DC value of provided bias signals as illustrated in FIG. 5A. The bias signal DC value optimization can be carried out with the bias signal AC amplitude set at or just slightly higher than its optimal level. When the provided DC bias is too low, the returned output pulses are limited to the earlier one or several pulse returns, as shown in FIG. 5B, provided the $X_{DC}$ samplers are staged in order (e.g., linearly), with those configured to have the lowest DC operating margins placed most proximally to the input/output end of the wrapper shown in FIG. 2A. By contrast, when the provided DC bias is too high 5D, the returned output pulses are only the last one or the last several in time, indicating that only the one or several $X_{DC}$ samplers most distal to the input/output end of the wrapper shown in FIG. 2A are operational, as shown in FIG. 5D. The provided DC bias 5C can be said to be optimal when the returned output pulses are only the temporally middle one or several, as shown in FIG. 5C, indicating that only the one or several middle $X_{DC}$ samplers are operational and therefore return output pulses, while the others do not. Although FIGS. 5B-5D illustrate an example in which $X_{DC}$ samplers are distributed in $X_{DC}$ dimension ascending order of their AC lower limits along the length of an RQL scan register wrapper like that of FIG. 2A, in other examples, an RQL scan register wrapper like that of FIG. 2A can be configured with $X_{DC}$ samplers arranged in other orders, including descending order or a known arrangement of no particular order, and the order can be accounted for accordingly when analyzing outputs of the RQL scan register wrapper to determine improved or optimal bias levels. In other examples in which wrapper output analysis involves counting the number of samplers active under a given bias condition, as when spreading of the sampler margins is accomplished by process variation alone, the order is unimportant and need not be accounted for in analysis of wrapper outputs to determine improved or optimized bias levels.

In various examples, a wrapper can be configured to include only $X_{AC}$ samplers, only $X_{DC}$ samplers, or some mix of different types of samplers. In some examples, the $X_{AC}$ or $X_{DC}$ margin offset staging can be reversed from the ascending order described above, such that high-margin samplers are located proximally on the wrapper ladder and low-margin samplers are located distally on the wrapper ladder, or the staging can take on some pattern other than ordered staging, with an accompanying change in the expected pulse output. The linear ordered low-to-high staging described above is provided only as one example for purposes of illustration. In any example, the location of a sampler as distal or proximal to the input/output end of a bias-level sensor wrapper is not the factor determinative of the bias-level adjustment/optimization significance of its corresponding output pulse; rather, the margin offset for which the sampler is configured is the factor that is determinative of the bias-level adjustment/optimization significance of the sampler's corresponding output pulse.

The one-dimensional scan procedure illustrated in FIGS. 5B-5D, varying only applied DC bias, leads to a more accurate assessment or calibration of an applied DC bias level after the one-dimensional scan procedure illustrated in FIGS. 4B-4D, varying only applied AC bias, is performed to first find an improved or optimal applied AC bias level Similarly, the one-dimensional scan procedure illustrated in FIGS. 4B-4D, varying only applied AC bias, leads to a more accurate assessment or calibration of an applied AC bias level after the one-dimensional scan procedure illustrated in FIGS. 5B-5D, varying only applied DC bias, is performed to first find an improved or optimal applied DC bias level. Thus, these two one-dimensional scan procedures can be performed iteratively and repeatedly to home in on improved or optimal values of both $X_{AC}$ and $X_{DC}$. The RQL scan registers 200, 260, 290 of FIGS. 2A-2C can be used, for example, with either or both of $X_{AC}$ samplers and $X_{DC}$ samplers as bias-level sensors 202-212 (or 262-272 or BLS) to provide an output indicative of the AC or DC bias level. When used to measure $X_{AC}$, any of the scan registers 200, 260, 290 produces a specific number of pulses when an optimal level has been reached. When used to measure $X_{DC}$, the result output by any of the scan registers 200, 260, 290 is indicative of the average position of the operationally-biased $X_{DC}$ samplers along the scan register. Each of the RQL scan registers 200, 260, 290 can provide a numerical result in some example modes of operation, or in other example modes of operation, the output can be indicative of bias levels in other ways. For example, the RQL scan registers 200, 260, 290 can permit examination of the output of a single bias level sensor arranged in the scan register, in order to find its improved or optimum bias point by varying applied AC and DC bias. In some examples, this procedure can be performed individually for a plurality, or for all, of the bias-level sensors arranged in the scan register. In some examples, this procedure can be performed for individual bias-level sensors located at various positions throughout a chip, which are not necessarily all elements of a single scan register, or of any scan register. In such examples, the average values of the individually measured improved or optimal applied AC and DC bias levels can then be computed and used as setpoints for the bias sources.

Different methods can be used to scan the $X_{DC}$-$X_{AC}$ space to find improved or optimum AC and DC applied bias levels. A first example scan method can include sampling at every $X_{DC}$-$X_{AC}$ point within a range to create a complete two-dimensional map of the $X_{DC}$-$X_{AC}$ space. A second example scan method can include limiting a scan to a discovered boundary of an operating region, in effect "walking" in and out of a perimeter of a margin shmoo plot in a zig-zag fashion, to determine the contours of the boundary or perimeter. This second example scan method can have time efficiency advantages over the complete $X_{DC}$-$X_{AC}$ space sampling of the first example scan method. A third example scan method can involve traversing the $X_{DC}$-$X_{AC}$ space in a spiral or conical scan. A fourth example scan method can implement a successive approximation method, such as is found in an analog-to-digital converter (ADC). A fifth example scan method can implement a delta-sigma algorithm. Other example scan methods can implement variations or combinations of the above methods to home in on improved or optimal applied AC and/or DC bias levels. In any of these examples, the chosen scan method can use a closed loop to find and stabilize the bias levels, irrespective of the type of scan(s) employed and configuration or placement on the chip of the bias-level sensors used in the scan method.

Samplers, such as bias-level sensors 202-212 in FIG. 2A, can have any of a number of different forms. In some examples, samplers are made of one or more JTLs or logic gates configured in series with each other, e.g., as a shift register, with at least one of the JTLs or logic gates in the shift register being specially configured so that it is sensitive to bias in different ways than other JTLs or logic gates in operational RQL circuitry 102. FIG. 6 shows an example sampler stage 600 having sampler JTL 602 coupled to sampler bias tap 604, configured for use in a bias-level sensor, such as any of bias-level sensors 202-212 in FIG. 2A. An SFQ-based sample signal provided at sampler JTL input terminal ai may transmit (i.e., propagate) to sampler JTL output terminal qo when sampler JTL 602 is operational. The operability of sampler JTL 602 depends at least upon sampler JTL 602 being biased within its operating margins. Biasing is provided to sampler JTL 602 via bias lines 606, which in the illustrated example include bias lines 614, 616, 618. Sampler JTL 602 is inductively coupled to bias lines 606 via sampler tap 604. In the example illustrated in FIG. 6, sampler tap 604 includes DC coupling transformer 608 for inductively coupling the sampler JTL 602 to a DC bias line 614, I-clock coupling transformer 610 for inductively coupling the sampler JTL 602 to an I-clock bias line 616, and Q-clock coupling transformer 612 for inductively coupling the sampler JTL 602 to a Q-clock bias line 618. The following table relates normalized mutual inductance to tap phase in the sampler tap 204, thus showing how the normalized AC mutual inductances $M_I$, $M_Q$ can be modified to provide a sampler JTL 602 with biasing of different clock phases. The normalized MDC can vary (from 1) for $X_{DC}$ samplers.

TABLE 1

Normalized mutual inductance versus tap phase.

| | | Tap phase | | | | | | | |
|---|---|---|---|---|---|---|---|---|---|
| | | 0° | 45° | 90° | 135° | 180° | 225° | 270° | 315° |
| Mutual inductor | $M_I$ | 1 | 1/√2 | 0 | −1/√2 | −1 | −1/√2 | 0 | 1/√2 |
| | $M_Q$ | 0 | 1/√2 | 1 | 1/√2 | 0 | −1/√2 | −1 | −1/√2 |
| | $M_{DC}$ | 1 | 1 | 1 | 1 | 1 | 1 | 1 | 1 |

In contrast to JTLs or gates that may be found in operational RQL circuitry 102, sampler JTL 602 is fed by sampler bias tap 604 through a larger self-inductance, which in some examples can be provided by an enlargement of bias inductor $L_2$, or in other examples can equivalently be provided by inclusion of AC offset inductor $L_{offsetAC}$ between sampler JTL 602 and tap 604, as shown in FIG. 6. In this latter example, sampler JTL 602, which is defined to exclude AC offset inductor $L_{offsetAC}$, can otherwise be identical to standard-bias JTLs used in operational RQL circuitry 102. As compared to JTLs that may be found in operational RQL circuitry 102, the DC bias transformer 608 of the bias tap 604 can in some examples also be configured with a larger or smaller mutual inductance MDC by which the sampler JTL 602 is coupled to DC bias line 614. The enlargement of bias inductor $L_2$ or the inclusion of AC offset inductor $L_{offsetAC}$ to provide greater self-inductance of sampler stage 600 can provide the offsets illustrated in FIG. 4A, in which the margin shmoo plot is vertically shifted upward in the $X_{DC}$—$X_{AC}$ space with respect to the nominal margins 302. In some examples, AC offset inductor $L_{offsetAC}$ can be omitted and bias inductor $L_2$ can be made smaller than normal (smaller than in a JTL in operational RQL circuitry 102) to achieve opposite-direction offsets (not illustrated), in which the operating margin shmoo plot of a bias-level sensor is effectively shifted down (in the $X_{AC}$ dimension) from the nominal operating margins 302. Bias inductor $L_2$ and, where present, AC offset inductor $L_{offsetAC}$ can, for example, be provided by an inductive network.

In example bias-level sensors having a reduced AC response, AC offset inductor $L_{offsetAC}$ in sampler stage 600 can, for example, be about 1.5 times the self-inductance of the sampler tap 604. This self-inductance value of AC offset inductor $L_{offsetAC}$ can have the effect of placing the bottom corner of the corresponding sampler's schmoo plot at about the $X_{AC}$-dimension midpoint of the schmoo plot 302 of operational RQL circuitry 102. As an example, AC offset inductor $L_{offsetAC}$ in sampler stage 600 can be about 29.25 pH, or can provide about 1.5 times the self-inductance of sampler tap 604, which can be, for example, about 19.3 pH. In an example in which instances of bias-level sensors having sampler stage 600 are implemented as bias-level sensors 202-212 in the context of the wrapper shown in FIG. 2A, such that the bias-level sensors are functional for relatively low values of $X_{AC}$, the bias-level sensors may respond to high AC bias levels by outputting a steady stream of RQL-encoded logical "1"s (positive SFQ pulses followed by negative SFQ pulses), flipping every AC clock cycle. The corresponding suppression logic 240-250 prevents this steady stream of RQL-encoded logical "1"s by generating a stream of RQL-encoded logical "0"s (no SFQ pulses) in response. The sensing of the lower limit of the bias-level sensor margin shmoo plot can be used to calibrate AC bias amplitude parameters, and thus to stabilize an RQL clock, in an operating RQL system, as described above with regard to FIGS. 4A-4D.

In example bias-level sensors having margin shmoo plots shifted to higher $X_{AC}$ values, AC offset inductor $L_{offsetAC}$ in a bias-level sensor sampler stage 600 can, for example, be between about 0.5 and 10 times the nominal tap self-inductance value, e.g., the tap self-inductance value for JTLs or gates used in operational RQL circuitry 102. For example, AC offset inductor $L_{offsetAC}$ in a bias-level sensor sampler stage 600 can be about 1.5 times the size of the tap self-inductance for JTLs and gates used in operational RQL circuitry 102. As an example, if the nominal self-inductance value for a bias tap supplying a JTL or gate used in operational RQL circuitry 102 is about 19.3 pH, the inductance value for the AC offset inductor $L_{offsetAC}$ in bias level sensor sampler stage 600 in FIG. 6 can be between about 9.65 pH and about 193 pH, e.g., between about 40 pH and about 50 pH, e.g., about 29.0 pH. In an example in which bias-level sensors that include instances of sampler stage 600 are implemented as bias-level sensors 202-212 in the context of the wrapper shown in FIG. 2A, such that the bias-level sensors are function for relatively high values of $X_{AC}$, the bias-level sensors may respond to low AC bias levels by outputting a steady stream of RQL-encoded logical "1"s (positive SFQ pulses followed by negative SFQ pulses), flipping every AC clock cycle. The corresponding suppression logic 240-250 prevents this steady stream of RQL-encoded logical "1"s by generating a stream of RQL-encoded logical "0"s (no SFQ pulses) in response. Thus the upper edge of the bias-level sensor margin shmoo plot can be sensed without filling the RQL shift register wrapper output with a steady stream of "1"s. The sensing of the upper edge of the bias-level sensor margin shmoo plot may not be needed to calibrate AC bias amplitude parameters in an operating RQL system; it can, in some examples, be used as a diagnostic tool.

FIG. 6 provides an example in which a JTL 602 is used as the sample signal transmission device. Other example sampler stages, not illustrated, can be like sampler stage 600 of FIG. 6 but with an RQL gate as the sample signal transmission device in place of the sampler JTL 602. The RQL gate, biased with the modified biasing of a sampler tap like sampler tap 604 with desired mutual inductances $M_Q$, $M_I$ to AC bias lines to provide a desired clock phase, and mutual inductance to DC bias lines to provide an $X_{DC}$ offset where desired. The RQL gate can, in some examples, further be provided with an AC offset inductor like $L_{offsetAC}$ in FIG. 6 to raise the shmoo plot (operating region) to higher level of $X_{AC}$. The RQL gate would, like the sampler JTL 602, operate within its modified operating margins and fail (would produce unexpected output or no output) outside of its modified operating margins.

Figure 7:
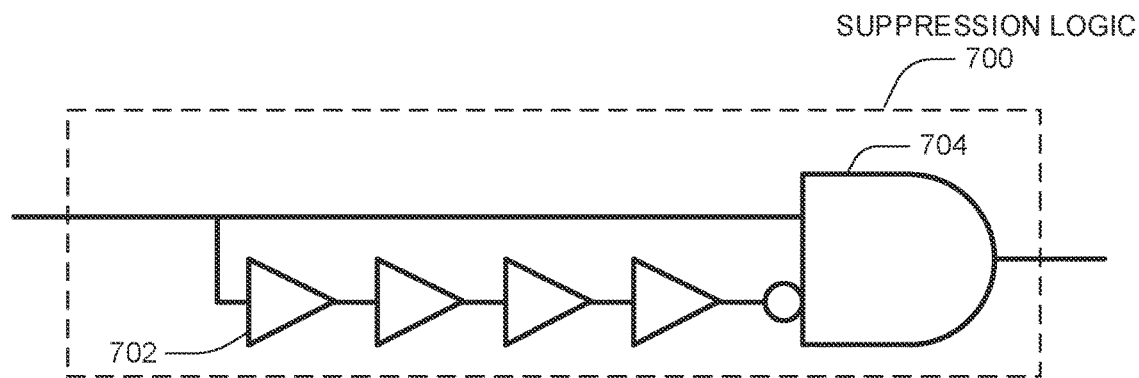
FIG. 7 is a block diagram of example suppression logic such as shown in FIG. 2A.

FIG. 7 shows example suppression logic 700 such as may be used to implement any instance of suppression logic 240-250 in FIG. 2A. Suppression logic 700 includes a first superconducting path to a noninverting input of an RQL A-NOT-B gate 704 (a two-input AND gate with a single inverting input) and a second path through a number (e.g., four) JTLs 702 to create a one-cycle delay to the inverting input of the A-NOT-B gate. When bias to a sampler is too high, the sampler can be caused to "spin" (generate a steady stream of logical "1" outputs) that can disable the RQL scan register wrapper of FIG. 2A. Suppression logic 700 prevents such spinning (repeat triggering). The A-NOT-B gate 704 passes the first logical "1" out of the sampler, but not subsequent "1"s from a sampler producing a stream of reciprocal SFQ pulses due to a defect or over-bias. In some examples, suppression logic 700 can be omitted. Excess AC bias amplitude will spin standard logic in the read-out register approximately 2 dB before it spins samplers whose lower limit ($X_{ACmin}$) has been elevated to a higher-than-standard $X_{AC}$ level. Moreover, a suppression logic circuit may itself be defective and start spinning, for example, because of use of an RQL A-NOT-B gate 704 that has narrow operating margins.

Some examples can use multiple instances of sampler stage 600 arranged in series, as a shift register, to provide a bias-level sensor. Because a single JTL receives a substantial portion of its operating flux from the cell driving it and from the cell it drives, it can be necessary to place several sensing JTLs 600 (having similarly shifted bias margins) in series before the true effect of the bias shift is manifest in the output of the shift register that constitutes the bias-level sensor. As an example, four or more sensing JTLs in series can be sufficient to make the sensing elements operate independently of the JTLs that precede and follow them.

Figure 8:
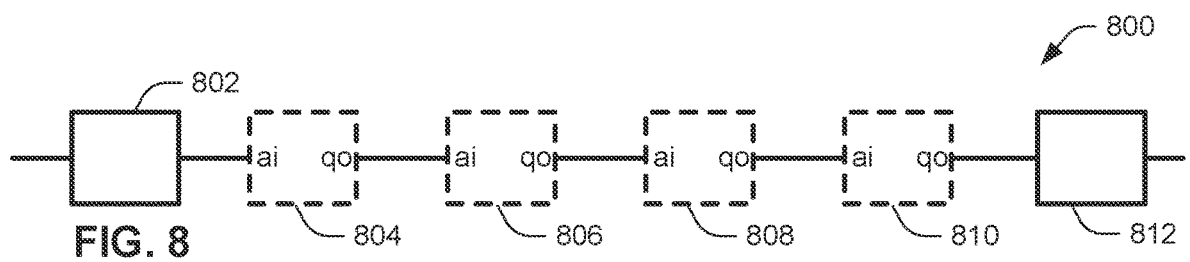
FIG. 8 is a block diagram of an example shift register, including four instances of the example sampler stage of FIG. 6, that can be used as bias-level sensor as in FIG. 2A.
Figure 9:
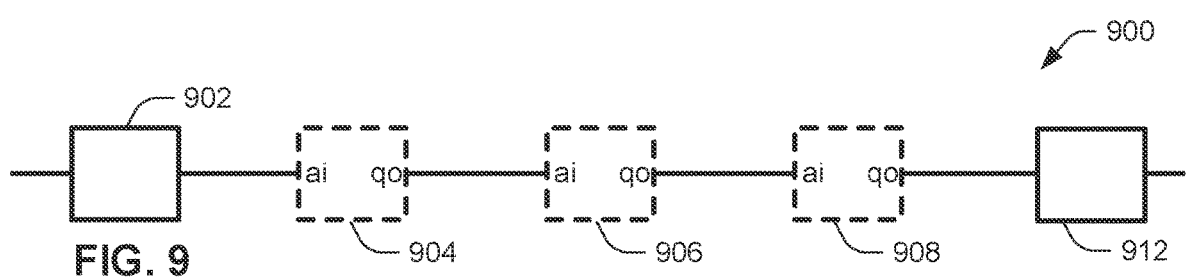
FIG. 9 is a block diagram of an example shift register, including three instances of the example sampler stage of FIG. 6, that can be used as bias-level sensor as in FIG. 2A.
Figures 10, 11:
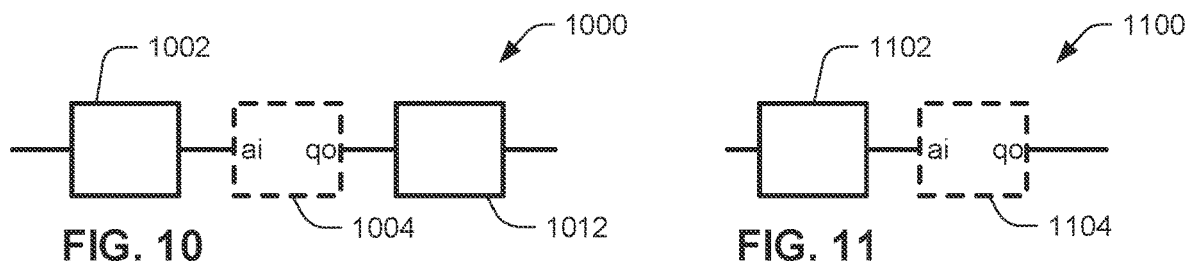
FIG. 10 is a block diagram of an example shift register, including one instance of the example sampler stage of FIG. 6, that can be used as bias-level sensor as in FIG. 2A.
FIG. 11 is a block diagram of an example shift register, including one instance of the example sampler stage of FIG. 6, that can be used as bias-level sensor as in FIG. 2A.

FIG. 8 shows an example shift register 800 configured as a bias-level sensor, including four instances 804, 806, 808, 810 of the example sampler stage 600 of FIG. 6. Shift register 800 can further include input stage 802 and output stage 812, each of which can be implemented as one or more JTLs and/or logic gates provided with standard biases (e.g., that do not have the self-inductance and/or mutual inductance modifications of the sampler stage 600 of FIG. 6). FIG. 9 shows an example shift register 900, including three instances 904, 906, 908 of the example sampler stage 600 of FIG. 6. Shift register 900 can further include input stage 902 and output stage 912, each of which can be implemented as one or more JTLs and/or logic gates provided with standard biases (e.g., that do not have the self-inductance and/or mutual inductance modifications of the sampler stage 600 of FIG. 6). FIG. 10 shows an example shift register 1000, including one instance 1004 of the example sampler stage 600 of FIG. 6. Shift register 1000 can further include input stage 1002 and output stage 1012, each of which can be implemented as one or more JTLs and/or logic gates provided with standard biases (e.g., that do not have the self-inductance and/or mutual inductance modifications of the sampler stage 600 of FIG. 6). FIG. 11 shows an example shift register 1100, including one instance 1104 of the example sampler stage 600 of FIG. 6. Shift register 1100 can further include input stage 1102, which can be implemented as one or more JTLs and/or logic gates provided with standard biases (e.g., that do not have the self-inductance and/or mutual inductance modifications of the sampler stage 600 of FIG. 6). As examples, any of shift registers 800, 900, 1000, or 1100 can be implemented as any of the bias-level sensors 202, 204, 206, 208, 210, 212 in FIG. 2A, as any of the bias-level sensors 262, 264, 266, 268, 270, 272 in FIG. 2B, or as any of the bias-level sensors BLS in FIG. 2C.

Figure 12:
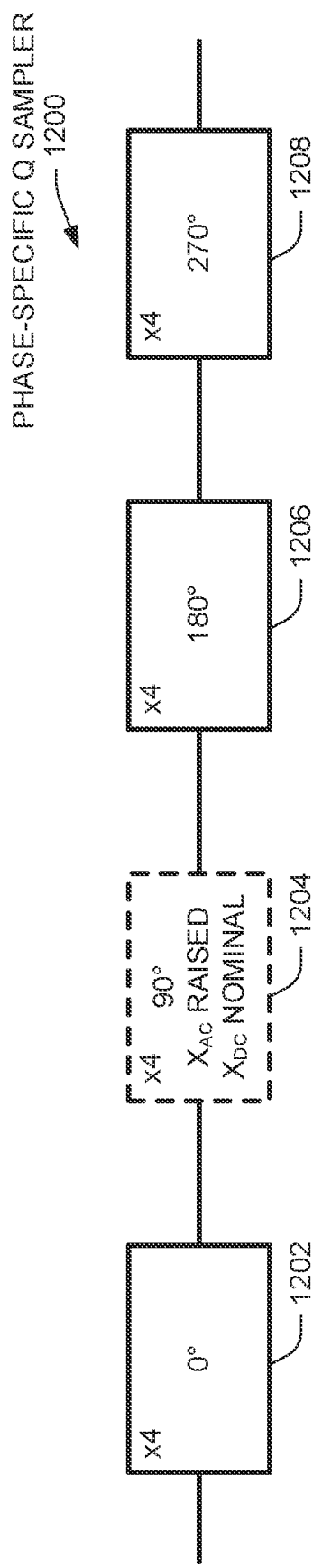
FIG. 12 is a block diagram of an example phase-specific bias-level sensor for a Q clock.
Figure 13:
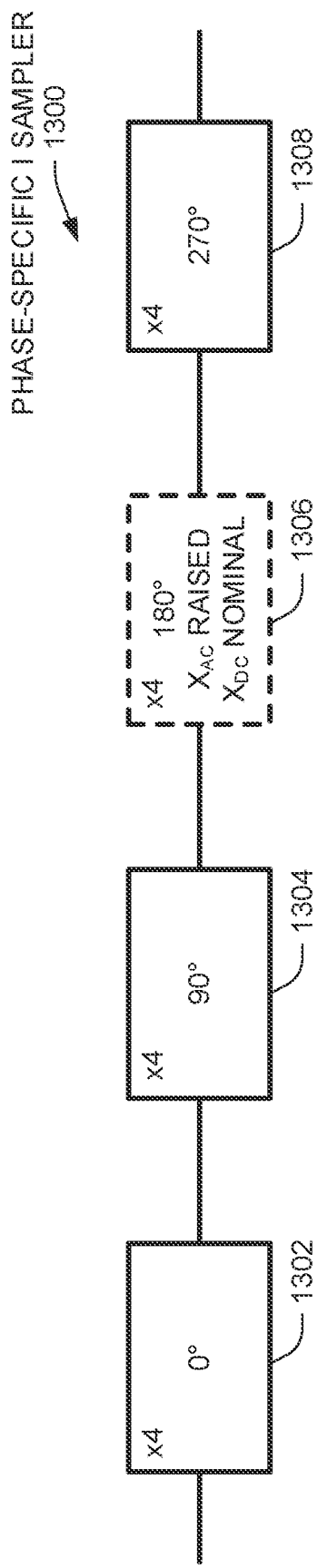
FIG. 13 is a block diagram of an example phase-specific bias-level sensor for an I clock.

FIG. 12 shows an example phase-specific bias-level sensor 1200 for a Q clock. Phase-specific Q sampler 1200 of FIG. 12 thus provides a sampler that responds to variations in Q clock amplitude while not responding to variations in I clock amplitude. FIG. 13 shows an example phase-specific bias-level sampler 1300 for an I clock. Phase-specific I sampler 1300 of FIG. 13 thus provides a sampler that responds to variations in I clock amplitude while not responding to variations in Q clock amplitude. Samplers 1200, 1300 thus allow for independent adjustment of I and Q clock AC amplitudes. FIGS. 14 and 15 explain sensing symbols used in FIGS. 12, 13, 16, and 18.

In the phase-specific Q sampler 1200 of FIG. 12, four quad ("x4") sampler stages 1202, 1204, 1206, 1208 are placed in series with each other and each of the four quad sampler stages 1202, 1204, 1206, 1208 is biased by a different-phase RQL clock signal. The first quad sampler stage 1202 comprises an arrangement of four JTLs and/or logic gates provided with standard biases that do not have the self-inductance and/or mutual inductance modifications of the sampler stage 600 of FIG. 6. An expansion of such a standard-bias quad sampler stage is shown as standard-bias JTL and/or gate series 1400 in FIG. 14. First quad sampler stage 1202 is biased by a 0° clock. The second quad sampler stage 1204 comprises an arrangement of four JTLs and/or logic gates provided with modified AC biases that do have the self-inductance and/or mutual inductance modifications of the sampler stage 600 of FIG. 6. An expansion of such a modified-bias quad sampler stage is shown as modified-bias JTL and/or gate series 1500 in FIG. 15. Second quad sampler stage 1204 is biased by a 90° clock (a clock for which the AC waveform is shifted by 90° with respect to the AC waveform of the 0° clock). The third quad sampler stage 1206 is a quad standard-bias sampler stage 1400 biased by a 180° clock. The fourth quad sampler stage 1208 is a quad standard-bias sampler stage 1400 biased by a 270° clock. The 0° and 180° clocks can be sourced from an I clock resonator, and the 90° and 270° clocks can be sourced from a Q clock resonator, as described in Table 1, above. Although sampler stages 1202, 1204, 1206, 1208 are shown in the illustrated example arrangement 1200 as quad sampler stages, having four series JTLs and/or logic gates each, the number of JTLs and/or logic gates in each sampler stage can be larger or smaller in other examples. The number of JTLs and/or logic gates in each sampler stage can be determined as a design parameter. In an example (not shown), sampler stage 1204 has four or more series JTLs and/or logic gates to prevent current-sharing influence from sampler stages 1202, 1206, and sampler stages 1202, 1206, 1208 are composed of fewer than four series JTLs and/or logic gates.

In the phase-specific I sampler 1300 of FIG. 13, four quad sampler stages 1302, 1304, 1306, 1308 are placed in series with each other, and each of the four quad sampler stages 1302, 1304, 1306, 1308 is biased by a different phase RQL clock signal. The first quad sampler stage 1302 is a quad standard-bias sampler stage 1400 biased by a 0° clock. The second quad sampler stage arrangement 1304 is a quad standard-bias sampler stage 1400 biased by a 90° clock. The third quad sampler stage 1306 is a quad modified-bias sampler stage 1500 biased by a 180° clock. The fourth quad sampler stage 1308 is a quad standard-bias sampler stage 1400 biased by a 270° clock. Although sampler stages 1302, 1304, 1306, 1308 are shown in the illustrated example arrangement 1300 as quad sampler stages, having four series JTLs and/or logic gates each, the number of JTLs and/or logic gates in each sampler stage can be larger or smaller in other examples. The number of JTLs and/or logic gates in each sampler stage can be determined as a design parameter. In an example (not shown), sampler stage 1306 has four or more series JTLs and/or logic gates to prevent current-sharing influence from sampler stages 1304, 1308, and sampler stages 1302, 1304, 1308 are each composed of fewer than four series JTLs and/or logic gates.

In the expansion 1400 of the quad standard-bias sampler stage shown in FIG. 14, each individual component stage 1402, 1404, 1406, 1408 of each sampler stage 1202, 1206, 1208, 1302, 1304, 1308 includes a JTL or gate with a bias-tap self-inductance of a standard value, that is, of the same value used to supply JTLs and gates in operational RQL circuitry 102 (e.g., with no AC offset inductances $L_{offsetAC}$). The JTL or gate of each individual component stage 1402, 1404, 1406, 1408 is biased with an AC clock signal of the same phase ("PHASE°").

In the expansion 1500 of the quad modified-bias sampler stage shown in FIG. 15, each individual component stage 1502, 1504, 1506, 1508 of each sampler stage 1204, 1306 includes a JTL or gate that is supplied bias via an AC offset inductor $L_{offsetAC}$ inserted between the JTL or gate and its respective bias tap (or, equivalently, an enlarged bias tap inductor $L_2$) that provides bias self-inductance larger than that in JTLs and gates in operational RQL circuitry 102. Thus, each individual component stage 1502, 1504, 1506, 1508 has a raised margin shmoo plot in the $X_{DC}$-$X_{AC}$ space as compared to JTLs or gates in operational RQL circuitry 102. The JTL or gate of each individual component stage 1502, 1504, 1506, 1508 is biased with an AC clock signal of the same phase ("PHASE°").

Because of the tendency of flux to be shared between driven and driving JTLs or logic gates, a single JTL or logic gate operating at 90° clock phase behind the one driving it and 90° clock phase ahead of the JTL or logic gate that it drives may not provide an accurate measurement of the amplitude of the clock of a particular phase that is biasing it. However, with four or more individual component stages biased by a clock signal of the phase to be sampled (e.g., sampler stages 1502, 1504, 1506, 1508, or 1402, 1404, 1406, 1408), flux sharing can be effectively confined to the first and last JTL or logic gate, leaving remaining JTLs and/or logic gates largely uninfluenced by flux sharing. The phase to be sensed can thus be accurately measured. In phase-specific samplers 1200, 1300 shown in FIGS. 12 and 13, series arrangements 1204, 1306 of individual component stages 1502, 1504, 1506, 1506 are biased through weakened bias taps, e.g., with AC offset inductor $L_{offsetAC}$ present to provide an elevated $X_{AC}$ lower limit, while series arrangements 1202, 1206, 1208, 1302, 1304, 1308 of individual component stages 1402, 1404, 1406, 1408 have standard bias taps to form supporting infrastructure. The individual component stages 1502, 1504, 1506, 1508 of sensing sampler stages 1204 or 1306 respond independently to either I or Q clock bias. For I/Q phase angles near the nominal 90°, phase sensitivities of I and Q weak-tapped JTLs or gates have opposite slopes.

Figure 16:
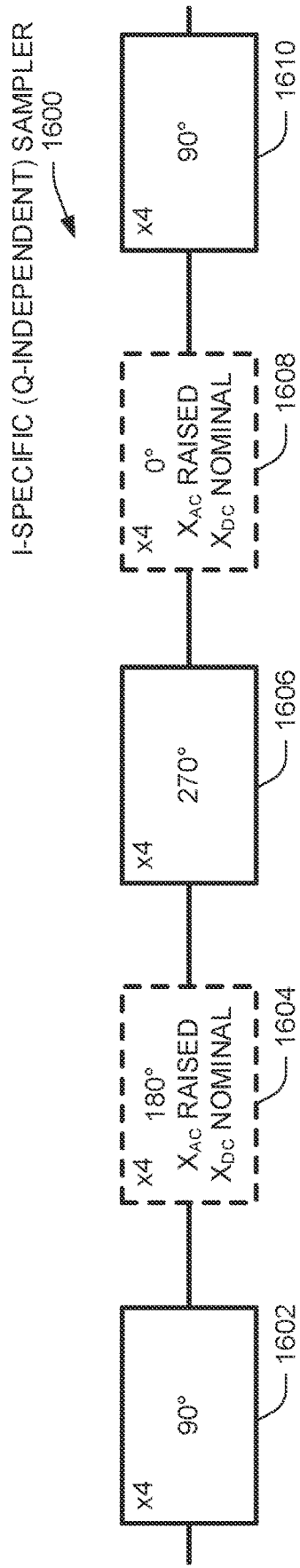
FIG. 16 is a block diagram of an example I clock-specific (Q clock-independent) bias-level sensor.

FIG. 16 shows an example I clock-specific (Q clock-independent) bias-level sensor 1600. The standard-bias quad sampler stages 1602, 1606, and 1610 are as expanded in FIG. 14 and the modified-bias quad sampler stages 1604 and 1608 are as expanded in FIG. 15. Example sampler 1600 thus contains twenty JTLs and/or gates in series with each other. In the example I clock-specific (Q clock-independent) bias-level sensor 1600, the $X_{AC}$ operating margins of the sensing sampler stages provided with 0° and 180° clocks (the sensing JTLs and/or gates in quad arrangements 1604, 1608) are shifted up in the $X_{DC}$-$X_{AC}$ space, e.g., by inserting AC offset inductors $L_{offsetAC}$ of 1.5 times the nominal tap self-inductance (e.g., 1.5×19.3 pH). Only in these sensing JTLs or gates is the I clock AC amplitude varied during the margin-sweep optimization procedure by which an optimum AC bias level is determined for I clock signals. By contrast, AC offset inductance $L_{offsetAC}$ equals 0 (AC offset inductor $L_{offsetAC}$ is absent) in the sampler stages 1602, 1606, and 1610, such that the $X_{AC}$ margins of the sampler stage JTLs and/or gates in sampler stages 1602, 1606, 1610 are the same as of JTLs and gates in the operating circuitry 102. The Q clock amplitude supplied to quad sampler stages 1602, 1606, and 1610 remains fixed during the margin-sweep optimization procedure (while sweeping the AC amplitude of the I clock supplied to sampling JTLs or gates in quad sampler stages 1604 and 1608).

Figure 17:
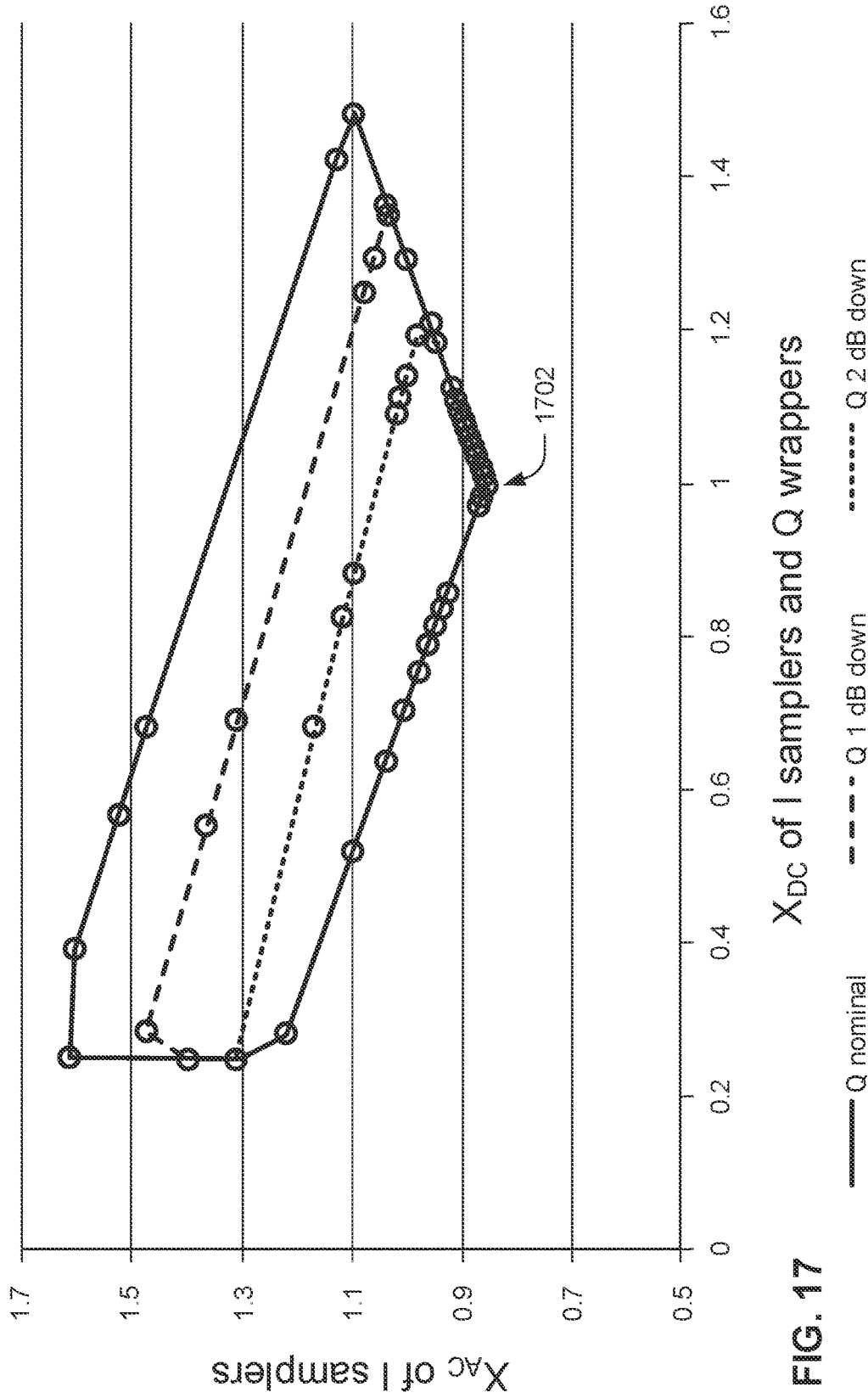
FIG. 17 is a graph of example AC and DC bias margin shmoo plots for the I-clock-specific (Q-clock-independent) bias-level sensors of FIGS. 16 and 18.

The graph of FIG. 17 shows example AC and DC bias margin shmoo plots for the I-clock-specific (Q-clock-independent) bias-level sensor 1600 of FIG. 16. When operated with various $X_{AC}$ bias levels (nominal, 1 dB below nominal, 2 dB below nominal) for the JTLs running on the Q clock, the effect on the margin shmoo plot of the I-specific sampler 1600 can be observed as the different plotted curves of FIG. 17. The lower limit 1702 of the margin shmoo plots of the I sampler 1600 remains constant over variations in Q bias (is unaffected by the strength of a clock signal applied to Q wrappers), verifying that the I bias level can be measured independent of variations in Q bias levels.

Figure 18:
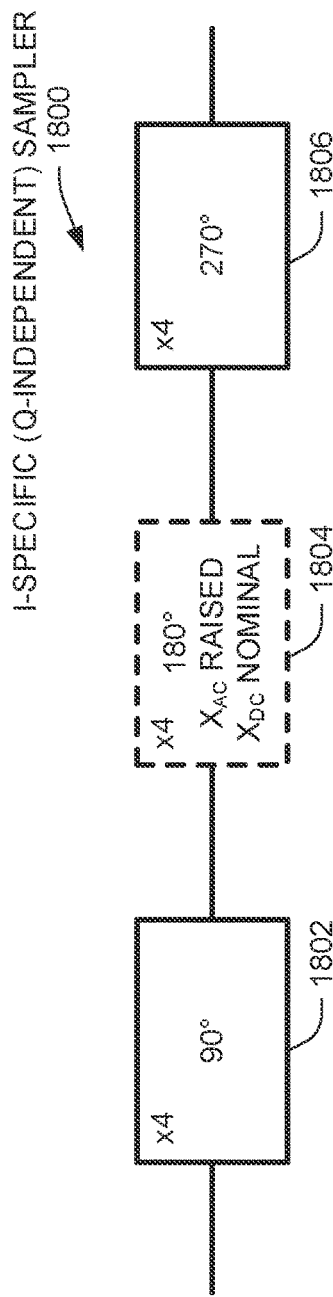
FIG. 18 is a block diagram of another example I clock-specific (Q clock-independent) bias-level sensor.

FIG. 18 shows another example I clock-specific (Q clock-independent) bias-level sensor. The standard-bias quad sampler stages 1802, 1806 are as expanded in FIG. 14 and the modified-bias quad sampler stage 1804 is as expanded in FIG. 15. In the example I clock-specific (Q clock-independent) bias-level sensor 1800, the margin shmoo plots of the sampler stages provided with the 180° clock (the sampler stages in quad arrangement 1804) are shifted up in the $X_{DC}$-$X_{AC}$ space, e.g., by inserting AC offset inductor $L_{offsetAC}$ having a value of 1.5 times nominal tap self-inductance (e.g., 1.5×19.3 pH). No AC offset inductor is used in the standard-bias sampler stages 1802 and 1806 (as with JTLs and gates in the operating circuitry 102). Sampler 1800 represents a structural simplification of sampler 1600 that does not incur loss of performance. Sampler 1800 has a margin shmoo plot similar to sampler 1600, as shown in FIG. 17. In contrast to sampler 1600, sampler 1800 uses only the 180° phase clock, and not the 0° phase clock, to define the $X_{AC}$ lower limit 1702 shown in FIG. 17. The lower limit 1702 of the margin shmoo plots of the I sampler 1800 remains constant over variations in Q bias, verifying that the I bias level can be measured independent of variations in Q bias levels.

A challenge of RQL circuitry is that I and Q clock signals 112, 114 generated to be in quadrature at 90° apart as measured at the signal generator 110 in the warm space may not be 90° apart from each other at the level of the RQL IC 106 in the cold space due to components in clock resonator networks 104 that introduce unwanted phase shifts. Offsets, from 90°, in phase difference between I and Q clock signals at the level of the RQL IC 106 can cause operational issues, including reduced operating margins, in operational RQL circuitry 102. Circuitry described herein can provide an indirect measurement of phase error through measurement of the effects on the operation of samplers for different clock phase differences by effectively turning a phase variation into an amplitude variation.

Figure 19:
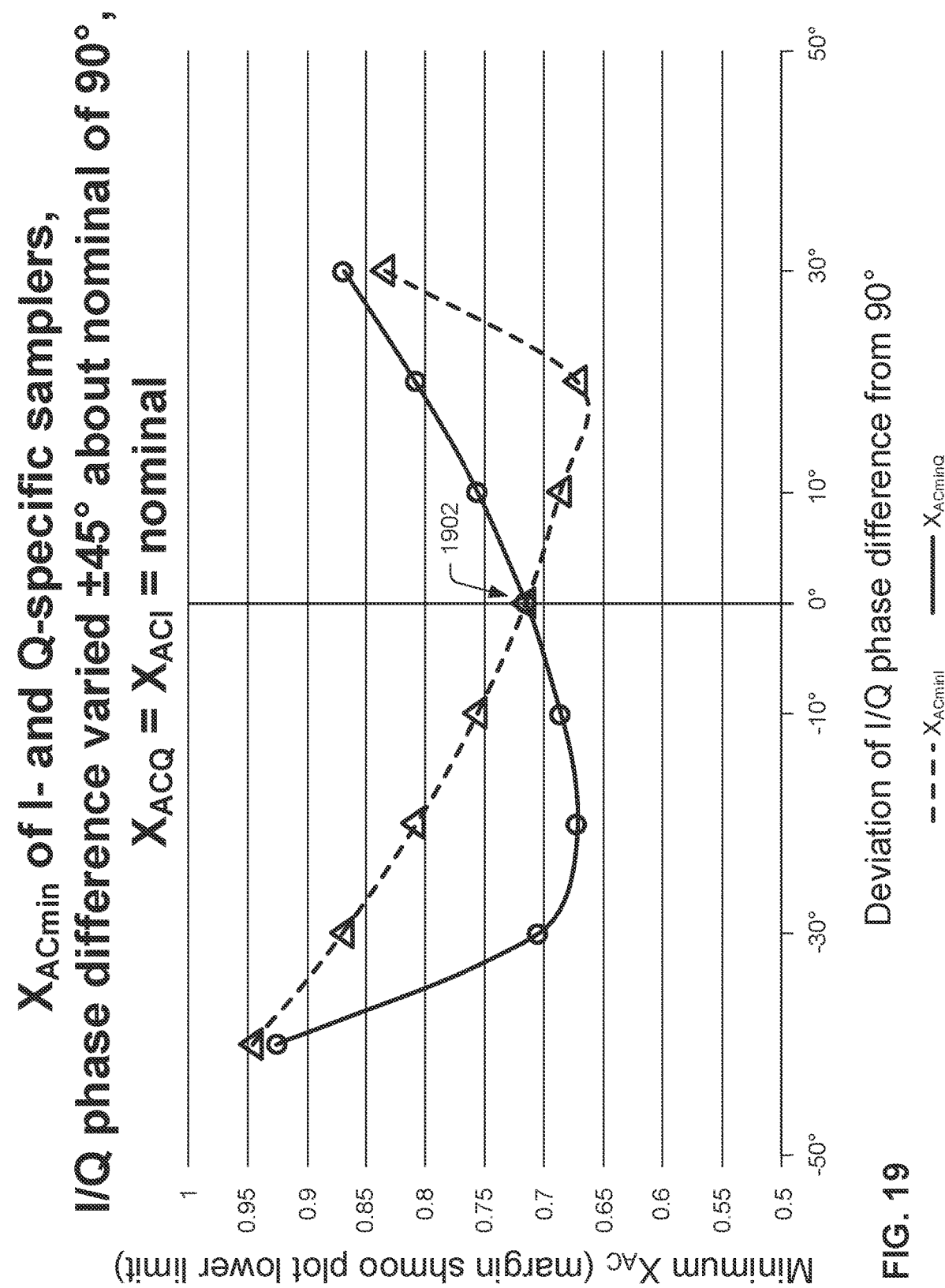
FIG. 19 is a graph of example minimum operative AC bias for I clock-specific and Q clock-specific bias-level sensors as a function of deviation of Q clock phase from 90°.

As well as being sensitive to the I and Q clock amplitudes, the phase-specific samplers 1200, 1300, 1600 and 1800 of FIGS. 12, 13, 16, and 18 are also sensitive to the difference in phase between I and Q clocks. The minimum $X_{AC}$ for I and Q phase-specific samplers is equal when the difference in phase between the I and Q clocks, within the RQL IC 106, is 90°. Thus, the I and Q phase-specific samplers 1200, 1300, 1600 and 1800 can be used to determine the optimal phase difference between the I and Q clocks, as generated at the source 110, needed to obtain an exactly 90° phase difference between the I and Q clocks within the RQL IC 106. The graph of FIG. 19 shows example minimum operative AC bias for I clock-specific and Q clock-specific bias-level sensors as a function of deviation of Q clock phase from 90° ($X_{AC}$ at the margin shmoo plot lower limit for I-specific and Q-specific samplers). For the samplers used to produce the graph of FIG. 19, the AC offset inductance $L_{offsetAC}$ of the I and Q sensing JTLs or gates is 1.5 times the nominal tap self-inductance (the tap self-inductance used for JTLs or gates in operational RQL circuitry 102). The phase difference between the I and Q clocks is varied ±45° about a nominal value of 90°. The horizontal axis of the graph of FIG. 19 is the deviation from 90° of the interclock phase difference. $X_{ACmin}$ is equal 1902 for both I and Q sensing JTLs or gates when the I/Q phase difference is 90°.

Figure 20:
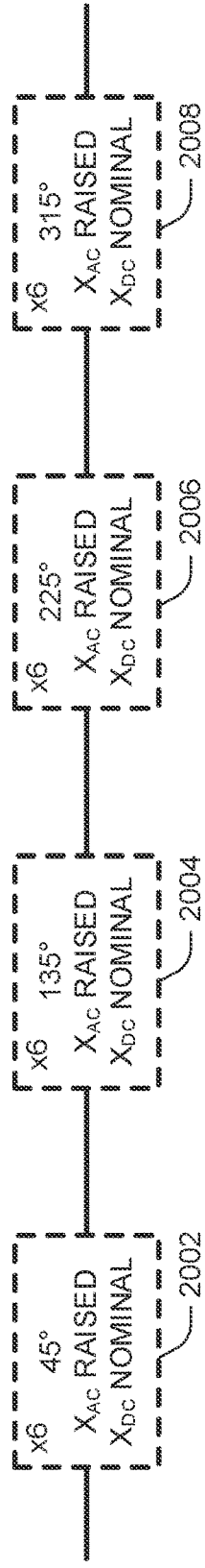
FIG. 20 is a block diagram of an example phase sampler.
Figure 21:
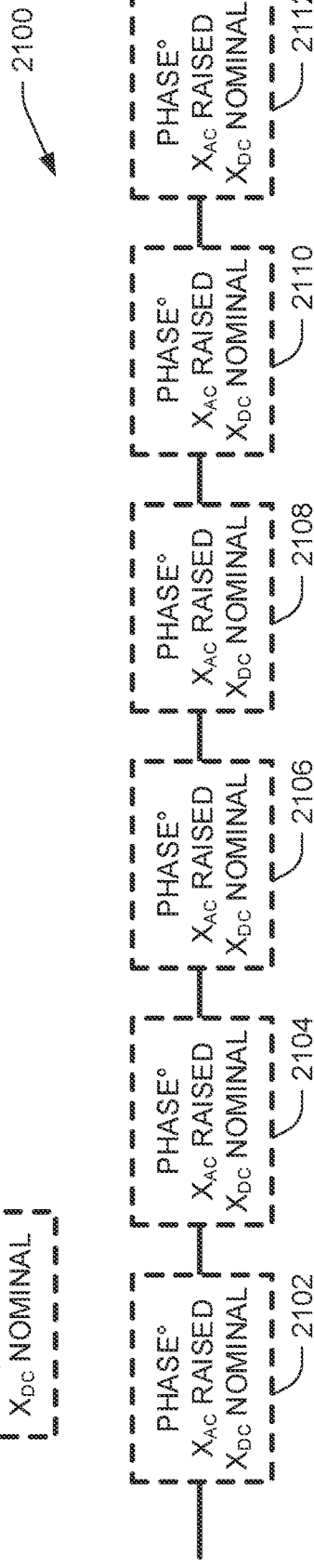
FIG. 21 is a block diagram explaining symbols used in FIG. 20.

FIG. 20 shows a 45° shift register 2000, comprising JTLs or logic gates supplied with clocks at 45°, 135°, 225°, 315°, that can be used as a phase sampler, also referred to herein as an $X_{phase}$ sampler. The $X_{phase}$ sampler is capable of indirectly detecting phase difference between two AC clocks (e.g., between I and Q clocks). In the phase sampler 2000 of FIG. 20, four hex sampler stages 2002, 2004, 2006, 2008 are placed in series with each other and each of the four hex sampler stages 2002, 2004, 2006, 2008 is biased by a different-phase clock signal that can be produced, for example, as a combination of other clock signals (e.g., as shown above in Table 1). FIG. 21 shows the expansion of the hex sampler stage symbol used for each of the hex sampler stages 2002, 2004, 2006, 2008 in FIG. 20. The first hex sampler stage 2002 is biased by a 45° clock. The second hex sampler stage 2004 is biased by a 135° clock. The third hex sampler stage 2006 is biased by a 225° clock. The fourth hex sampler stage 2008 is biased by a 315° clock. Combination clock waveforms providing clocks of 45°, 135°, 225°, or 315° phase can be provided by transformer-coupling to both I (0° or 180°) and Q (90° or 270°) clock resonators (as shown above in Table 1). Use of the $X_{phase}$ sampler 2000 of FIG. 20 to directly measure phase error between I and Q clock signals can include first equalizing I clock and Q clock signal amplitudes with separate sensors, for example, an I-independent clock amplitude sensor, such as the phase-specific I sampler 1300 of FIG. 13, and a Q-independent clock amplitude sensor, such as the phase-specific Q sampler 1200 of FIG. 12.

In the expansion 2100 of each of the hex sampler stages 2002, 2004, 2006, 2008 in FIG. 21, each individual component stage 2102, 2104, 2106, 2108, 2110, 2112 of each sampler stage 2002, 2004, 2006, 2008 includes a JTL or gate that is supplied bias via an AC offset inductor $L_{offsetAC}$ inserted between the JTL or gate and its respective bias tap (or, equivalently, an enlarged bias tap inductor $L_2$) that provides bias self-inductance larger than that in JTLs and gates in operational RQL circuitry 102. Thus, each sampler stage 2102, 2104, 2106, 2108, 2110, 2112 has a raised margin shmoo plot in the $X_{DC}$-$X_{AC}$ space as compared to JTLs or gates in operational RQL circuitry 102. The JTL or gate of each sampler stage 2102, 2104, 2106, 2108, 2110, 2112 is biased with an AC clock signal of the same phase ("PHASE°"). As described above, concatenating several sampler stages all biased with the same AC clock phase mitigates the effect of current (or, alternatively, flux) shared between adjacent JTLs biased by clock signals of different clock phases. The specific number of sensing JTLs needed to provide this insensitivity depends upon details of the JTLs and/or gates and their respective bias taps. In some examples, concatenating between four and six sampler stages can be adequate to provide the desired flux sharing mitigation. Although FIG. 20 illustrates an example of a phase sampler 2000 having six same-clock-phase-driven sampler stages per set 2002, 2004, 2006, 2008, that is, in which each sampler stage 2002, 2004, 2006, 2008 includes a set of six same-clock-phase-driven sampler stages coupled directly to each other in series, other examples can have more or fewer same-clock-phase-driven samplers stages coupled directly to each other in series, e.g., four, five, or seven same-clock-phase-driven JTLs or gates coupled directly to each other in series in each set, or varying numbers of same-clock-phase-driven JTLs or gates coupled directly to each other in series in the different sets.

Figure 22:
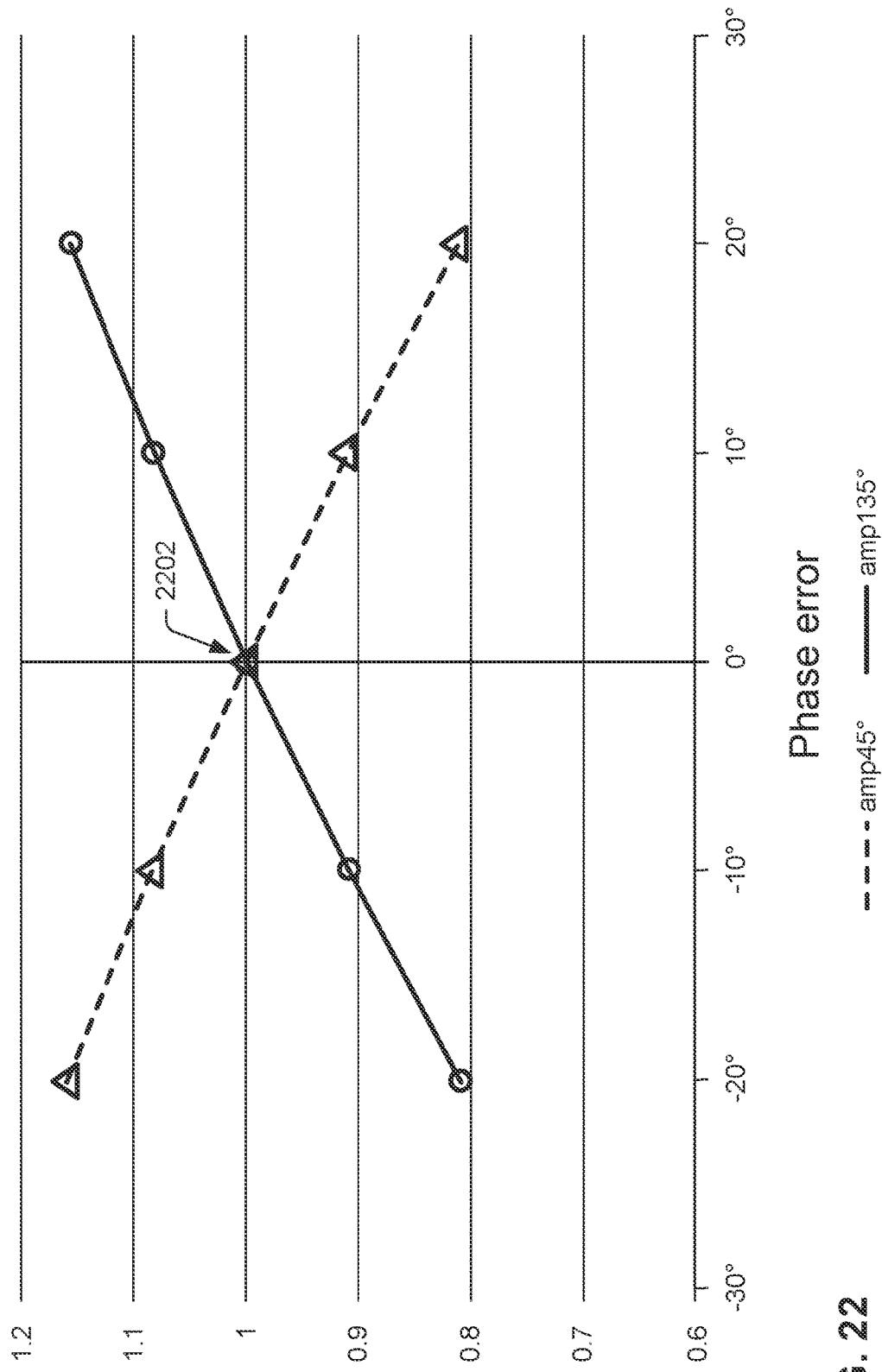
FIG. 22 is a graph showing example clock amplitude versus phase error for the example phase sampler of FIG. 20.
Figure 23:
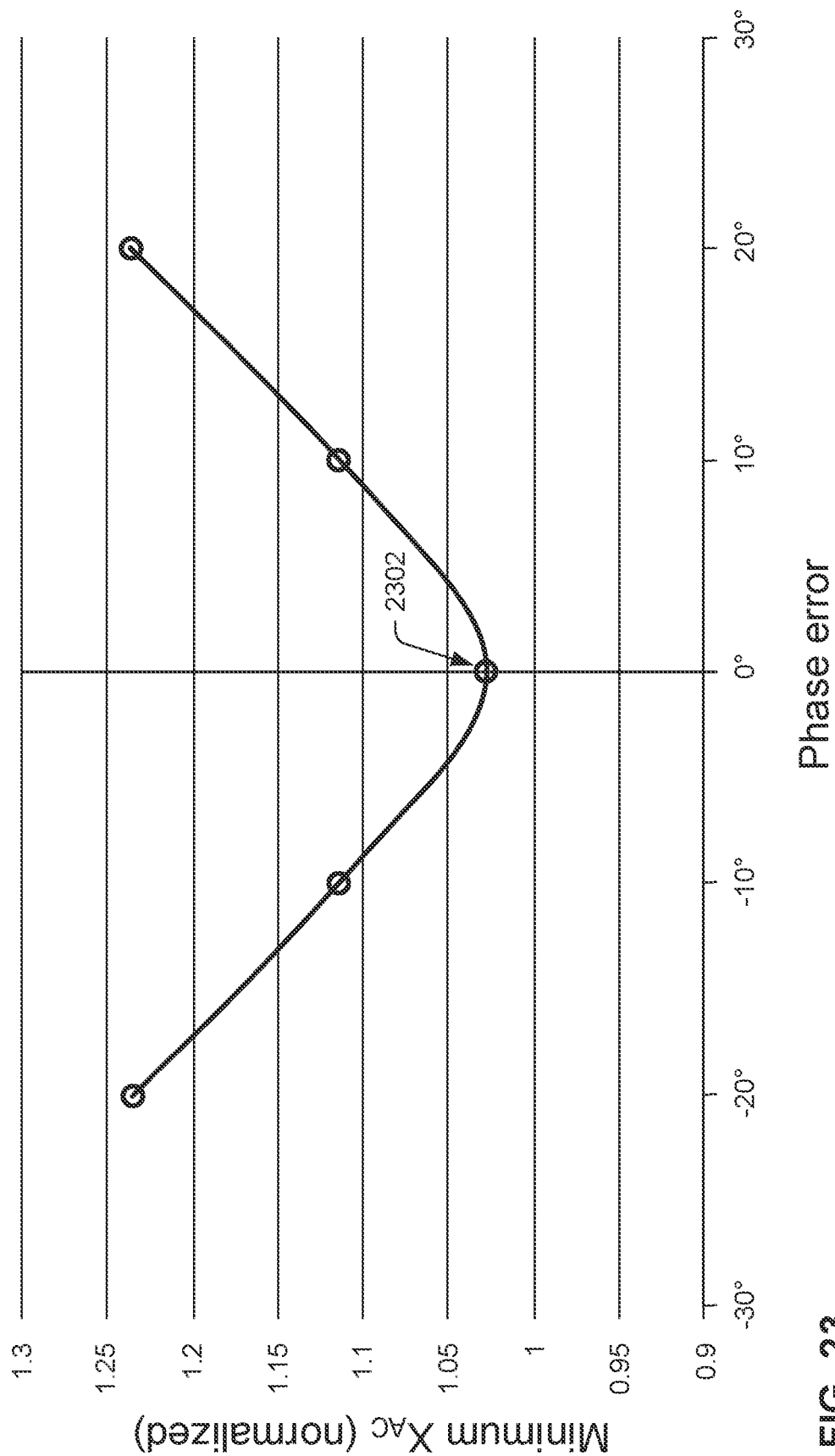
FIG. 23 is a graph showing example minimum operative bias signal AC amplitude for the phase sampler of FIG. 20.
Figure 30:
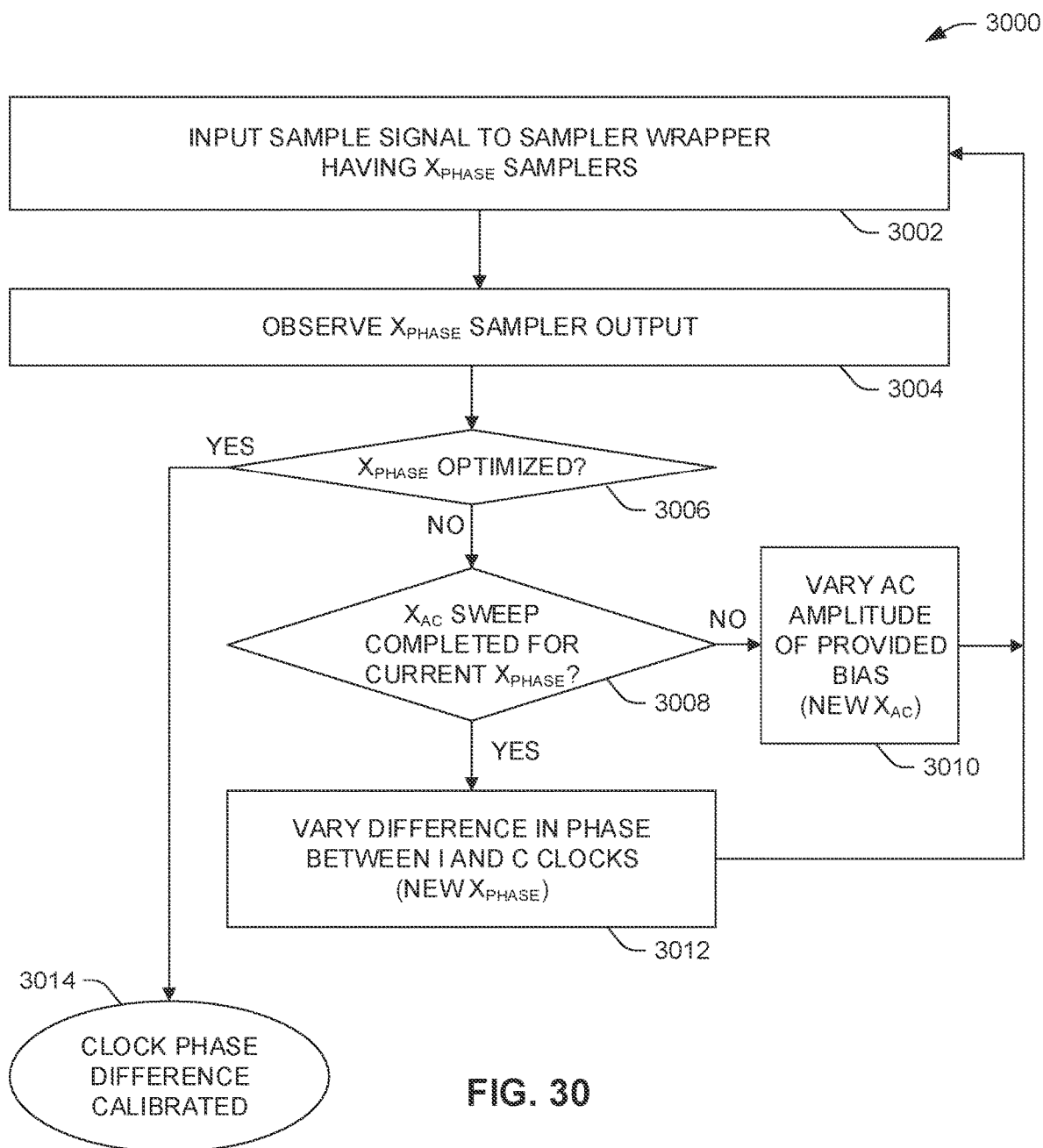
FIG. 30 is a flow chart showing an example method of adjustment or optimization of relative phase difference between I and Q clocks using phase-sensitive bias-level sensors integrated on an RQL IC.

The minimum $X_{AC}$ clock amplitudes, that is the amplitudes of AC flux provided by the transformers of the 45° and the 135° combination clocks, as a function of phase error (phase difference between the I and Q clocks) is plotted in FIG. 22. The sampler stages respond to these differences in clock amplitudes. Thus, phase error can be calibrated based on information about the operating margins observed in sampler stages while varying I/Q phase. In the 45° shift register 2000 of FIG. 20, clock amplitudes of 45° and 225° transformers decrease as the interclock phase difference (phase error) increases relative to 90°, while clock amplitudes of 135° and 315° transformers increase. The clock amplitude versus phase error graph of FIG. 22 shows this relationship for the example phase sampler 2000 of FIG. 20. The minimum operative bias signal AC amplitude graph of FIG. 23 shows how this property is applied to form an $X_{phase}$ sampler that is sensitive to phase, in the form of phase sampler 2000 of FIG. 20. As shown in FIG. 23, the operating margin shmoo plot lower limit ($X_{ACmin}$) of a shift register consisting of 45°, 135°, 225°, and 315° sampler stages is at the lowest $X_{AC}$ level 2302 when the phase difference between the I and Q clocks (phase error), as measured on the RQL IC 106, is 90°. Although FIG. 20 illustrates an example with six sampler stages per phase-specific sampler stage 2002, 2004, 2006, 2008, other example shift registers configured as $X_{phase}$ samplers may have more or fewer sampler stages per arrangement 2102, 2104, 2106, 2108. A method 3000 for clock signal phase calibration using a phase-sensitive sampler like the phase sampler 2000 shown in FIG. 20 is shown in FIG. 30, and is described in greater detail below.

Figure 24:
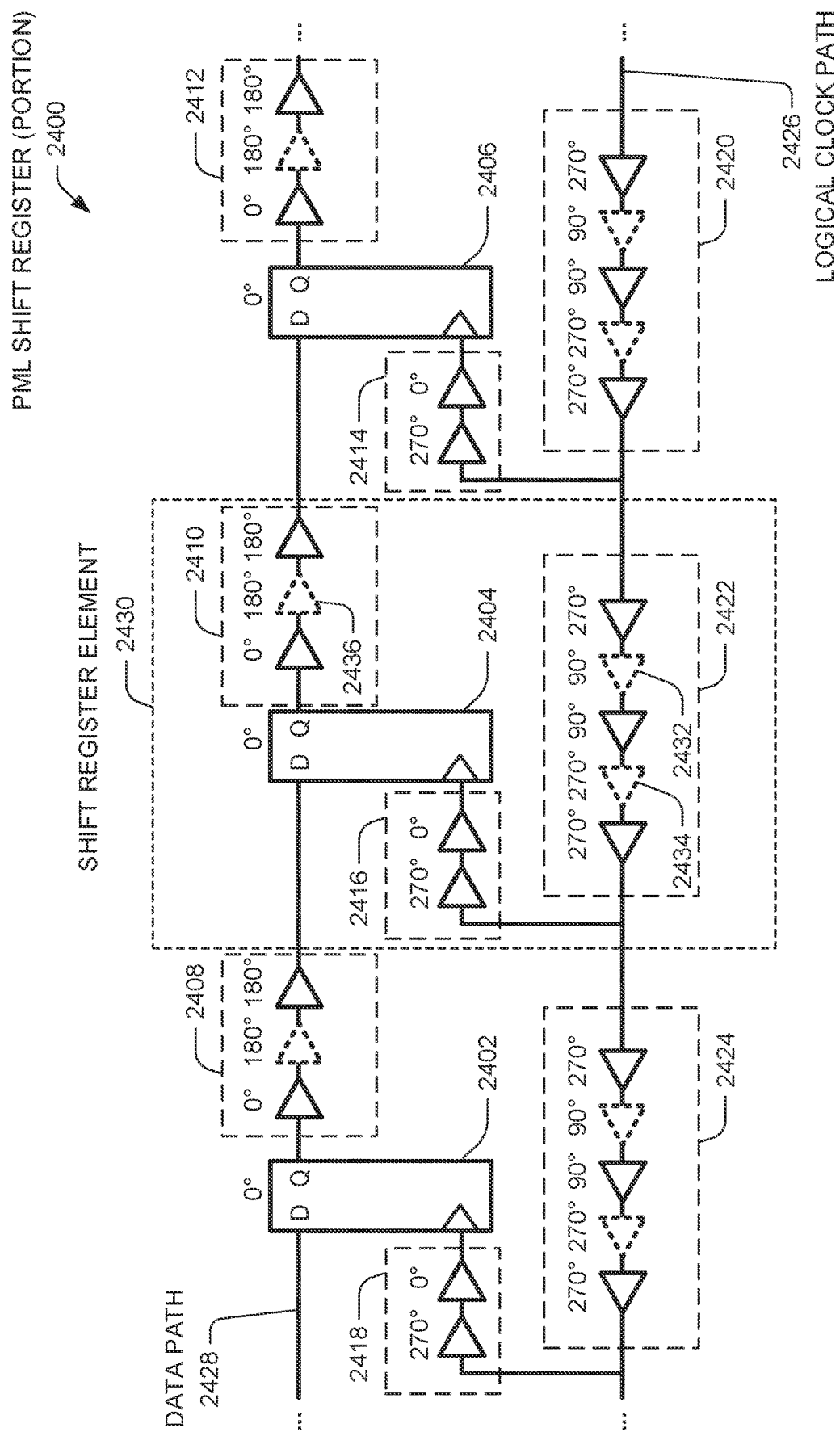
FIG. 24 is a block diagram of a portion of a phase mode logic (PML) bias-level sensor.

FIG. 24 shows a representative portion of a phase mode logic (PML) bias-level sensing arrangement 2400 that can use flip-flops (e.g., flip-flops 2402, 2404, 2406) and phase-mode shift registers (e.g., shift registers 2408, 2410, 2412, 2414, 2416, 2418, 2420, 2422, 2424) to sense and read out bias amplitudes. PML bias-level sensing arrangement 2400 of FIG. 24 can thus provide a similar function as the ladder wrapper arrangement of FIG. 2A, in that it provides sensors that are individually testable for their operating range under variable RQL bias conditions and that can be located in multiple places on an RQL IC 106, but with a different structure and method of use than the arrangement of FIG. 2A. Bias-level testing and adjustment using the arrangement 2400 of FIG. 24 involves changing the AC level in the resonator under test, which in different examples can be the I resonator (as illustrated) or the Q resonator (not illustrated). As with an RQL scan register or JTL testbed of FIG. 2A, multiple sensors are activated and their responses are read out using a shift register circuit structure.

The structure 2400 in FIG. 24 forms a shift register wherein each time a logical clock assertion signal (provided, for example, as a reciprocal pair of SFQ pulses, or, in some instances, as a first positive SFQ pulse of such a pulse pair) is advanced in through logical clock path 2426 (from right to left in the orientation of FIG. 24) and thus provided to clocking inputs of D flip-flops (e.g., D. flip-flops 2402, 2404, 2406), a pattern signal provided on data path 2428 is advanced by one shift-register element through the shift register 2400 (from left to right in the orientation of FIG. 24). A single element of the shift register 2400 is encompassed by broken-line box 2430, having one D flip-flop 2416 and JTL-based shift registers 2410, 2416, 2422. The register 2400 can include as many elements like element 2430 as desired, arranged in series with each other, each element being placed in a location on the RQL IC 106 so as to tap the clock resonators in that portion of the IC 106. Each element thus observes a different physical connection (tap) 120 to the AC clock network 104 in RQL IC 106. In FIG. 24, each small triangle represents a buffer, e.g., a JTL-based buffer. The flip-flops of shift register 2400 (e.g., flip-flops 2402, 2404, 2406) can be implemented, for example, as a PML flip-flop, examples of which are described in U.S. Pat. No. 10,615,783 B2, entitled "RQL D Flip-Flops", and U.S. Pat. No. 10,756,712 B2, entitled "RQL Phase-Mode Flip-Flop", both of which are incorporated by reference. The number above each flip-flop or buffer (in degrees) represents the phase of the clock provided to the flip-flop or buffer below it. Different phase clocks can be provided by tapping, via different transformers, different clock resonators 104 on the RQL IC 106, or in some cases by tapping different combinations of transformers.

In some examples of shift register 2400, the elements of the shift register can be designed and fabricated to each have different operating-margin offsets from each other, which offsets can be staged, linearly or in some other fashion, similarly to how the bias-level sensors 202-212 of the ladder wrapper configuration 200 of FIG. 2A can be intentionally configured with staged operating-margin offsets, as described above. In some examples, the bias transformers that connect the AC clock network to the D flip-flops in shift register 2400 can be modified from their typical values, so that the D flip-flops of shift register 2400 are underbiased or overbiased, either all with the same amount of underbiasing or overbiasing or with differing degrees of underbiasing or overbiasing. The D flip-flops can thus be expected to fail (to stop functioning due to the AC bias point being outside of the AC operating margins of the D flip-flops) with varying AC bias at an AC bias amplitude that is larger (at an AC bias point that is higher) than the AC amplitude at which the JTL-based buffers fail from the same amplitude-varying AC bias. Even absent intentional underbiasing of the D flip-flops, the D flip-flops may fail at a higher AC bias point than the AC bias point at which the JTL-based buffers fail from the same amplitude-varying AC bias, because the D flip-flops are not as robust as JTLs in terms of their operating margins.

The PML flip-flop-based bias samplers in the shift register arrangement 2400 of FIG. 24 are responsive to variations in clock resonator, bias coupling transformer, and all other circuit parameters. Use of the PML flip-flop-based bias samplers in the shift register arrangement 2400 of FIG. 24 can thus help identify the bias levels needed by operational RQL circuitry 102, which can be expected to be influenced by variations in all process parameters. Specifically, PML flip-flop-based bias samplers are sensitive to the self-inductance of bias coupling transformer, the mutual inductance between the bias coupling transformer and the corresponding clock resonator, the magnitude of current in clock lines, the inductance of the coupling transformer, the inductances in JTLs and gates, and the Josephson junction (JJ) critical current.

In the illustrated example 2400 of FIG. 24, the Q clock resonator can be driven at nominal biasing levels, so that the logical clock signal is reliably provided to all of the flip-flops in the shift register 2400 (e.g., flip-flops 2402, 2404, 2406), while the I resonator can be driven with varying AC amplitude to test whether or not the shift operation is successful across the range of different AC amplitudes. For example, the operating range of each of the flip-flops can be independently determined for each flip-flop by performing the method 2900 shown in the flow diagram of FIG. 29. With the AC amplitudes of the Q and I clocks set 2902 to nominal, and the logical clock running, a test data bit pattern can be shifted 2904 into the data path 2428. The logical clock can be run by inputting a continuous stream of reciprocal pulse pairs into the logical clock path 2426. Thus, the initial data shift-in 2904 is performed while driving the I resonator at nominal AC bias amplitude levels. With the logical clock subsequently stopped 2906 after the test data bit pattern is shifted into the PML shift register 2400, the I resonator AC bias amplitude can be varied 2908 to a test an AC bias amplitude level that is greater or less than nominal. Then, a single logical clock assertion (e.g., a single positive SFQ pulse or a reciprocal pulse pair) can input 2910 into the logical clock path 2426. The I resonator AC bias amplitude can then be returned 2912 to nominal, and the logical clock restarted, to shift out 2914 an output data bit pattern on the data path 2428. The output data bit pattern can be observed 2916, e.g., following output of the data bit pattern through input/output circuitry of the RQL IC 106. The observation can be done, for example, by conventional semiconductor circuitry (e.g., CMOS circuitry) outside the cold space of the RQL IC 106.

If the output data bit pattern does not match the input data bit pattern, it can be determined that at least one of the elements 2430 of the PML shift register 2400 is outside of its operating margins under the conditions of the varied I resonator AC bias amplitude, and precisely which element 2430 is outside of its operating margins may be identifiable by the point in the output data bit pattern at which the output data bit pattern no longer matches the input data bit pattern (e.g., by a single-bit error found in the output data bit-stream). In some examples, multiple shift errors in the data bit pattern (e.g., multiple single-bit errors between the input data bitstream and the output data bitstream) can be used to identify multiple shift register elements that are operating outside of their respective margins.

Observation of the data output under the condition that one of the elements of the shift register 2400 fails (e.g., due to the provided 2908 bias point being outside of that element's operating margins), e.g., comparison of the output data bit pattern with the input data bit pattern, can reveal that at a certain point in the output bit data stream, a bit failed to advance through the shift register 2400 in the bit data stream. If, for example, the input data bit pattern consists of alternating pairs of "0"s and "1"s, the output data bit pattern might include somewhere in its bitstream three "0"s in a row followed by one "1" ("0001"), or three "1"s in a row followed by one "0" ("1110"). The location of the extra bit can be indicative of the identity of the element of the shift register 2400 that was outside of its operating margins during the single-clock advance. An example input data bit pattern could consist of a series of alternating pairs, triplets, etc., of logical "1"s and "0s" having the length of the PML shift register 2400, such as "0011001100110011" for a 16-bit shift register. Method 2900, or portions thereof, can, in some examples, be repeated with the bit pattern offset so that transitions could be guaranteed to land on different flip-flops of the shift register 2400, so as to provide a thorough data probing of the shift register 2400. For example, a "0011001100110011" or "1100110011001100" bit pattern may only be able to detect errors caused by odd-numbered elements of the shift register 2400 whereas a "1001100110011001" or "0110011001100110" bit pattern may only be able to detect errors caused by even-numbered elements of the shift register 2400. Other input data bit patterns may also be used. Conventional semiconductor circuitry (e.g., CMOS circuitry) outside of the cold space of the RQL IC 106 can perform comparisons of the input data bit pattern with the output data bit pattern, or can otherwise detect anomalies in the output data bit pattern indicative of flip-flop failure with varying bias parameters.

Figure 29:
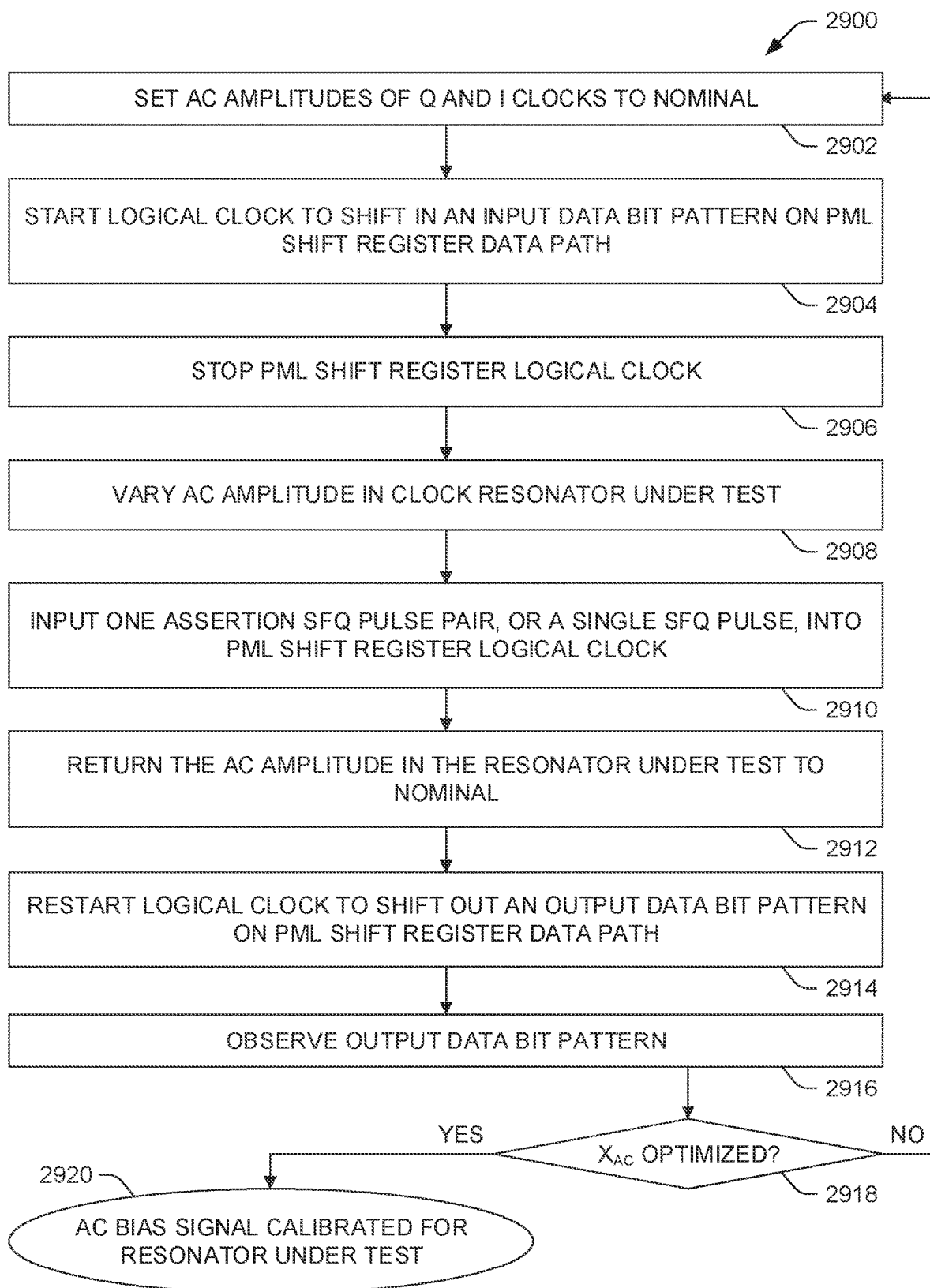
FIG. 29 is a flow chart showing an example method of AC (or, with modifications, DC) bias point adjustment or optimization using a PML shift register like that of FIG. 24 integrated on an RQL IC.

Still with reference to FIG. 29, after the output data bit pattern provided on the data path 2428 of the shift register 2400 of FIG. 24 is observed 2916 for differences from the input data bit pattern, it can be assessed 2918 whether the AC bias amplitude parameter has been optimized. For example, if a number of different AC bias amplitudes have been provided to the shift register 2400, data can be compiled showing which AC bias amplitudes are furthest in value from those that produce errors in the output data bit pattern, from which conclusions can be drawn about which AC bias amplitude is optimal. As one example, an AC bias amplitude that is between (e.g., the mean of) two extreme-value within-operating-margin AC bias amplitudes can be selected as an optimal AC bias amplitude. As another example, in which bias tap values of the D flip-flops are staged to be provided varying amounts of AC bias from flip-flop to flip-flop, the output data bitstream can be analyzed to determine which D flip-flops failed with the AC bias adjustment and which did not, and the optimal AC bias can be determined based on the respective operating margins of the working and failed flip-flops during the test. If insufficient data has been collected to draw a bias parameter optimality conclusion, the test can be repeated by resetting 2902 the AC bias amplitudes to nominal, restarting 2904 the logical clock and shifting 2904 either the same or a different input data bit pattern to repeat the test process portion 2902-2918. This test process portion can be iteratively repeated as many times as is necessary to provide confidence that the AC bias amplitude has been optimized 2920 for the AC clock resonator under test (e.g., the I resonator in the example as illustrated in FIG. 24). In some examples, the AC bias amplitude is not optimized, but is improved, e.g., from a starting or nominal value.

Although the method of FIG. 29 has been outlined with respect to AC bias adjustment or optimization, a similar method can be used for DC bias adjustment or optimization or for phase error adjustment or optimization. For DC bias adjustment or optimization, a DC bias value of a bias signal provided to the D flip-flops can be varied 2908 rather than an AC amplitude value, and in some examples, the transformer-coupling strengths to the DC bias line under test of the D flip-flops the phase-mode shift register can be staged, such that each has a different strength DC bias coupling and thus the flip-flops present different operating-margin shmoo plots that are shifted in the $X_{DC}$ dimension with respect to each other, as illustrated in FIG. 5A. For phase error adjustment or optimization, a phase differential between I and Q clock signals provided to the D flip-flops can be varied 2908 in addition to an AC amplitude value so as to carry out a two-dimensional $X_{AC}$-$X_{phase}$ search as shown in FIG. 22, with each D flip-flop being biased by an AC bias signal that is a mix of the I and Q clock signals. In some examples, the transformer-coupling strengths to the AC bias line under test of the D flip-flops of the phase-mode shift register can be staged, such that each D flip-flop has a different strength AC bias coupling to the mixed-resonator clock signal and thus the flip-flops present different operating-margin shmoo plots that are shifted in the $X_{AC}$ dimension with respect to each other, as illustrated in FIG. 5A.

Whereas a conventional RQL shift register may progress through at least four phases in every path (e.g., 0°, 90°, 180°, 270°), PML shift register 2400 is configured such that the logical clock path 2426 is coupled to the clock resonators 104 to receive only two phases (in the illustrated example, 90° and 270°) in its logical clock path trunk 2420, 2422, 2424 and the data path 2428 is coupled to the clock resonators 104 to receive only the other two phases (in the illustrated example, 0° and 180°). Accordingly, the trunk of the logical clock path 2426 is powered only by one clock resonator (in the illustrated example, the Q resonator), and the data path 2428 is powered only by the other clock resonator (in the illustrated example, the I resonator). By this arrangement, the logical clock path 2426 remains functional even when the data path 2428 is stressed to fail, by varying a bias parameter outside of the operating margins of the data path, for one or more shift register elements, thus ensuring that logical clock signals reach all flip-flops in the shift register 2400, even those that are rendered nonfunctional by bias parameter adjustments. The phase assignments thus isolate the operation of the flip-flops onto one AC clock resonator and isolate the logical clock that excites the flip-flops onto a different AC clock resonator. The 0° buffers in the logical clock path branches 2414, 2416, 2418 can be considered as part of the corresponding flip-flop circuits 2406, 2404, 2402 for the purposes of the above explanation. The buffers driving the clock pins of the respective flip-flops in the illustrated example 2400 may be required to be on the same clock phase as the flip-flop.

Buffers illustrated with broken lines in FIG. 24, such as buffers 2432, 2434 in the logical clock path 2426 and buffer 2436 in the data path 2428, can be of a different design than the buffers illustrated with solid lines in FIG. 24. The buffers illustrated in broken lines in FIG. 24 can each include an extra Josephson junction to ground at the input of their respective JTLs, allowing them to work reliably with a 180° phase delta from the previous cell. Absent this extra Josephson junction, it can be ambiguous which direction an SFQ pulse waiting at the boundary will propagate—forward or backward—when the AC bias signal provided to the respective buffer ramps up.

In another example PML shift register similar to shift register 2400, but which is not illustrated, 90° of AC clock phase can be added to all the phase values listed in FIG. 24 to provide a bias-level sensing arrangement that tests the Q clock resonator instead of the instead of I clock resonator. In such an example, the logical clock path trunk is driven by the I resonator and the data path is driven by the Q resonator. In such an example, the "resonator under test" in the method 2900 of FIG. 29, and the resonator in which the AC amplitude is varied 2908 as part of the method 2900, becomes the Q resonator, rather than the I resonator. In another example modification of PML shift register 2400, the JTL-based buffers in the logical clock path can be provided with offset bias transformers as illustrated in, and described above with respect to, FIG. 6. Such a modification can effectively shift the operating margins of the clock feed and thus can permit taking of samples when operational logic is at near nominal AC bias.

In other example PML shift registers similar to shift register 2400, but which are not illustrated, 45° or 135° of AC clock phase can be added to all the phase values listed in FIG. 24 to provide a bias-level sensing arrangement in which the data path and the logical clock path trunk receive bias signals that are mixes of the 0° I clock and the 90° Q clock. For example, the data path can be driven by 45° and 225° phase AC signals, and the logical clock path trunk can be driven by 135° and 315° signals. As another example, the data path can be driven by 135° and 315° phase AC signals, and the logical clock path trunk can be driven by 45° and 225° signals. Such examples can be useful for determining phase error between the I and Q clock signals and to improve or optimize the phases of the I and Q clocks for true quadrature. In another example modification of PML shift register 2400, the JTL-based buffers in the logical clock path can be provided with offset bias transformers as illustrated in, and described above with respect to, FIG. 6. Such a modification can effectively shift the operating margins of the clock feed and thus can permit taking of samples when operational logic is at near nominal AC bias.

FIG. 25 illustrates an example proximal portion of an arrangement 2500 in which pulse generators 2502, 2508 coupled to RQL gates (AND gates 2504, 2510 in the illustrated example) to form bias-level sensors (samplers). A wrapper for the pulse-generator-based bias-level sensors, of which a portion is illustrated in FIG. 25, is similar to the ladder structure shown in FIG. 2A in that it has a repeating circuit pattern of rungs (e.g., first two rungs 2512, 2514) and rails (2516, 2518) between a proximal input/output end (illustrated at the bottom of FIG. 25) and a distal end (not shown in FIG. 25), the rungs being arranged between an input rail 2516 and an output rail 2518 of the wrapper ladder. The rails 2516, 2518 can, for example, extend the full length of the clock resonator tapped by the wrapper. As one example, wrapper can have about 2,000 rungs each having a pulse-generator-based sampler that individually samples the clock resonator at a different location along the clock resonator. JTLs, represented as triangles in FIG. 25, providing timing delays. A sample signal input 2506 provides an SFQ pulse as a sample signal to the wrapper ladder, which SFQ pulse propagates along input rail 2516 (upward, in the orientation of FIG. 25), is branched and duplicated along each rung, and either returns or not along output rail 2518 (downward, in the orientation of FIG. 25) to output OUT, depending on whether individual samplers embedded in the rungs of the wrapper ladder are within their operating margins. Accordingly, in the wrapper illustrated in FIG. 25, a single sample SFQ pulse provided at the input 2506 results in a train of time-separated output SFQ pulses at the output OUT.

The pulse generators in the arrangement 2500 (e.g., pulse generators 2502, 2508) each comprise a Josephson junction having a first end that is grounded through an inductor and a second end that is inductively coupled to an AC bias transformer (e.g., through a coupling transformer). The second end effectively provides the output of the pulse generator. Each pulse generator outputs an SFQ pulse to its corresponding ladder rung with each cycle of the AC clock by which the pulse generator is driven, provided that the pulse generator is driven within its operating range, e.g., provided that the amplitude of the AC clock that drives the pulse generator is within the AC operating margins of the pulse generator. The Josephson junctions of the pulse generators can be sized to be larger than, and thus can have a larger critical current than, Josephson junctions used withing the JTLs and gates of the operational RQL circuitry 102, in order to help reduce variability of the pulse generator Josephson junctions. Each pulse generator output is gated by the sample signal via a corresponding gate (e.g., gates 2504, 2510 in FIG. 25). Thus, although each pulse generator operates continuously to provide repeated SFQ outputs to its corresponding rung so long as the provided AC bias is within the operating margins of the pulse generator, only the SFQ outputs generated substantially contemporaneously with the arrival of the sample signal pulse on the same rung (e.g., within the same AC clock cycle or half clock cycle) propagate down output rail 2518 to the output OUT.

The operating range of each pulse generator in the sensing system of FIG. 25 can be individually set, for example, by configuring each pulse generator with a stronger or weaker coupling to one or more AC clock resonators and/or DC bias lines that provide biasing to (drive) the pulse generator. For example, the $X_{AC}$ margins of the pulse-generator-based samplers in the sensing system of FIG. 25 can be shifted (offset) such that the pulse generators can go into and out of operation with varying provided levels of AC bias (with varying amplitudes of the driving AC clock) and their operating level can be determined even while the bias point variation that enables the sensing allows operational RQL circuitry 102 to remain within its operating margins.

An $X_{AC}$ margin shift can in some examples be implemented by increasing the critical current of the JJs in the pulse generators. An increase in the critical current of the JJ of a pulse generator in a pulse-generator-based sampler has the effect of moving the corresponding sampler's margin shmoo plot up and to the right in an $X_{DC}$-$X_{AC}$ plot like that of FIG. 3, because higher-than-usual DC and AC bias amplitudes are needed to flip the pulse generator JJ due to its increased critical current. The JJ critical current can be chosen such that AC and DC bias produced by the pulse generator bias coupling transformer is at the threshold of causing the pulse generator JJ to trigger with every AC clock cycle at an $X_{DC}$-$X_{AC}$ bias point that lies within the margin shmoo plot (operating region) of operational JTL circuitry 102. For example, the margin shmoo plot (operating region) of a pulse-generator-based sampler can be positioned within that of operational JTL circuitry 102 so that the pulse-generator-based sampler can be driven into and out of the operating region in which it produces pulses by varying the bias delivered to both the pulse-generator-based sampler and the operational RQL circuitry 102 even while delivered bias remains within the operating region of the operational RQL circuitry 102 and the operational RQL circuitry 102 therefore remains functional. As with the example of FIG. 2A, the pulse-generator-based samplers in FIG. 25 can have their $X_{AC}$ and/or $X_{DC}$ operating margin offsets staged, and such staging can be linear along the ladder, e.g., from lowest to highest AC margins, or highest to lowest, or in any other arrangement that can be considered when evaluating the output. $X_{DC}$ staging can be provided in the pulse-generator-based samplers of FIG. 25 by, for example, varying the length of the DC portion of the coupling transformer, in effect shifting the respective margin shmoo plots of the pulse-generator-based samplers left and right in the $X_{DC}$—$X_{AC}$ space as shown in FIG. 5A.

The pulse-generator-based samplers in FIG. 25 can be arranged on the RQL IC 106 to tap a clock resonator 104 at various points along the resonator. Although not illustrated in FIG. 25, input sample SFQ pulses can be provided to input 2506 using an input transformer coupled to input 2506 in a similar fashion to input transformer 252 shown in FIG. 2A, and output SFQ pulses can be converted to voltage pulses using an output amplifier coupled to output OUT in a similar fashion to output amplifier 254 shown in FIG. 2A.

The pulse generators in the arrangement 2500 (e.g., pulse generators 2502, 2508) are sensitive to fabrication variations in the JJs that make them up and to clock resonator and coupling transformer variations, with a comparatively smaller sensitivity to other circuit parameters relative to samplers based on JTLs or gates with large self-inductances as described above with regard to FIGS. 6, 8A, 9A, 10A, 11A, 12, 13, 16, and 18. For example, the pulse-generator-based samplers of FIG. 25 are not especially sensitive to variations in inductances on the circuit side of the ground plane in an RQL IC 106. The arrangement 2500 is therefore especially well-suited for evaluating the performance of clock resonators and coupling transformers, e.g., when assessing the self-inductance of coupling transformers, the mutual inductance between coupling transformers and the clock resonators to which they are coupled, and the magnitude of current in clock resonators.

The pulse generators in the arrangement 2500 can be configured to measure I-specific (Q-independent) or Q-specific (I-independent) readings by coupling the samplers to appropriate clock bias resonators, as described above with regard to FIGS. 12, 13, 16, and 18, and as set out in Table 1. Pulse generators in the arrangement 2500 can also be configured to measure the phase difference between the I and Q clocks (in some examples, with AC bias amplitudes first having been calibrated for both I and Q clock bias signals) by driving pairs of pulse generators in a single wrapper, or by driving pluralities of pulse generators in different wrappers, with mixed clock signals separated by 90°, e.g., by driving a first pulse generator (or a first set of pulse generators in a first wrapper of pulse-generator-based bias-level sensors) with a 45° clock and a second pulse generator (or a second set of pulse generators in a second wrapper of pulse-generator-based bias-level sensors) with a 135° clock, or driving a first pulse generator (or a first set of pulse generators in a first wrapper of pulse-generator-based bias-level sensors) with a 225° clock and the a second pulse generator (or a second set of pulse generators in a second wrapper of pulse-generator-based bias-level sensors) with a 315° clock. The outputs of 45° and 135° driven pulse generators (or 225° and 315° driven pulse generators, etc.) are equal only at a 90° phase difference between the two driving clocks and when AC amplitudes of AC signals provided by the I and Q clock resonators are equal. This mixed-clock setup can therefore be used to determine true quadrature between the I and Q clock signals and can be used to inform or command adjustments to the I and Q clock phases, or adjustments to a difference in phase between the I and Q clock phases, so as to improve or optimize the quadrature to 90° of phase difference between the I and Q clocks. As an example, a process as described with reference to FIG. 30 can be used with the arrangement 2500 to determine the optimum phase difference between the I and Q clocks at which the I and Q clocks should be driven in the warm space to achieve true quadrature (90° phase separation) between the clocks at the operational RQL circuitry 102 on the RQL IC 106 in the cold space.

Figure 26A:
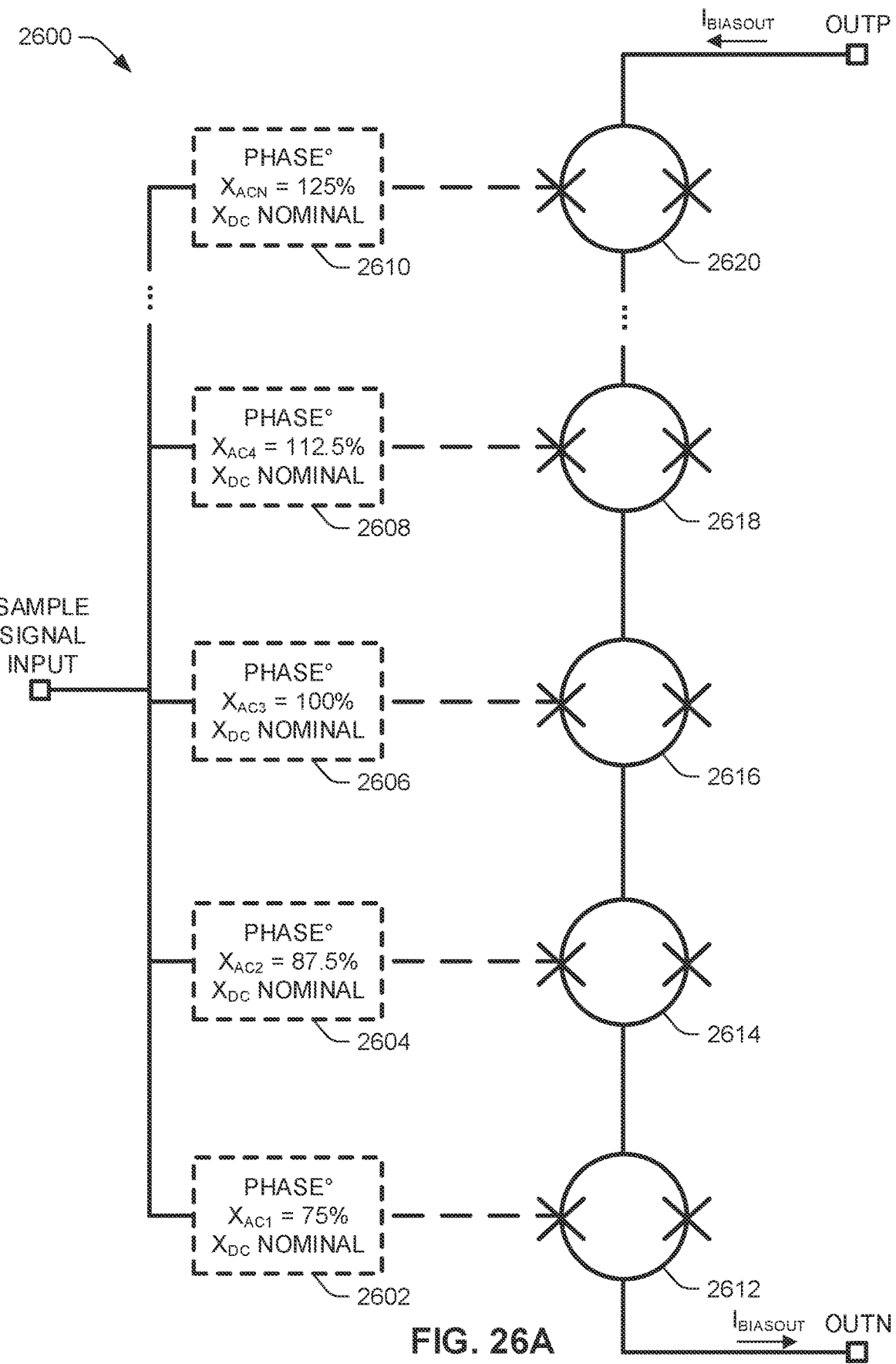
FIG. 26A is a block diagram of an example arrangement of bias-level sensors arranged in a DC SQUID-based bias-level sensor.

FIG. 26A shows an example arrangement of samplers 2602-2610 arranged in a DC SQUID-based bias-level sensor 2600. The samplers 2602-2610 can be based on JTLs or RQL gates, as described above with regard to FIG. 6, and can comprise one or more sampler stages in series with each other, as described above with regard to FIGS. 15 and 21. The samplers 2602-2610 act as triggers for DC SQUIDs 2612-2620. Each sampler 2602-2610 has one of its parameters, such as $X_{AC}$ or $X_{DC}$, staged such that the number of DC SQUIDs 2612-2620 in a stack that are activated when an input pulse is applied to the sample signal input on the left of FIG. 26A varies according to a bias level provided to the samplers 2602-2610. The voltage level of an output pulse generated by the stack of DC SQUIDs 2612-2620 therefore varies according to the provided bias level. The arrangement 2600 can thus be considered as a single bias-level sensor having a voltage output that varies with the number of individual samplers 2602-2610 biased within their operating regions at the time a sample signal pulse is provided to the sample signal input. The output voltage can in turn be indicative of the sensed bias parameter (AC bias amplitude or DC bias value) that the sensor 2600 is configured to measure, given appropriate staging of the bias coupling strengths of the sensors 2602-2610, as has been discussed above with respect to FIGS. 4A and 5A, for example. Because sensor 2600 can measure the outputs of individual sensors 2602-2610 in parallel and simultaneously, sensor 2600 can have higher output throughput than the arrangements of FIGS. 2A-2C. Sensor 2600 generates an output voltage pulse each time an input SFQ pulse is applied at the sample signal input, which can be as often as once every AC clock cycle.

Each DC SQUID 2612-2620 of the DC SQUID stack of sensor 2600 receives its input from a respective sampler 2602-2610 via a respective transformer coupling to the DC SQUID, each respective transformer coupling being illustrated in FIG. 26A as a broken line between each sampler 2602-2610 and the respective DC SQUID 2612-2620 to which the sampler is transformer-coupled. Each sampler can, for example, be a JTL with its respective AC offset inductor $L_{offsetAC}$ size-adjusted to provide both the desired $X_{AC}$ offset from the nominal (as shown in FIG. 3) and the desired staging (inter-sampler variation). In the example of FIG. 26A, the DC SQUID stack is illustrated as including stages (five samplers 2602-2610 and five corresponding DC SQUIDs 2612-2620), but in other examples, the stack can include more or fewer stages (more or fewer samplers and corresponding DC SQUIDs), with more stages providing finer output voltage signal resolution, or permitting for sensing multiple bias parameters. For example, some of the samplers 2602-2610 can be configured to sense AC bias amplitude while others can be configured to sense DC bias value, or some of the samplers 2602-2610 can be configured to sense AC bias amplitude of one clock resonator, I or Q, or some combination of clock signals, while others can be configured to sense AC bias amplitude of a different clock resonator, or some different combination of clock signals. In different examples, the structure of sensor 2600 of FIG. 26A can have between five and ten stages.

A sample signal input can be provided to each of the samplers 2602-2610, e.g., via a binary vine tree of JTLs (not shown) such that, in some examples, the sample signal arrives at each of the samplers 2602-2610 substantially simultaneously. As in the examples described above (e.g., the examples of FIGS. 2A and 25), the samplers can be $X_{AC}$ shifted and/or can be $X_{AC}$ staged and/or $X_{DC}$ staged with variation in mutual inductance to the respective AC resonator or DC bias line measured by the individual sampler. A DC bias current $I_{BIASOUT}$, which by itself is insufficient to trigger any of the SQUIDs 2612-2620, is driven between OUTP and OUTN to bias the SQUID stack such that any current provided by an input sample pulse distributed to SQUIDs 2612-2620 via samplers 2602-2610 is sufficient to trigger the respective SQUID. Because $I_{BIASOUT}$ can be provided externally to the RQL IC 106 on which the sensor 2600 is implemented, and because the voltage signal across OUTP and OUTN can be made available at the pads of the RQL IC 106, the signal from the sensor of FIG. 26A can be available for direct measurement, e.g., by external test equipment, and need not require logic to process or interpret its output.

In the example illustrated in FIG. 26A, five samplers 2602-2610 are $X_{AC}$ staged with the AC amplitude margin variation given by the values $X_{AC1}$-$X_{ACN}$ shown in the boxes representing samplers 2602-2610. For example, a resonator clock network can be fabricated on an RQL IC 106 to run underneath the samplers 2602-2610, and a different AC offset inductor $L_{offsetAC}$ can be provided to each sampler 2602-2610 to mutually couple power to the respective sampler based on the I and Q bias signal required for the clock phase desired to be provided to the sampler. In FIG. 26A, an $X_{AC}$ value of 100% signifies the bias level that the sampler is rated for, and variations of the $X_{AC}$ value signify greater or lesser AC bias levels coupled into the samplers. $X_{AC}$ values of 75%, 87.5%, 100%, 112.5%, and 125% are given in FIG. 26A as examples for linear staging of a five-sampler arrangement as shown in FIG. 26A. In operation, the strength of a bias level provided to all the samplers 2602-2610 can be externally varied as sample signal input pulses are provided to sensor 2600, and the different strengths of bias into each of the samplers 2602-2610 can result in a different number of the SQUIDs 2612-2620 contributing to the potential difference between output voltage terminals OUTP and OUTN, depending upon how many of the samplers are operative under the provided bias condition.

For example, a sampler 2610 having an $X_{AC}$ value of 125%, due to sampler 2610 having been configured to be biased via an AC offset inductor $L_{offsetAC}$ of an appropriate inductance value, requires a higher AC bias level to transfer an input sampler pulse to its respective DC SQUID 2620, whereas sampler 2602, having an $X_{AC}$ value of 75%, due to sampler 2602 having been configured to be biased via a smaller AC offset inductor $L_{offsetAC}$, requires a relatively lower AC bias level to operate. By contrast, the sampler 2602 with an $X_{AC}$ value of 75% can continue to operate with a higher bias current (because the higher provided bias current is inside of its operating region) even when the sampler 2610 with an $X_{AC}$ value of 125% will not continue to operate (because the AC bias level is below, and thus is outside of, its operating region).

For example, in the arrangement 2600 of FIG. 26A, if each SQUID 2612-2620, when activated by an operational corresponding sampler 2602-2610, generates a potential difference of about 0.5 mV, then the voltage output between OUTP and OUTN is about 2.5 mV when the provided bias level is within the respective operating regions of all samplers 2602-2610. This output voltage is reduced when fewer than all of the samplers 2602-2610 are provided bias within their respective operating regions. For example, the output voltage of arrangement 2600 may be about 2 mV when the provided bias level is such that only four samplers 2602-2610 are operational, about 1.5 mV when the provided bias level is such that only three samplers 2602-2610 are operational, about 1 mV when the provided bias level is such that only two samplers 2602-2610 are operational, about 0.5 mV when the provided bias level is such that only one of the samplers 2602-2610 is operational, and about 0 mV when the provided bias level is such that none of the samplers 2602-2610 is operational. In the five-stage example of FIG. 26A, the AC bias amplitude can be considered to be calibrated when the amplitude is varied to obtain about three-fifths of the maximum output voltage pulse height. In the five-stage example of FIG. 26A, the AC bias amplitude can be considered to be calibrated when samplers 2602 and 2604 are within their operating ranges and therefore provide the split input sample signal to their respective SQUIDs 2612, 2614, when samplers 2608 and 2610 are outside of their operating ranges and therefore do not provide the split input sample signal to their respective SQUIDs 2618, 2620, and when sampler 2606 is just within its operating range and therefore just provides the split input sample signal to its corresponding SQUID 2616.

Figure 26B:
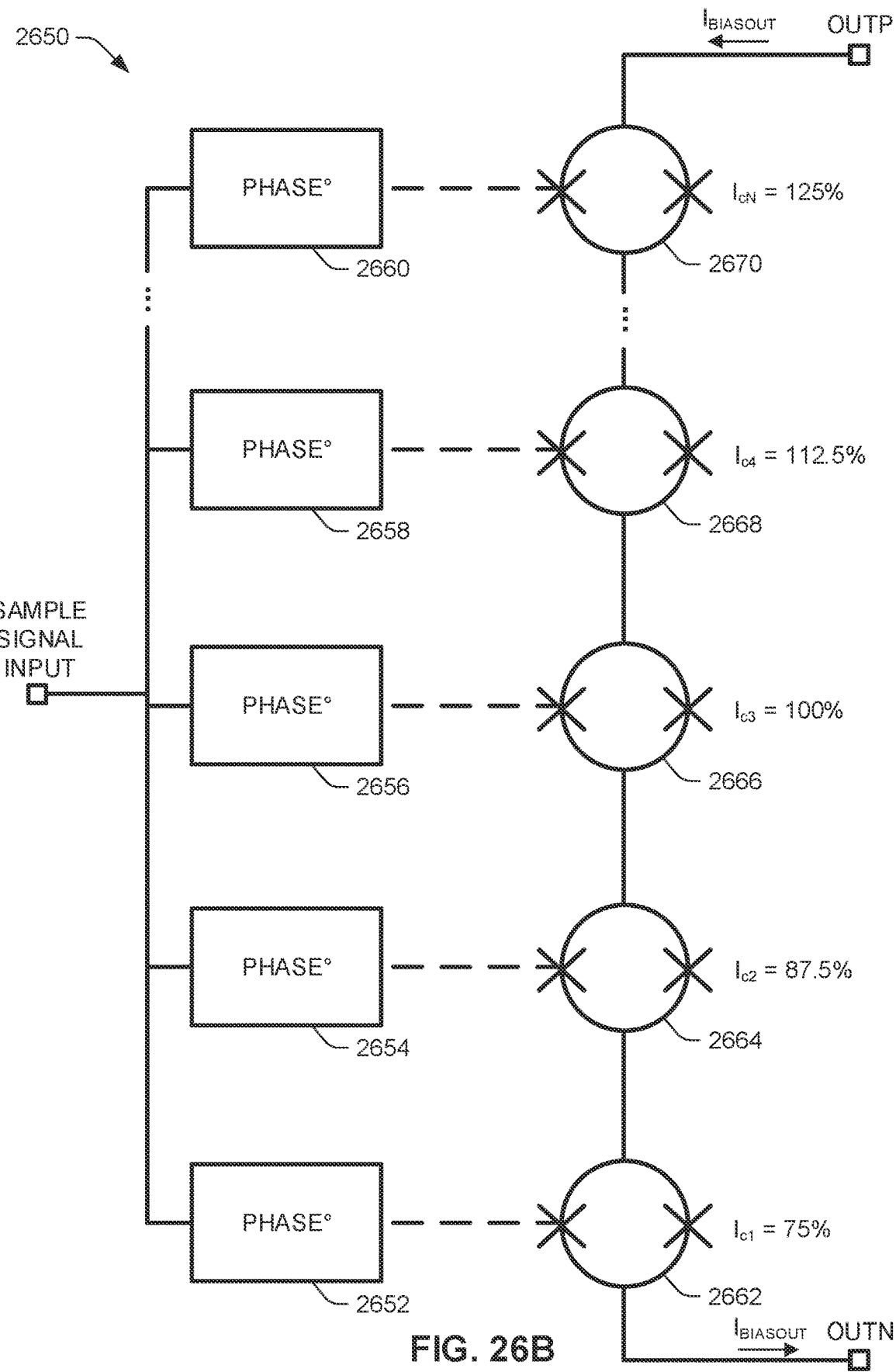
FIG. 26B is a block diagram of an example DC SQUID-based output amplifier configured as a sensor for measuring the level of externally provided output bias current $I_{BIASOUT}$ relative to the optimal level thereof.

Operational RQL circuitry 102 in FIG. 1 can include output amplifiers similar in structure to the sensor of FIG. 26A that can be required to be biased with an output bias current $I_{BIASOUT}$ of an appropriate current level, which can vary with variations in circuit fabrication process and/or system setup. FIG. 26B shows an example DC SQUID-based output amplifier 2650 configured as an output bias current $I_{BIASOUT}$ level sensor capable of sensing, for example, how well the applied level of output bias current $I_{BIASOUT}$ meets the needs of an output amplifier to which the output bias current $I_{BIASOUT}$ is applied. The arrangement 2650 of FIG. 26B is similar to arrangement 2600 of FIG. 26A, except that rather than the AC offset inductors $L_{offsetAC}$ of corresponding samplers 2602-2610 being staged in their inductance values, the standard-bias samplers 2652-2660 have no difference in self-inductance with respect to each other (e.g., no AC offset inductors $L_{offsetAC}$), and instead the critical currents L of JJs in corresponding DC SQUIDs 2662-2670 are staged in their respective offsets with respect to a nominal value. In the example arrangement 2650 illustrated in FIG. 26B, the JJs of SQUID 2666 have the nominal value ($I_{C3}$=100%), whereas other SQUIDs in the stack have JJs fabricated to have lower critical currents (e.g., SQUIDs 2662, 2664, having JJs with critical currents $I_{C1}$=75% and $I_{C2}$=87.5%, respectively) or higher critical currents (e.g., SQUIDs 2668, 2670, having JJs with critical currents $I_{C4}$=112.5% and $I_{CN}$=125%, respectively). As with the example shown in FIG. 26A, the example of FIG. 26B can have more or fewer DC SQUIDs in its DC SQUID stack, with more stages providing finer output voltage signal resolution.

In the example 2650 of FIG. 26B, the output bias current $I_{BIASOUT}$, provided between the output terminals OUTP and OUTN, can be varied to determine the optimum DC bias on an output amplifier bias line, i.e., the optimum bias current for the SQUIDs 2662, 2664, 2666, 2668, and 2670. For example, when a five-SQUID stack is used as shown in FIG. 26B, the output amplifier output bias current $I_{BIASOUT}$ can be varied to obtain about three-fifths the full output voltage pulse height with each sample SFQ pulse provided to the sample signal input. The example arrangement 2650 of FIG. 26B does not de-couple the respective effects of AC and DC bias on the samplers 2652-2660 that trigger the SQUIDs 2662-2670, or any other JTLs in the circuit. The example arrangement 2650 can be used, for example, to calibrate an output bias current $I_{BIASOUT}$ provided to output amplifiers on RQL IC 106, $X_{AC}$ and $X_{DC}$ having first been independently adjusted, improved, or optimized, the output amplifier output bias current $I_{BIASOUT}$ can subsequently be adjusted, improved, or optimized.

Because the output-amplifier-based arrangements 2600, 2650 of FIGS. 26A and 26B provide an instantaneous indication of the number of operational samplers in the arrangement for each provided sample signal, these arrangements improve throughput of the bias-level sensing output as compared to an RQL scan register arrangement like that of FIGS. 2A or 25, a ring oscillator arrangement like that of FIG. 2C, or a PML shift register arrangement like that of FIG. 24, each of which may take a longer time than an output-amplifier-based arrangement to provide a complete output indicative of the bias parameter being sensed. In some examples (not illustrated), a different amount of time delay can be added to each branch of the output-amplifier-based arrangements 2600, 2650 of FIGS. 26A, 26B (e.g., by adding a different number of additional standard-bias JTLs to samplers of each branch of the output-amplifier-based arrangements 2600, 2650 of FIGS. 26A, 26B) to enable time-division multiplexing. For example, a phase shift can be added at 90° increments or 45° increments. In one example, each branch of the output amplifier structure 2600 or 2650 of FIGS. 26A, 26B has (from top to bottom, e.g.) time delay to assign a phase of 0°, 45°, 90°, 135°, 180°, etc. This example arrangement provides a time-based step function signal at the output, with the output signal stepping up in 0.5 mV increments at each time step, or not stepping up, depending on whether the SQUID of the corresponding stage of the output amplifier arrangement was induced to fire, which, in the example of FIG. 26A, would in turn depend on whether the corresponding JTL-based sampler 2602-2610 was within its operating range. The time-staggered output could then be used to identify which of the samplers 2602-2610 delivered a signal to their corresponding SQUIDs 2612-2620, triggering the corresponding SQUID 2612-2620 or not.

A serial-output ladder wrapper (RQL scan register) structure like that of FIG. 2A can also be used to calibrate output amplifier output bias current, by implementing its bias-level sensors 202-212 as output amplifier emulators. JTL-based bias-level sensors configured as output amplifier emulators can have the following distinctive characteristics. First, each bias-level sensor configured as an output amplifier emulator can have the AC bias transformer(s) of its respective JTL(s) coupled to a clock resonator via a lower than standard mutual inductance. Second, each bias-level sensor configured as an output amplifier emulator can have the DC bias transformer(s) of its respective JTL(s) coupled to the output amplifier output bias current ($I_{BIASOUT}$ in FIG. 26B), rather than to a different DC bias line. Each output amplifier emulator thus derives its DC bias from an output amplifier output bias line of RQL IC 106. Third, the sensitivity of the JTLs in each output amplifier emulator to output amplifier output bias current can be configured to be similar to that of the SQUIDs in the output amplifiers that the output amplifier emulators are configured to emulate. For example, JJs in the JTLs of the output amplifier emulators can be sized to have critical currents that approximate the critical currents of the JJs in the DC SQUIDs of the output amplifier that the output amplifier emulators are configured to emulate. When the bias-level sensors 202-212 of the serial-output ladder arrangement 200 of FIG. 2A are configured as output amplifier emulators having the above three characteristics, the pulse count provided at the output of the ladder structure 200 configured with output amplifier emulators as bias-level sensors 202-212 is representative of how well the output amplifier output bias current is adjusted for the SQUIDs in the output amplifier that the output amplifier emulators are configured to emulate.

As described above with regard to bias-level sensing arrangements configured for calibrating AC bias amplitude or DC bias value, the mutual inductance to the output amplifier output bias line of each bias-level sensor configured as an output amplifier emulator can be varied in stages so that each output amplifier emulator provides the desired XOA. For example, with regard to the example arrangement 200 of FIG. 2A, and implementing each bias-level sensor 202-212 as an output amplifier emulator, output amplifier emulator 202 could have a smaller mutual inductance to the output amplifier output bias line than output amplifier emulator 204, output amplifier emulator 204 could have a smaller mutual inductance to the output amplifier output bias line than output amplifier emulator 206, and so on for each rung of the wrapper ladder structure 200. Thus, as the output amplifier output bias is varied, more or fewer of the output amplifier emulators 202-212 produce pulses, and the pulse count of the serial output of the wrapper is varied.

With respect to the above-described output amplifier emulator example, the output amplifier output bias current can be adjusted, improved, or optimized by direct observation of the output amplifier outputs, without using the output amplifier emulator. Such variance of the output amplifier output bias current during direct observation of the output amplifier outputs can require varying the output amplifier output bias current over a range that includes disabling the output amplifier being observed. Once the optimal bias has been determined by such a method, the pulse count from a serial-output wrapper ladder sensor having its bias-level sensors 202-212 configured as output amplifier emulators can be noted and used to maintain the optimum output amplifier output bias current even while the output amplifier continuously remains in operation, because the output amplifier output bias current can then be kept within the operating range of the output amplifier being emulated. In such a case, it is not necessary for the output amplifier emulators to emulate the JJ critical current characteristics of the SQUIDs of the output amplifier being emulated, that is, the output amplifier emulators need not be configured to fulfill the third characteristic described above.

Figure 27A:
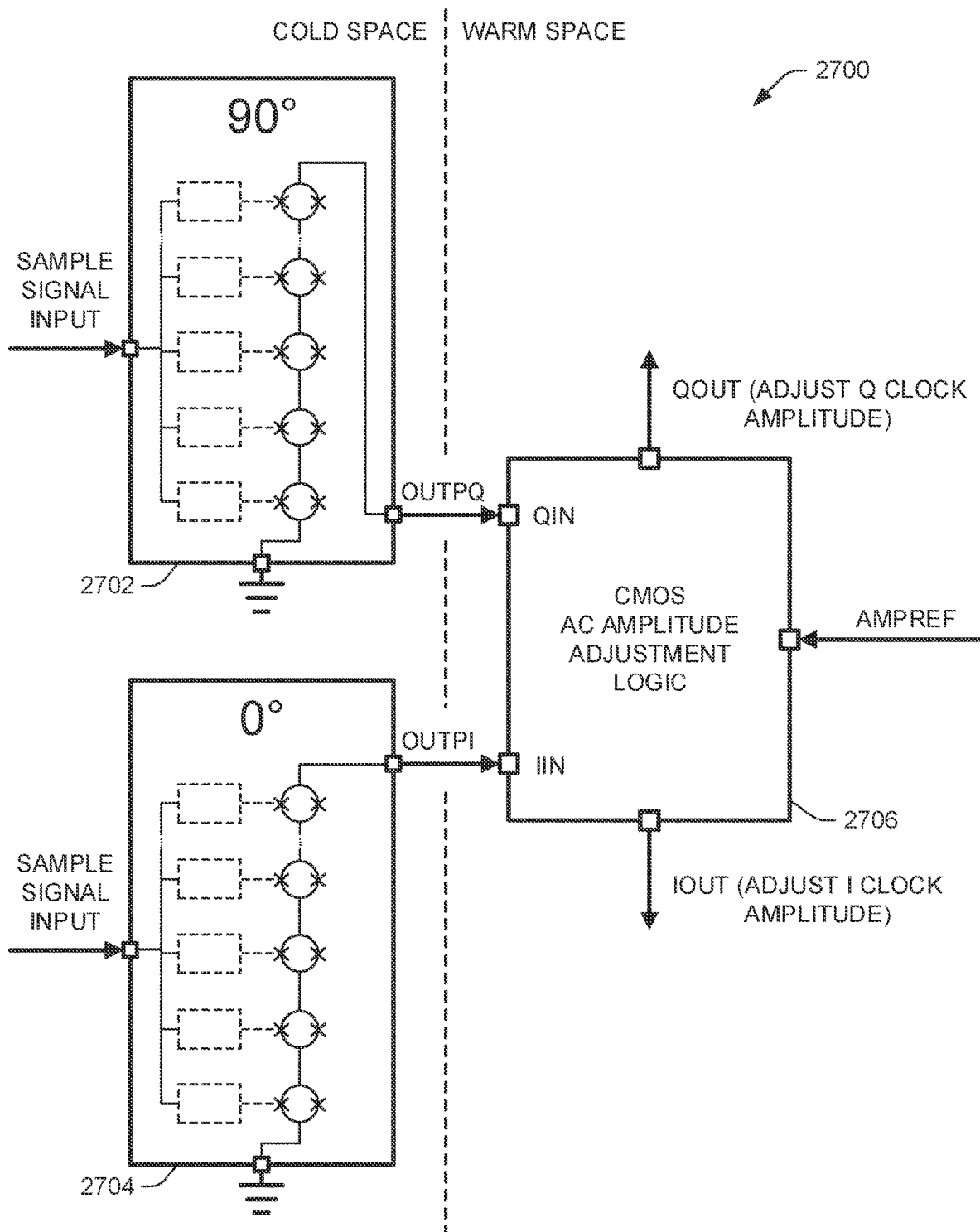
FIGS. 27A and 27B are block diagrams of example feedback system for sensing and tuning I clock and Q clock AC amplitudes (FIG. 27A) and phase error (FIG. 27B).
Figure 27B:
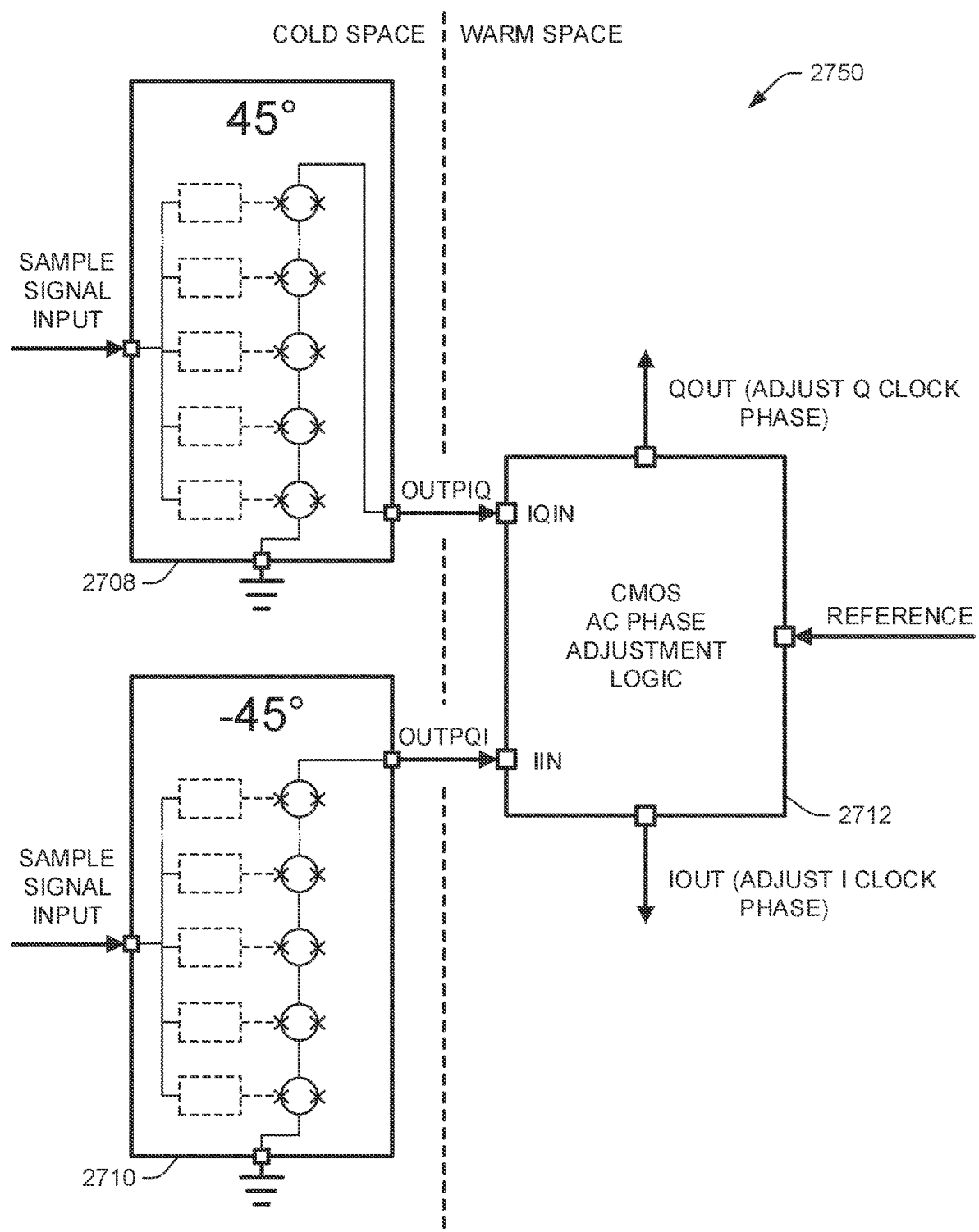

FIGS. 27A and 27B show example feedback systems 2700, 2750 that can be used for sensing and tuning I clock and Q clock AC amplitudes (FIG. 27A) and phase (FIG. 27B). In each of FIGS. 27A and 27B, two RQL bias-level sensors 2702, 2704, 2708, 2710 can be implemented as shown in FIG. 26A or FIG. 26B. The sensors 2702, 2704, 2708, 2710 can be implemented as all or part of the sensors 118 on the RQL IC 106 in the cold space.

In the example illustrated in FIG. 27A, the first sensor 2702 is powered on the 90° clock (the Q clock). The second sensor 2704 is powered on the 0° clock (the I clock). AC bias amplitudes provided to the I and Q clocks can be sensed contemporaneously by the two sensors 2702, 2704. The outputs OUTPQ, OUTPI of the sensors 2702, 2704 have the form of voltage pulse trains of time-varying voltage height. The pulses in the pulse trains can be configured to be produced, for example, at a rate of once every AC clock cycle. The respective output signals OUTPQ, OUTPI provided by the sensors 2702, 2704 are each of a large enough voltage amplitude that they can be analyzed by AC amplitude adjustment logic 2706 that can, for example, be provided as part feedback loop 122 to bias signals generator(s) 110 outside of the cold space. AC amplitude adjustment logic 2706 can, for example, be implemented in conventional semiconductor circuitry (e.g., CMOS circuitry). A third input to AC amplitude adjustment logic 2706, labeled AMPREF, provides an AC or DC signal representative of an ideal nominal level desired to be provided out of the two sensors 2702, 2704. The output QOUT at the top of logic 2706 commands a change in the output of the clock source for Q clock (the 90° clock source), the output IOUT at the bottom of logic 2706 commands a change in the output of the clock source for the I clock (the 0° clock source), and amplitude reference signal AMPREF is descriptive or representative of the level at which the clock sources should be regulated. The reference signal AMPREF could, for example, be representative of the height of the pulses produced by sensors 2702 and 2704.

AC amplitude adjustment logic 2706 can be configured to perform a voltage comparison of the provided bias sensing signals OUTPQ, OUTPI and to generate one or more control signals based on the comparison of the OUTPQ and OUTPI signals. For example, if the AC amplitudes of the 0° I clock and 90° Q clock, as sensed on the RQL IC 106 by sensors 2704, 2702, are near or consistent with the optimal AC bias point 306, then the outputs OUTPQ, OUTPI of sensors 2702, 2704 are equal, and the outputs QOUT, IOUT of the logic 2706 does not command a change in AC amplitudes of either clock 112, 114. If, however, the AC amplitudes of the 0° I clock and the 90° Q clock, as sensed on the RQL IC 106 by sensors 2704, 2702, differ, or if either of them is inconsistent with an optimal AC bias setting for its respective clock, then the outputs OUTPQ, OUTPI of sensors 2702, 2704 are not equal, and one or both of the outputs QOUT, IOUT of the logic 2706 then commands a change in AC amplitudes of either clock 112, 114.

Following the AC amplitude calibration of the I and Q clocks performed by the arrangement of FIG. 27A, the arrangement of FIG. 27B can be used to sense and calibrate relative phase of the I and Q clocks to ensure that the phase difference between the I and Q clocks, as provided to the operational RQL circuitry 102 on the RQL IC 106 in the cold space, is 90°. The bias-level sensor arrangement of FIG. 27B is structurally identical to the arrangement of FIG. 27A, except that first sensor 2708 in FIG. 27B is provided a 45° clock formed by tapping both the I and Q resonators, rather than a 90° formed by tapping the Q resonator only, as in sensor 2702 of FIG. 27A, and second sensor 2710 in FIG. 27B is provided a)−45° (315°) clock formed by tapping both the Q and I resonators, rather than a 0° clock formed by tapping the I resonator only. Clock signals produced by a 45° transformer or a 135° transformer on the RQL IC 106 are dependent on both the phase difference and the amplitudes of the I clock and Q clock. A phase mismatch between the I clock and the Q clock at the level of the RQL IC 106 in the cold space can cause the 45° and 135° signals to have AC amplitude variation. By powering the samplers in sensor 2708 with a 45° clock as in FIG. 27B, a mismatch in output voltage between 45° sensor 2708 output OUTPIQ and −45° sensor 2710 output OUTPQI is indicative of a phase difference that differs from 90° between the I clock and the Q clock, because the only thing that can cause such a sensor output voltage difference is inter-clock phase error, once the AC amplitudes of the I clock and Q clock have been equalized.

AC phase adjustment logic 2712 can therefore be configured to perform a voltage comparison of the provided bias sensing signals OUTPIQ, OUTPQI and to generate one or more control signals based on the comparison of the OUTPIQ and OUTPQI signals. For example, if the phase error between the 0° I clock and 90° Q clock, as sensed on the RQL IC 106 by sensors 2708, 2704, shows true quadrature (exactly 90° phase difference), then the outputs OUTPIQ, OUTPQI of sensors 2708, 2710 are equal, and the outputs QOUT, IOUT of the logic 2712 does not command a change in AC phase of either clock 112, 114. If, however, the phase error between the 0° I clock and 90° Q clock, as sensed on the RQL IC 106 by sensors 2708, 2702, differ, then the outputs OUTPIQ, OUTPQI of sensors 2708, 2710 are not equal, and one or both of the outputs QOUT, IOUT of the AC phase adjustment logic 2712 then commands a change in phase of either clock 112, 114.

The output-amplifier-based structures of FIGS. 26A and 26B have advantages of being able to generate a relatively large output voltages with relatively high throughput. They can be used, as shown in FIGS. 27A and 27B, to adjust AC amplitude and phase to tune a resonator clock.

Figure 28:
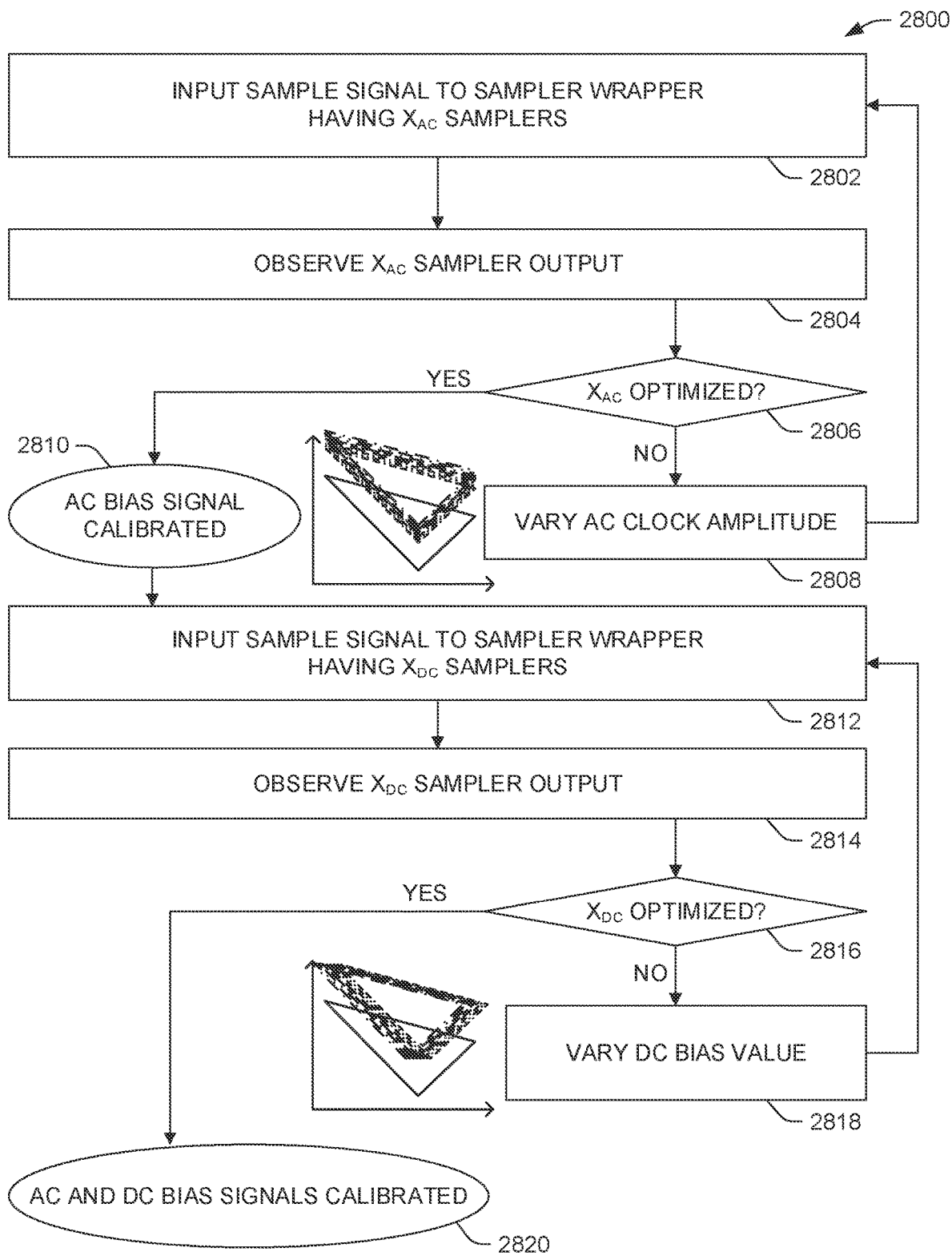
FIG. 28 is a flow chart showing an example method of AC and DC bias point adjustment or optimization using bias-level sensors integrated on an RQL IC.

FIG. 28 shows an example optimization method 2800 that can be used to calibrate a bias signal, e.g., to an ideal calibration or close to an ideal calibration, using one or more arrangements of bias-level sensors. A sample signal, e.g., an SFQ pulse or reciprocal pulse pair, is input 2802 to a sampler wrapper having $X_{AC}$ samplers. As examples, the wrapper can be a serial-output RQL scan register like that shown in FIGS. 2A or 25, a parallel-output arrangement like that shown in FIG. 2B, a ring oscillator like that shown in FIG. 2C, an DC SQUID-based arrangement like that shown in FIGS. 26A or 26B, or a PML shift register arrangement like that shown in FIG. 24. The $X_{AC}$ samplers can be, as examples, a JTL-based or RQL-gate-based sampler like that shown in FIG. 6, a shift-register-based sampler as shown in any of FIG. 8, 9, 10, 11, 12, 13, 16, or 18, a PML-flip-flop-based sampler as shown in FIG. 24, or a pulse-generator-based sampler as shown in FIG. 25. The $X_{AC}$ sampler output can be observed 2804, e.g., by circuitry that counts pulses in an output pulse train produced by a sampler wrapper like the pulses shown in FIGS. 4A-4D, in the case of a serial pulse output by a wrapper like that shown in FIG. 2A, by circuitry that compares an input pulse stream to an output pulse stream, in the case of a PML shift register arrangement like that shown in FIG. 24, or by voltage comparison circuitry, in the case of a DC SQUID-based arrangement like that shown in FIGS. 26A or 26B that outputs a voltage pulse having a value on the order of millivolts. The circuitry that observes the bias-level sensor output can be conventional semiconductor circuitry (e.g., CMOS circuitry) that operates in the warm space of the system 100 and need not be implemented on the RQL IC 106 or otherwise in the cold space. Observation 2804 can, in some examples, be performed by a human user, using a human-in-the-loop feedback methodology, wherein the human user observes 2804 the $X_{AC}$ sampler output, makes the determination 2806 of optimization, and manually varies 2808 the AC clock amplitude.

As one example, more than one of the $X_{AC}$ samplers (AC bias samplers) includes at least one JTL or pulse generator having a weakened AC clock resonator bias tap to an AC clock resonator of the RQL IC, as compared to an AC clock resonator bias tap of a JTL in the operational RQL circuitry 102. A weakened AC clock resonator bias tap means that a larger amplitude AC bias signal is required to drive the JTL or pulse generator within its respective AC operating margins, and thus that the $X_{DC}$-$X_{AC}$ margin shmoo plot of the AC bias sampler is shifted up with respect to the margin shmoo plot of the operational RQL circuitry 102, as shown, for example, in FIG. 3. As another example, more than one of the $X_{AC}$ samplers includes a pulse generator having a Josephson junction with a larger critical current than a Josephson junction in the operational RQL circuitry.

Based on the observation 2804 of the $X_{AC}$ sampler output, it can be assessed 2806 whether the AC bias amplitude parameter has been optimized. For example, if a number of different AC bias amplitudes have been provided to the sampler wrapper, data can be compiled showing which AC bias amplitudes produce optimal or near-optimal output results. In the case of the serial-output wrapper of FIG. 2A having $X_{AC}$ bias-level sensors having linearly staged AC operating margin offsets, for example, optimal results are produced when a medium number of $X_{AC}$ samplers are operational, as shown in FIG. 4C. If insufficient data has been collected to draw such a conclusion, the AC clock amplitude of the AC clock resonator under test can be varied 2808 to a different value and a new sample signal can be input 2802. This process portion 2802-2808 can be iteratively repeated as many times as is necessary to provide confidence that the AC bias amplitude has been optimized 2810 for the AC clock resonator under test (e.g., an I resonator or a Q resonator). In some example methods similar to those of method 2800, the AC bias amplitude is not optimized 2810, but is improved. Improvement of the AC bias amplitude can be determined by observation 2804 of the $X_{AC}$ sampler output showing results that are consistent with the provided 2808 AC clock amplitude moving nearer to the optimal bias point 306 of the operational RQL circuitry 102.

The AC bias signal having been calibrated 2098, the process 2800 can continue to calibrate the DC bias. A sample signal is input 2812 to a sampler wrapper having $X_{DC}$ samplers. The wrapper can be the same wrapper or a different wrapper from that used to calibrate the AC bias amplitude in the AC bias calibration portion of method 2800. The $X_{DC}$ samplers can similarly be of the forms listed and described above. The $X_{DC}$ sampler output can be observed 2814, e.g., by circuitry that counts pulses in an output pulse train produced by a sampler wrapper like the pulses shown in FIGS. 4A-4D, in the case of a serial pulse output by a wrapper like that shown in FIG. 2A, or by circuitry that compares an input pulse stream to an output pulse stream, in the case of a PML shift register arrangement like that shown in FIG. 24, or by voltage comparison circuitry, in the case of a DC SQUID-based arrangement like that shown in FIGS. 26A or 26B that outputs a voltage pulse having a value on the order of millivolts. The circuitry that observes the bias-level sensor output can be conventional semiconductor circuitry (e.g., CMOS circuitry) that operates in the warm space of the system 100 and need not be implemented on the RQL IC 106 or otherwise in the cold space. Observation 2814 can also be performed by a human user, using a human-in-the-loop feedback methodology, wherein the human user observes 2814 the $X_{DC}$ sampler output, makes the determination 2816 of optimization, and manually varies 2818 the DC bias value.

Based on the observation 2814 of the $X_{DC}$ sampler output, it can be assessed 2816 whether the DC bias value parameter has been optimized. For example, if a number of different DC bias values have been provided to the sampler wrapper, data can be compiled showing which DC bias values produce optimal or near-optimal output results. In the case of the serial-output wrapper of FIG. 2A having $X_{DC}$ bias-level sensors having linearly staged DC operating margin offsets, for example, optimal results are produced when only mid-offset-range $X_{DC}$ samplers are operational, as shown in FIG. 5C. If insufficient data has been collected to draw such a conclusion, the DC bias value provided to the DC bias line under test can be varied 2818 to a different value and a new sample signal can be input 2812. This process portion 2812-2818 can be iteratively repeated as many times as is necessary to provide confidence that the DC bias value has been optimized 2820 for the DC bias line under test. Thus, both AC and DC bias signals are calibrated 2820. Calibration method 2800, or any portion thereof, can in some examples be performed while the operational RQL circuitry 102 remains continuously in operation even while its bias parameters are being adjusted, improved, or optimized. In some example methods similar to those of method 2800, the DC bias value is not optimized 2820, but is improved. Improvement of the DC bias value can be determined by observation 2814 of the $X_{DC}$ sampler output showing results that are consistent with the provided 2818 DC bias value moving nearer to the optimal bias point 306 of the operational RQL circuitry 102.

The PML-based optimization method 2900 of FIG. 29 is described above with relation to the description of the PML shift register structure of which a portion is shown in FIG. 24. Although method 2900 as illustrated and described relates to AC bias amplitude calibration, method 2900 can be modified to provide DC bias value calibration, by using flip-flops in various of the PML shift register elements staged in their respective DC bias operating margin offsets (e.g., by fabricating the flip-flop bias transformers to have different, e.g., graduated, DC bias line coupling transformer lengths), varying the DC bias value rather than the AC amplitude 2908 with the logical clock stopped 2906 and advanced 2910 a single clock cycle (or half-cycle), and checking for $X_{DC}$ optimization rather than for $X_{AC}$ optimization 2918 following restarting 2914 of the logical clock and observation 2916 of the output data bit pattern.

FIG. 30 shows an example optimization method 3000 that can be used to calibrate phase difference between different AC clock bias signals, e.g., between I and Q clocks. In some examples, AC amplitudes of the I and Q clocks are first calibrated independently of each other 3002, 3004, which can be done, for example, using either of methods 2900 or 2900 by using bias-level sensors that are I-clock independent or Q-clock independent, such as those shown in FIG. 12, 13, 16, 18, or 24. In method 3000, a sample signal, e.g., an SFQ pulse or reciprocal pulse pair, is input 3002 to an $X_{phase}$ sampler or to a sampler wrapper having multiple $X_{phase}$ samplers. The wrapper can be a serial-output RQL scan register like that shown in FIGS. 2A or 25, a parallel-output arrangement like that shown in FIG. 2B, a ring oscillator like that shown in FIG. 2C, or an output-amplifier-based arrangement like that shown in FIGS. 26A or 26B (e.g., arranged as shown in FIG. 27B). The $X_{phase}$ sampler(s) can be, for example, a JTL-based sampler like that shown in FIG. 21, having mixed-resonator clock inputs at four different phases each 90° from each other. The most weakly biased JTLs or gates in the $X_{phase}$ sampler(s) define the minimum AC operating point ($X_{ACmin}$) at which the $X_{phase}$ samplers operate. The $X_{phase}$ sampler output can be observed 3004, e.g., by circuitry that counts pulses in an output pulse train produced by the sampler wrapper. Such circuitry can be conventional semiconductor circuitry (e.g., CMOS circuitry) that operates in the warm space of the system 100 and need not be implemented on the RQL IC 106 or otherwise in the cold space.

Based on the observation 3004 of the $X_{phase}$ sampler output, it can be assessed 3006 whether the clock phase difference parameter has been optimized. For example, if a number of clock phase difference values have been provided to the one or more $X_{phase}$ samplers in the sampler wrapper over a number of AC bias amplitudes in a two-dimensional search, data can be compiled showing which clock phase difference values produce optimal or near-optimal output results. Where $X_{phase}$ sampler 2000 is used, for example, optimal results are produced when the phase error is such that $X_{ACmin}$, the lower limit of the operating margin of the $X_{phase}$ sampler 2000 (the lowest AC bias amplitude at which the $X_{phase}$ sampler 2000 remains operational) is at its lowest over a phase-error-dependent range of such $X_{ACmin}$ points, as shown at point 2402 in FIG. 24. As another example, where I-specific or Q-specific $X_{AC}$ samplers are used, such as those shown in FIG. 12, 13, 16, or 18, optimal results are produced when the phase error is such that the phase-error-dependent plot of the $X_{ACmin}$ of an I-specific sampler crosses the phase-error-dependent plot of the $X_{ACmin}$ of a Q-specific sampler, as shown at point 1902 in FIG. 19. As another example, where $X_{AC}$ samplers having mixed-resonator clocks that are 90° apart are used, such as a 45° clock sampler and a 135° sampler, are used, optimal results are produced when the phase error is such that the phase-error-dependent plot of the $X_{ACmin}$ of a first mixed-resonator sampler crosses the phase-error-dependent plot of the $X_{ACmin}$ of a second mixed-resonator sampler that is provided an AC bias signal that is 90° apart from the phase of the AC bias signal provided to the first mixed-resonator sampler, as shown at point 2302 in FIG. 23.

If insufficient data has been collected to draw a conclusion that the $X_{phase}$ value has been optimized, more data can be collected by performing a two-dimensional search of the values of $X_{AC}$ and $X_{phase}$. For each $X_{phase}$ value, $X_{AC}$ can be varied to find $X_{ACmin}$ of the phase sampler(s). If the $X_{AC}$ sweep has not been completed for the current $X_{phase}$ value 3008, the AC amplitude of the provided bias (whether on an I clock resonator, a Q clock resonator, or both) can be varied 3010 to provide a different $X_{AC}$ input value to the phase sampler(s), and a new input sample signal can be provided 3002 to the sampler wrapper. The AC sweep portion 3002-3010 of the process can be repeated until $X_{ACmin}$ has been identified for the phase sampler(s) for a given $X_{phase}$ value. Once $X_{ACmin}$ has been found for the phase sampler for the current phase difference between the I and Q clocks, the phase difference between the I clock and the Q clock can be varied 3012 to a different value and a new sample signal can be input 3002. This $X_{phase}$ sweep process portion 3002-3012 can be iteratively repeated as many times as is necessary to find the $X_{ACmin}$ of the phase sampler(s) for as many values of $X_{phase}$ as is necessary provide confidence that the clock phase difference has been optimized 3014 for the AC clock resonators under test. The $X_{AC}$ sweep and the $X_{phase}$ sweep need not be linear sweeps; a binary search process can be used, for example, to more rapidly home in on both the $X_{ACmin}$ at each $X_{phase}$ value, and on the $X_{phase}$ value at which the $X_{ACmin}$ is minimum as a function of $X_{phase}$. The phase offset at which $X_{ACmin}$ is minimum (e.g., using the phase sampler 2000 of FIG. 20, as at point 2302 in FIG. 23) or at which $X_{AC}$ plots of 90°-separated samplers cross (e.g., at points 1902 or 2202 in FIGS. 19 and 22, respectively) indicates the optimum phase offset between I and Q clocks in the warm space at which the clocks should be driven so as to obtain true quadrature (90° separation) at the operational RQL circuitry 102 on the RQL IC 106 in the cold space. The optimal $X_{DC}$ level is at the $X_{ACmin}$. Thus, once the minimum value of $X_{AC}$ has been found by any method that searches values of $X_{DC}$ as well as $X_{AC}$, the optimal value of $X_{DC}$ will also be known.

Figure 31:
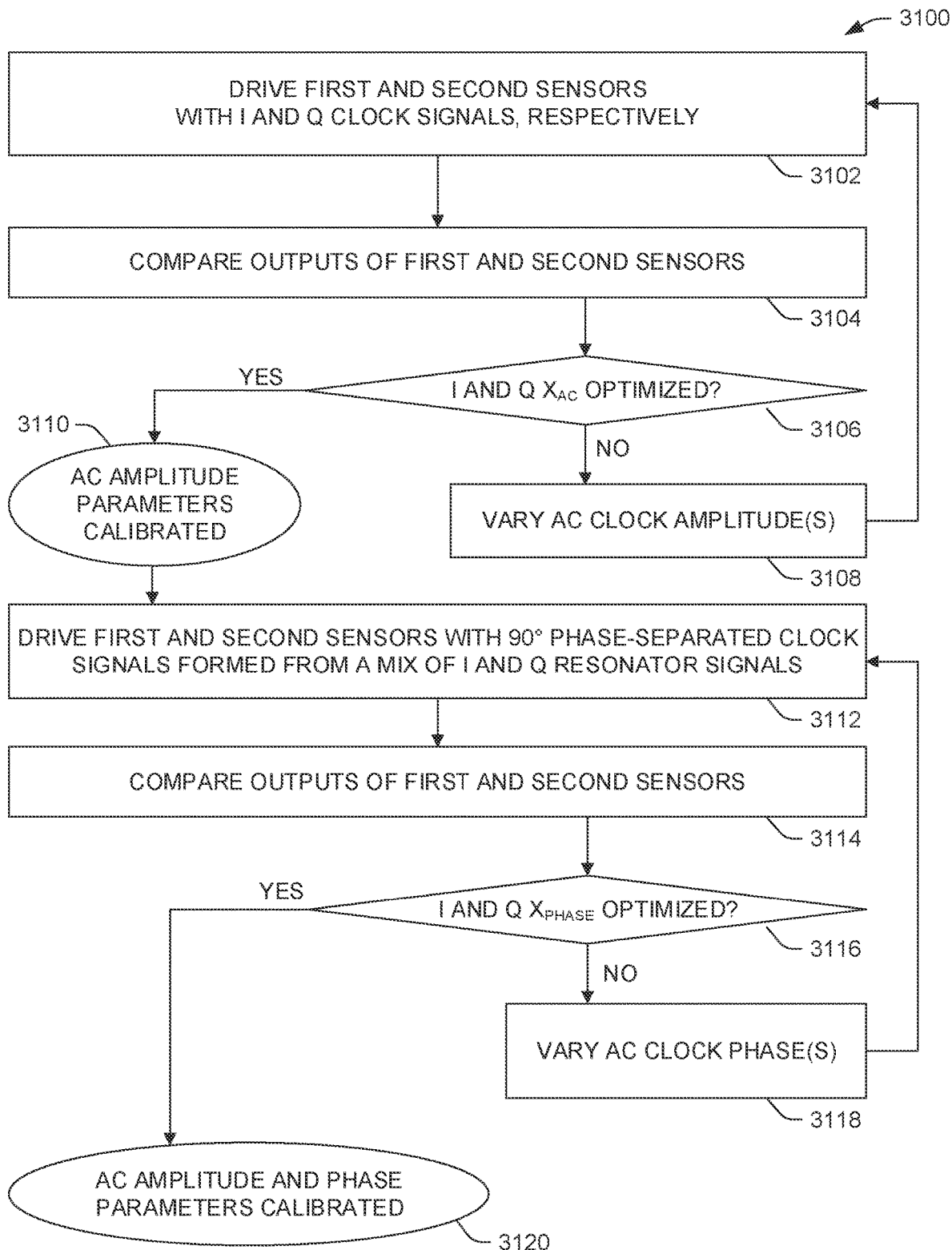
FIG. 31 is a flow chart showing an example method of adjustment or optimization of AC bias amplitude of I and Q clocks and phase difference between I and Q clocks on an RQL IC.

FIG. 31 shows an example optimization method 3100 that can be used to calibrate I and Q clock AC amplitude parameters and I and Q clock phase parameters to optimize clock bias signals delivered to an RQL IC 106, using, for example, the output-amplifier-based sensors 2600 or 2650 shown in FIGS. 26A and 26B and the two-sensor feedback systems shown in FIGS. 27A and 27B. First and second sensors are driven 3102 with I and Q clock signals, respectively. The sensors can each be provided a sample signal, e.g., an SFQ pulse, at their respective inputs and can each provide an output voltage signal at their respective outputs. The outputs of the first and second sensors can be compared 3104. The comparison 3104 can be done, for example, outside the cold space in which the RQL IC 106 resides, and can be done, for example, by conventional semiconductor circuitry (e.g., CMOS circuitry) configured to receive the output voltage signals of the first and second sensors and to perform the comparison 3104. Based on the comparison 3104 of the outputs of the first and second sensors, and in some examples, further based on a reference signal, it can be assessed 3106 whether the AC clock amplitude parameters of the I and Q clocks have been optimized. For example, if the comparison 3104 shows no difference between the sensor outputs of the first and second sensors (e.g., OUTPQ and OUTPI in FIG. 27A), and both outputs are within a tolerance range of a value indicated by the reference signal, then it can be determined that the AC amplitude parameters have been calibrated 3110, and method 3100 can proceed to calibrate phase error between the I and Q clocks. If, however, the comparison 3104 shows a difference between the sensor outputs, then one or both of the AC clock amplitudes for the I and Q clocks can be varied 3108, e.g., based on outputs of the comparison circuitry in the warm space, and the outputs of the first and second sensors can be re-compared 3104. This process portion 3102-3108 can be iteratively repeated as many times as is necessary to provide confidence that the AC clock amplitudes of the I and Q clock signals have been optimized 3110.

The AC clock amplitudes of the I and Q clock signals having been optimized 3110, first and second sensors can be biased with 90° phase-separated clock signals formed from a mix of I and Q resonator signals. For example, the first sensor can be driven with a 45° AC clock signal and the second sensor can be driven with a)–45° (315° AC clock signal. The mixed-resonator AC clock signals can be formed in accordance with Table 1, above. The first and second sensors driven 3112 with 90° phase-separated mixed-resonator clock signals can be the same sensors as those driven 3102 with the I and Q clock signals, provided a mechanism for switchable coupling of those sensors to different resonators or combinations of resonators, or one or both of them can be different than the sensors driven 3102 with the I and Q clock signals. As one example, a first sensor (e.g., sensor 2710 in FIG. 27B) can be driven 3112 with a nominally –45° clock signal (e.g., by transformer-coupling the first sensor to both the Q and I clock resonators) and a second sensor (e.g., sensor 2708 in FIG. 27B) can be driven 3112 with a nominally 45° clock signal (e.g., by transformer-coupling the second sensor to both the I and Q clock resonators). In another example, the 90° phase-separated clock signals biasing the first and second sensors can each be pure I clock and Q clock signals (e.g., 0° and 90°, 90° and 180°, or 180° and 270°). Methods for sensing phase that compare outputs of a pair of bias parameter sensors whose clock signals are formed from combinations of I and Q clock signals (e.g., at ±45°, or 45° and 135°, 135° and 225°, etc.) have the advantage of being more sensitive to phase alignment than an arrangement consisting of a pair of bias parameter sensors operating with pure I and Q clock signals, for example, at 0° and 90°, 90° and 180°, or 180° and 270°.

The outputs of the first and second sensors can be compared 3114. The comparison 3114 can be done, for example, outside the cold space in which the RQL IC 106 resides, and can be done, for example, by conventional semiconductor circuitry (e.g., CMOS circuitry) configured to receive the output voltage signals of the first and second sensors and to perform the comparison 3114. The comparison circuitry can be the same or different circuitry from the circuitry used to perform the comparison 3104 of the AC-amplitude-indicative outputs in the first part of method 3100. Based on the comparison 3114 of the outputs of the first and second sensors, and in some examples, further based on a reference signal, it can be assessed 3116 whether the AC clock phase error is optimized to provide true quadrature between the I and Q clock phases, that is, whether there is 90° of separation of the Q clock phase from the I clock phase as observed on the RQL IC 106. For example, if the comparison 3114 shows no difference between the sensor outputs of the first and second sensors (e.g., OUTPIQ and OUTPI in FIG. 27B), then it can be determined that the AC phase error parameter has been calibrated 3120. If, however, the comparison 3114 shows a difference between the sensor outputs of the first and second sensors, then one or both of the AC clock phases for the I and Q clocks can be varied 3118, e.g., based on outputs of the comparison circuitry in the warm space, and the outputs of the first and second sensors can be re-compared 3114. This process portion 3112-3118 can be iteratively repeated as many times as is necessary to provide confidence that the AC clock phase error of the I and Q clock signals has been optimized 3120.

In the above-described example circuit structures and methods, operating regimes for test circuits can be established by electronic tests in which bias levels are varied to determine the test circuits' respective ranges of operation. The ranges of operation for the test circuits can be made different from the ranges of operation of operational RQL circuitry by fabrication differences such as differences in AC clock resonator or DC bias line coupling transformer mutual inductance values, and by the addition of self-inductance between taps and the respective JTLs or gates driven by the taps. In each different example described, the electronic tests involve applying a stimulus in the form of a logic signal and observing the presence or absence of expected logical outputs indicative of operation of the test circuits. The bounds of the operational regime can be determined by ascertaining the applied varied bias levels at which each test circuit operates correctly or fails.

In some examples, the bias-level sensors and associated methods of the present application can advantageously determine how close an operational RQL circuit's operating point is to its optimal operating point while the operational RQL circuit remains operational, i.e., without causing a bias-related failure in the operational RQL circuit. By populating an RQL IC 106 with samplers each of which has an operating range that is constructed to be varied in a systematic way with respect to the operating ranges of the other samplers, it is possible to numerically ascertain a presently applied bias level of the RQL IC 106 as observed on the RQL IC 106. When the samplers are provided in a wrapper having a ladder arrangement as illustrated in FIGS. 2A or 25, the numerical determination of the present bias level can be made, for example, by counting the number of pulses provided at the output of the sampler wrapper each time a sampler pulse is provided to the input of the sampler wrapper. The bias-level sensors and associated methods of the present application can thus assess bias conditions on an RQL IC 106 without interfering with operation of the operational RQL circuitry 102 on the IC 106. The bias-level sensors and associated methods of the present application are especially useful in calibrating the bias operating points of RQL systems having multiple RQL ICs. The bias-level sensors and associated methods of the present application can serve as process control monitors, i.e., on-chip instruments for assessing the performance of circuits as affected by variations in circuit (wafer) processing. The bias-level sensors and associated methods of the present application can be implemented in human-in-the-loop feedback controls or in fully automated feedback controls that can use a combination of RQL circuitry inside the cold space and non-RQL circuitry (e.g., CMOS or other semiconductor circuitry) outside the cold space to continuously or periodically make measurements of, and command adjustments to, bias signal parameters.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A reciprocal quantum logic (RQL) integrated circuit (IC) comprising:
    a phase-mode shift register comprising:
        a first plurality of Josephson transmission lines (JTLs) arranged in series as a data path;
        a second plurality of JTLs arranged in series as a logical clock path trunk; and
        a plurality of phase-mode D flip-flops each having a data input coupled to the data path and configured to receive input from the data path, a data output coupled to the data path and configured to provide output to the data path, and a logical clock input coupled to a respective logical clock path branch that is coupled to the logical clock path trunk,
        wherein the first plurality of JTLs in the data path and the phase-mode D flip-flops are transformer-coupled to one or more AC clock resonators of the RQL IC to receive AC clock bias signals of a first two AC clock phases that are about 180° apart from each other in phase,
        wherein the second plurality of JTLs in the logical clock path trunk are transformer-coupled to one or more AC clock resonators of the RQL IC to receive AC clock bias signals of a second two AC clock phases that are about 180° apart from each other in phase, and
        wherein the first two AC clock phases are different from the second two AC clock phases.

2. The system of claim 1, wherein:
    a first of the first two AC clock phases is about 90° apart in phase from a first of the second two AC clock phases, and
    a second of the first two AC clock phases is about 90° apart in phase from a second of the second two AC clock phases.

3. The system of claim 2, wherein:
    the first of the first two AC clock phases is about 0°,
    the first of the second two AC clock phases is about 90°,
    the second of the first two AC clock phases is about 180°, and
    the second of the second two AC clock phases is about 270°.

4. The system of claim 2, wherein:
    the first of the second two AC clock phases is about 0°,
    the first of the first two AC clock phases is about 90°,
    the second of the second two AC clock phases is about 180°, and
    the second of the first two AC clock phases is about 270°.

5. The system of claim 2, wherein:
    the first of the first two AC clock phases is about 45°,
    the first of the second two AC clock phases is about 135°,
    the second of the first two AC clock phases is about 225°, and
    the second of the second two AC clock phases is about 315°.

6. The system of claim 2, wherein:
    the first of the second two AC clock phases is about 45°,
    the first of the first two AC clock phases is about 135°,
    the second of the second two AC clock phases is about 225°, and
    the second of the first two AC clock phases is about 315°.

7. The system of claim 1, wherein each of the plurality of phase-mode D flip-flops is transformer-coupled to the one or more AC clock resonators at different points along the one or more AC clock resonators.

8. The system of claim 1, wherein each of the plurality of phase-mode D flip-flops is more weakly or more strongly transformer-coupled to an AC or DC bias signal source than is a JTL of operational RQL circuitry on the RQL IC that is not a part of the phase-mode shift register.

9. The system of claim 8, wherein the respective transformer couplings of each of the plurality of phase-mode D flip-flops are staged such that the strength of the respective transformer couplings of each phase-mode D flip-flop vary with respect to each other.

10. The system of claim 8, wherein the lower limit of the AC operating range of at least one of the plurality of phase-mode D flip-flops is at about a centroid of an operating range of the operational RQL circuitry.

11. The system of claim 1, wherein each of the second plurality of JTLs in the logical clock path trunk is more weakly biased by an AC bias signal source than is a JTL of operational RQL circuitry on the RQL IC that is not a part of the phase-mode shift register.

12. The system of claim 11, wherein the lower limit of the AC operating range of each of the second plurality of JTLs in the logical clock path trunk is at about a centroid of an operating range of the operational RQL circuitry.

13. A method comprising:
    setting to a nominal value at least one bias signal parameter of a bias signal provided to a reciprocal quantum logic (RQL) integrated circuit (IC),
    starting a logical clock signal provided to a logical clock path of a phase-mode RQL shift register to shift in an input data bit pattern on a data path of the phase-mode RQL shift register;
    stopping the logical clock;
    varying a value of the at least one bias signal parameter as provided to the data path of the phase-mode RQL shift register;
    inputting one assertion SFQ pulse pair, or a single SFQ pulse, into the logical clock path;
    restoring the value of the at least one bias signal parameter to the nominal value;
    restarting the logical clock signal provided to the logical clock path of the phase-mode RQL shift register to shift out an output data bit pattern on the data path of the phase-mode RQL shift register;
    observing the output data bit pattern of the phase-mode RQL shift register; and
    determining, based on the observing the output data bit pattern, that the varying the value of the at least one bias signal parameter has moved the value of the at least one bias signal parameter closer to an optimal value of the at least one bias signal parameter.

14. The method of claim 13, wherein the at least one bias signal parameter includes an AC amplitude of an AC bias signal provided to the data path of the phase-mode RQL shift register.

15. The method of claim 13, wherein the at least one bias signal parameter includes a DC bias value of a DC bias signal provided to the data path of the phase-mode RQL shift register.

16. The method of claim 13, wherein the at least one bias signal parameter includes a phase difference between I and Q clock signals provided to the RQL IC.

17. The method of claim 13, wherein:
the observing the output data bit pattern includes locating in the output data bit pattern one or more differences between the output data bit pattern and the input data bit pattern; and
the determining is based on ascertaining which element of the phase-mode RQL shift register was biased outside of its operating region, or which elements of the phase-mode RQL shift register were biased outside of their respective operating regions, during the inputting one assertion SFQ pulse pair, or a single SFQ pulse, into the logical clock path when the value of the at least one bias signal parameter was varied.

18. Reciprocal quantum logic (RQL) superconducting bias-level sensing circuitry for sensing bias levels provided to operational RQL circuitry of an RQL integrated circuit (IC), the bias-level sensing circuitry comprising a phase mode logic (PML) shift register comprising a plurality of PML shift register elements coupled together in series with each other, each PML shift register element comprising:
a PML D flip-flop having a data input, a data output, and a logical clock input, the data input configured to be coupled to either a data output of a previous element in the PML shift register or to an input data bitstream source;
a data output path portion having an input coupled to the data output of the PML D flip-flop and an output configured to be coupled to either a data input of a next element in the PML shift register or to circuitry configured to receive an output data bitstream from the PML shift register, the data output path portion comprising first, second, and third Josephson transmission line (JTL) based buffers coupled in series with each other between the input and the output of the data output path portion;
a logical clock path trunk portion having an input configured to be coupled to either a logical clock path output of the next element in the PML shift register or to a logical clock source and an output configured to be coupled to either a logical clock path input of the previous element in the PML shift register and/or to a logical clock path branch of the PML shift register element, the logical clock path trunk portion comprising fourth, fifth, sixth, seventh, and eighth JTL-based buffers coupled in series with each other between the input and the output of the logical clock path trunk portion; and
the logical clock path branch, having an input coupled to the output of the logical clock path trunk portion of the PML shift register element and having an output coupled to the logical clock input of the PML D flip-flop, the logical clock path branch comprising ninth and tenth JTL-based buffers coupled in series with each other between the input and the output of the logical clock path branch.

19. The bias-level sensing circuitry of claim 18, wherein:
the D flip-flop and the first and tenth JTL-based buffers are driven by an AC bias signal having a first phase value,
the fifth and sixth JTL-based buffers are driven by a second AC bias signal having a second phase value that is about 90° greater than the first phase value,
the second and third JTL-based buffers are driven by a third AC bias signal having a third phase value that is about 90° greater than the second phase value, and
the fourth, seventh, eighth, and ninth JTL-based buffers are driven by a fourth AC bias signal having a fourth phase value that is about 90° greater than the third phase value.

20. The bias-level sensing circuitry of claim 19, wherein the second, fifth, and seventh JTL-based buffers each includes at least one additional Josephson junction at its respective input as compared to the first, third, fourth, sixth, eighth, ninth, and tenth JTL-based buffers.

* * * * *